United States Patent
Yoshida

(10) Patent No.: US 11,970,784 B2
(45) Date of Patent: Apr. 30, 2024

(54) NITRIDE SEMICONDUCTOR SUBSTRATE, METHOD FOR MANUFACTURING NITRIDE SEMICONDUCTOR SUBSTRATE, AND LAMINATED STRUCTURE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 397 days.

(21) Appl. No.: 17/272,201

(22) PCT Filed: Aug. 22, 2019

(86) PCT No.: PCT/JP2019/032852
§ 371 (c)(1),
(2) Date: May 25, 2021

(87) PCT Pub. No.: WO2020/045235
PCT Pub. Date: Mar. 5, 2020

(65) Prior Publication Data
US 2021/0317597 A1  Oct. 14, 2021

(30) Foreign Application Priority Data
Aug. 29, 2018 (JP) .................. 2018-159989

(51) Int. Cl.
*C30B 25/04* (2006.01)
*C30B 25/18* (2006.01)
*C30B 29/38* (2006.01)

(52) U.S. Cl.
CPC .............. *C30B 29/38* (2013.01); *C30B 25/04* (2013.01); *C30B 25/18* (2013.01)

(58) Field of Classification Search
CPC ......... C30B 29/38; C30B 24/04; C30B 25/18; C30B 25/04; H01L 21/02381;
(Continued)

(56) References Cited

U.S. PATENT DOCUMENTS 6,468,347 B1 * 10/2002 Motoki ................. C30B 29/406
117/106
8,110,484 B1 * 2/2012 Sato .................... H01L 21/0254
438/479

(Continued)

FOREIGN PATENT DOCUMENTS

JP  2001-102307 A  4/2001
JP  2005-072310 A  3/2005

(Continued)

OTHER PUBLICATIONS

International Searching Authority, "International Search Report," issued in connection with International Patent Application No. PCT/JP2019/032852, dated Oct. 8, 2019.

(Continued)

*Primary Examiner* — Humera N. Sheikh
*Assistant Examiner* — Kevin C T Li
(74) *Attorney, Agent, or Firm* — Foley & Lardner LLP

(57) ABSTRACT

There is provided a nitride semiconductor substrate having a diameter of 2 inches or more and having a main surface whose closest low index crystal plane is a (0001) plane, wherein X-ray locking curve measurement for (0002) plane diffraction, which is performed to the main surface by irradiating with (Cu) $K\alpha1$ X-rays through a two-crystal monochromator of Ge (220) plane and a slit, reveals that full width at half maximum FWHMb is 32 arcsec or less, and FWHMa−FWHMb obtained by subtracting FWHMb from FWHMa is 30% or less of FWHMa, wherein FWHMa is full width at half maximum of the (0002) plane diffraction when (Continued)

a slit width in ω direction is 1 mm, and FWHMb is full width at half maximum of the (0002) plane diffraction when a slit width in ω direction is 0.1 mm.

22 Claims, 24 Drawing Sheets

(58) Field of Classification Search
CPC ......... H01L 21/02395; H01L 21/02389; H01L 21/0243; H01L 21/02433; H01L 21/02502; H01L 21/0254; H01L 21/02458; H01L 21/02513; H01L 21/02576; H01L 21/0262; H01L 21/02658; C03B 29/406; C03B 23/02
See application file for complete search history.

(56) References Cited

U.S. PATENT DOCUMENTS

| | | | |
|---|---|---|---|
| 8,162,468 B2 * | 4/2012 | Kulpa | B41J 11/00214 347/17 |
| 2003/0080345 A1 | 5/2003 | Motoki et al. | |
| 2003/0180580 A1 * | 9/2003 | Wada | H01L 21/02639 257/E21.127 |
| 2006/0226414 A1 | 10/2006 | Oshima | |
| 2009/0221131 A1 | 9/2009 | Kubota et al. | |
| 2012/0001223 A1 * | 1/2012 | Inoue | H01L 33/14 257/E33.025 |
| 2012/0012984 A1 | 1/2012 | Shimodaira et al. | |
| 2012/0074403 A1 | 3/2012 | Fujiwara et al. | |
| 2013/0072005 A1 | 3/2013 | Fujikura | |
| 2015/0279675 A1 * | 10/2015 | Hanser | H01L 21/0254 438/478 |

FOREIGN PATENT DOCUMENTS

| | | |
|---|---|---|
| JP | 2006-290676 A | 10/2006 |
| JP | 2009-231816 A | 10/2009 |
| JP | 2012-066983 A | 4/2012 |
| JP | 2013-060349 A | 4/2013 |
| JP | 2013-107819 A | 6/2013 |
| JP | 2013-214686 A | 10/2013 |
| JP | 2018-027893 A | 2/2018 |
| WO | WO-2010/092736 A1 | 8/2010 |
| WO | WO-2015/037232 A1 | 3/2015 |

OTHER PUBLICATIONS

International Searching Authority, "Written Opinion," issued in connection with International Patent Application No. PCT/JP2019/032852, dated Oct. 8, 2019.

International Preliminary Report on Patentability issued in connection with International Patent Application No. PCT/JP2019/032852, dated Mar. 2, 2021.

* cited by examiner

S100 Base substrate preparation step
S190 Initial step
S220 Inclined interface expansion step
S240 Inclined interface maintenance step
S320 c-plane expansion step
S340 Main growth step
S400 Slicing step
S500 Polishing step <Sample 1>

A = Second c-plane growth region
B = Inclined interface growth region
C = First c-plane growth region
D = Base substrate
E = Second layer
F = First layer <Sample 2>

A = Second c-plane growth region
B = Inclined interface growth region
C = First c-plane growth region
D = Base substrate
E = Second layer
F = First layer a cross section a cross section Sample 1
(0,10)

Sample 1
(0,15)

Sample 1
(0,-20)

Sample 1
(5,0)

Sample 1
(-20,0)

Sample 4

NITRIDE SEMICONDUCTOR SUBSTRATE, METHOD FOR MANUFACTURING NITRIDE SEMICONDUCTOR SUBSTRATE, AND LAMINATED STRUCTURE

CROSS-REFERENCE TO RELATED APPLICATIONS

The present application claims priority under 37 U.S.C. § 371 to International Patent Application No. PCT/JP2019/032852, filed Aug. 22, 2019, which claims priority to and the benefit of Japanese Patent Application No. 2018-159989, filed on Aug. 29, 2018. The contents of these applications are hereby incorporated by reference in their entireties.

The present disclosure relates to a nitride semiconductor substrate, a method for manufacturing a nitride semiconductor substrate, and a laminated structure.

DESCRIPTION OF RELATED ART

A conventionally known technique is as follows: a crystal layer comprising a single crystal of a group III nitride semiconductor is further grown on a main surface whose low index crystal plane is a (0001) plane, using a substrate comprising a single crystal of a group III nitride semiconductor as a base substrate (seed substrate). According to this technique, at least one nitride semiconductor substrate can be obtained by slicing a crystal layer grown to a predetermined thickness (for example, Patent Document 1).

PRIOR ART DOCUMENT

Patent Document

Patent Document 1: Japanese Patent Application Laid-Open Publication No. 2013-60349

SUMMARY OF THE INVENTION

Problem to be Solved by the Invention

An object of the present disclosure is to improve a crystal quality of a nitride semiconductor substrate.

According to an aspect of the present disclosure, there is provided a nitride semiconductor substrate having a diameter of 2 inches or more and having a main surface whose closest low index crystal plane is a (0001) plane,
wherein X-ray locking curve measurement for (0002) plane diffraction, which is performed to the main surface by irradiating with (Cu) K$\alpha$1 X-rays through a two-crystal monochromator of Ge (220) plane and a slit, reveals that:
FWHMb is 32 arcsec or less, and
difference FWHMa-FWHMb obtained by subtracting FWHMb from FWHMa is 30% or less of FWHMa,
wherein FWHMa is full width at half maximum of the (0002) plane diffraction when a slit width in $\omega$ direction is 1 mm, and
FWHMb is full width at half maximum of the (0002) plane diffraction when a slit width in $\omega$ direction is 0.1 mm.

According to another aspect of the present disclosure, there is provided a nitride semiconductor substrate having a diameter of 2 inches or more and having a main surface whose closest low index crystal plane is a (0001) plane, wherein observation of the main surface of the nitride semiconductor substrate in a field of view of 250 $\mu$m square using a multiphoton excitation microscope to obtain a dislocation density from a dark spot density, reveals that:
the dislocation density is less than $1 \times 10^6$ cm$^{-2}$ over 95% or more of the main surface, and
the main surface includes non-overlapping 50 $\mu$m square dislocation-free regions at a density of 100/cm$^2$ or more.

According to further another aspect of the present disclosure, there is provided a method for manufacturing a nitride semiconductor substrate, which is a method for manufacturing a nitride semiconductor substrate with a vapor deposition method, including:
a step of preparing a base substrate comprising a single crystal of a group III nitride semiconductor, and having a mirror main surface whose closest low index plane is a (0001) plane;
an initial step of epitaxially growing a single crystal of a group III nitride semiconductor with the (0001) plane as a growth surface directly on the main surface of the base substrate to grow an initial layer;
a first step of epitaxially growing a single crystal of a group III nitride semiconductor having a top surface with the (0001) plane exposed on the initial layer, forming a plurality of concaves composed of inclined interfaces other than the (0001) plane on the top surface, gradually expanding the inclined interfaces toward an upper side of the initial layer, making the (0001) plane disappear from the top surface, and growing a first layer whose surface is composed only of the inclined interfaces; and
a second step of epitaxially growing a single crystal of a group III nitride semiconductor on the first layer, making the inclined interfaces disappear, and growing a second layer having a mirror surface,
wherein a growth rate of the initial layer in the initial step is lower than a growth rate of the first layer in the first step, and
in the first step, a plurality of valleys and a plurality of tops are formed on the surface of the first layer by forming the plurality of concaves on the top surface of the single crystal and making the (0001) plane disappear, and
when observing an arbitrary cross section perpendicular to the main surface,
an average distance between a pair of tops separated in a direction along the main surface is more than 100 $\mu$m, the pair of tops being closest to each other among the plurality of tops, with one of the plurality of valleys sandwiched between them.

According to another aspect of the present disclosure, there is provided a laminated structure, including:
a base substrate comprising a single crystal of a group III nitride semiconductor and having a mirror main surface whose closest low index crystal plane is a (0001) plane;
an initial layer provided directly on the main surface of the base substrate and comprising a single crystal of a group III nitride semiconductor;
a first low oxygen concentration region provided on the initial layer and comprising a single crystal of a group III nitride semiconductor;
a high oxygen concentration region provided on the first low oxygen concentration region and comprising a single crystal of a group III nitride semiconductor; and
a second low oxygen concentration region provided on the high oxygen concentration region and comprising a single crystal of a group III nitride semiconductor, wherein an oxygen concentration in the high oxygen concentration region is higher than an oxygen concentration in each of the initial layer, the first low oxygen concentration region, and the second low oxygen concentration region, and when observing an arbitrary cross section perpendicular to the main surface, a top surface of the first low oxygen concentration region has a plurality of valleys and a plurality of mountains, and an average distance between a pair of mountains separated in a direction along the main surface is more than 100 μm, the pair of mountains being closest to each other among the plurality of mountains, with one of the plurality of valleys sandwiched between them.

According to the present disclosure, a crystal quality of a nitride semiconductor substrate can be improved.

DETAILED DESCRIPTION OF THE DISCLOSURE

<Finding Obtained by Inventors>

Figure 1:
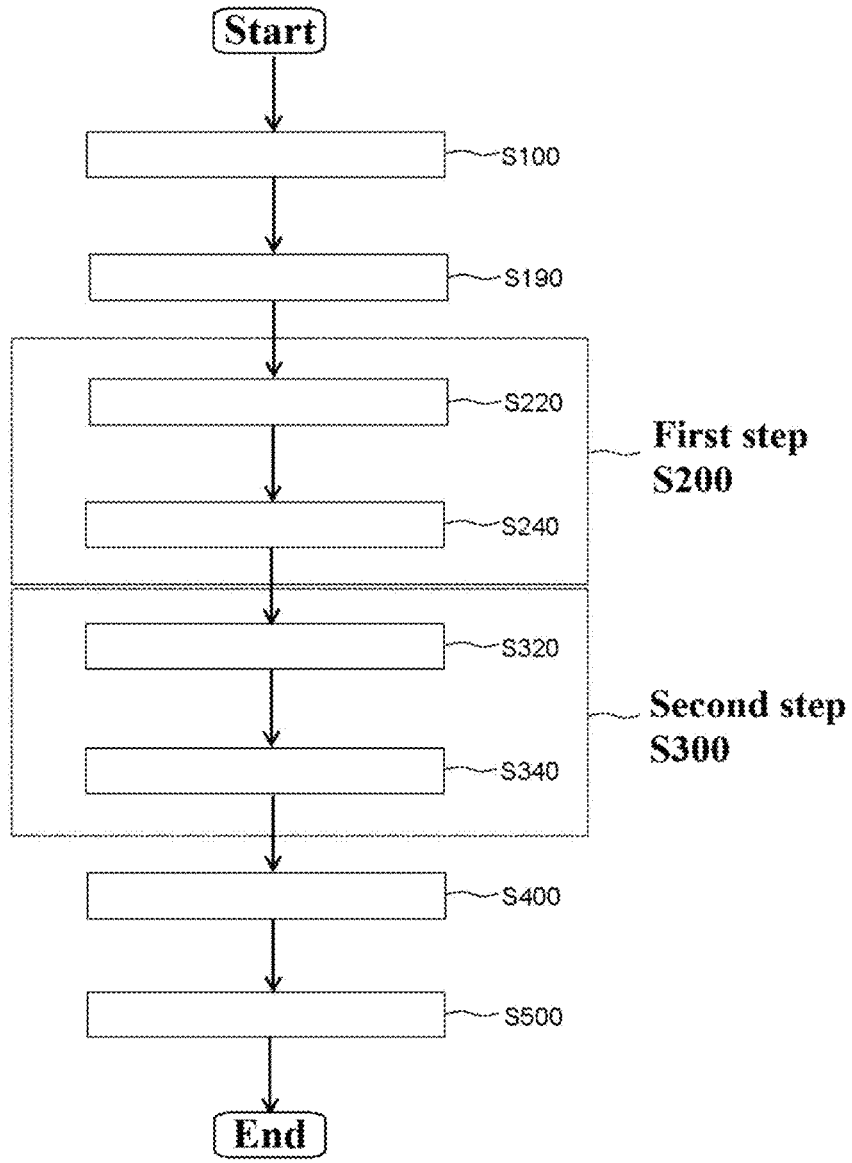
FIG. 1 is a flowchart illustrating a method for manufacturing a nitride semiconductor substrate according to an embodiment of the present disclosure.

First, findings obtained by inventors will be described.

(i) Dislocation Density

Conventionally, as described above, when the crystal layer is further epitaxially grown on the base substrate comprising a single crystal of a group III nitride semiconductor, for example, a crystal layer on a base substrate is grown with only a c-plane as a growth surface without exposing inclined interfaces other than the c-plane. In this case, a dislocation density in a surface of the crystal layer tended to be inversely proportional to a thickness of the crystal layer.

However, when the crystal layer is grown with only the c-plane as the growth surface, the dislocation density in the surface of the crystal layer could not be sufficiently lowered unless the crystal layer is grown very thick. This causes a reduction of productivity for obtaining a nitride semiconductor substrate having a desired dislocation density in the main surface.

Accordingly, a technique capable of efficiently obtaining the nitride semiconductor substrate having a low dislocation density has been desired.

(ii) Variation in Off-Angle

In the nitride semiconductor substrate, a (0001) plane may be curved in a concave spherical shape with respect to the main surface. When the (0001) plane is curved with respect to the main surface, an off-angle varies within the main surface, the off-angle being an angle formed by <0001> axis with respect to a normal of the main surface.

The off-angle in the nitride semiconductor substrate affects, for example, a surface morphology of a semiconductor functional layer grown on the substrate. For example, when a radius of curvature of the (0001) plane of the substrate is small and a variation in the off-angle of the substrate is large, the surface morphology of the semiconductor functional layer may deteriorate in a part of the substrate, due to the off-angle. Therefore, when a semiconductor device as a Schottky barrier diode (SBD) is manufactured using this substrate, a withstand voltage and reliability may decrease in a semiconductor device cut out from a portion where the surface morphology of the semiconductor functional layer has deteriorated.

Further, for example, when indium (In) is doped on the substrate to form a light emitting layer, the off-angle in the nitride semiconductor substrate affects a content of In in the light emitting layer. For example, when the radius of curvature of the (0001) plane of the substrate is small and the variation in the off-angle of the substrate is large, the content of In in the light emitting layer varies depending on the variation in the off-angle of the substrate. Therefore, there is a possibility that a light emitting wavelength varies and a light emitting unevenness occurs in a light emitting element having this light emitting layer.

Accordingly, a technique capable of reducing the variation in the off-angle in the nitride semiconductor substrate has been desired, to prevent practical problems such as deterioration of the surface morphology and uneven light emission.

The present disclosure is based on the findings of the above (i) and (ii) found by the inventors of the present disclosure.

An Embodiment of the Present Disclosure

Hereinafter, an embodiment of the present disclosure will be described with reference to the drawings.

(1) Method for Manufacturing a Nitride Semiconductor Substrate

A method for manufacturing a nitride semiconductor substrate according to the present embodiment will be described with reference to FIGS. 1 to 6.

FIG. 1 is a flowchart illustrating a method for manufacturing a nitride semiconductor substrate according to the present embodiment. FIGS. 2(a) to (g), FIGS. 3(a) to 3 (d), and FIGS. 5(a) to 6 (b) are schematic sectional views illustrating a part of the method for manufacturing a nitride semiconductor substrate according to the present embodiment. FIG. 4 is a schematic perspective view illustrating a part of the method for manufacturing a nitride semiconductor substrate according to the present embodiment. FIG. 4 corresponds to a perspective view at a time point of FIG. 3C, and illustrates a part of a first layer 30 growing on a base substrate 10. Further, a thin solid line indicates a crystal plane in a process of growth in FIG. 5(b), and a dotted line indicates dislocations in FIGS. 3(d) and 5(a) to 6(b).

As illustrated in FIG. 1, the method for manufacturing a nitride semiconductor substrate according to the present embodiment includes: for example, a base substrate preparation step S100, an initial step S190, a first step S200, a second step S300, a slicing step S400, and a polishing step S500.

(S100: Base Substrate Preparation Step)

First, in the base substrate preparation step S100, a base substrate 10 comprising a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, <0001> axis (for example, [0001] axis) is referred to as "c-axis", and (0001) plane is referred to as "c-plane". The (0001) plane may be referred to as a "+c plane (group III element polar plane)", and the (000-1) plane may be referred to as a "−c plane (nitrogen (N) polar plane)". Further, <1-100> axis (for example, [1-100] axis) is referred to as "m-axis", and {1-100} plane is referred to as a "m-plane". m-axis may be expressed as <10-10> axis. Further, <11-20> axis (for example, [11-20] axis) is referred to as "a-axis", and {11-20} plane is referred to as "a-plane".

In the base substrate preparation step S100 of the present embodiment, for example, the base substrate 10 is prepared by a VAS (Void-Assisted Separation) method.

Specifically, the base substrate preparation step S100 includes: for example, a substrate preparation step S110 for crystal growth, a first crystal layer forming step S120, a metal layer forming step S130, a void forming step S140, a second crystal layer forming step S150, a peeling step S160, a slicing step S170, and a polishing step S180.

(S110: Substrate Preparation Step for Crystal Growth)

Figure 2A:
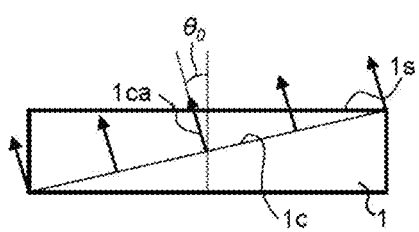
FIGS. 2(a) to 2(g) are schematic cross-sectional views illustrating a part of a method for manufacturing a nitride semiconductor substrate according to an embodiment of the present disclosure.

First, as illustrated in FIG. 2(a), a crystal growth substrate 1 (hereinafter, may be abbreviated as a "substrate 1") is prepared. The substrate 1 is, for example, a sapphire substrate. Also, the substrate 1 may be, for example, a Si substrate or a gallium arsenide (GaAs) substrate. The substrate 1 has, for example, a main surface is which is a growth surface. A low index crystal plane closest to the main surface is 1s, for example, a c-plane 1c.

In the present embodiment, the c-plane 1c of the substrate 1 is inclined with respect to the main surface 1s. The c-axis 1ca of the substrate 1 is inclined at a predetermined off-angle $\theta_0$ with respect to a normal of the main surface 1s. The off-angle $\theta_0$ in the main surface 1s of the substrate 1 is uniform over an entire main surface 1s. The off-angle $\theta_0$ in the main surface is of the substrate 1 affects the off-angle $\theta_3$ at a center of the main surface 10s of the base substrate 10, which will be described later.

(S120: First Crystal Layer Forming Step)

Figure 2B:
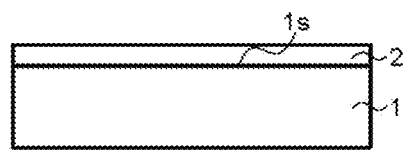

Next, as illustrated in FIG. 2(b), for example, a low-temperature growth GaN buffer layer and a Si-doped GaN layer are grown in this order as a first crystal layer (underground growth layer) 2 on the main surface 1s of the substrate 1, by supplying trimethylgallium (TMG) gas as a group III source gas, ammonia gas ($NH_3$) as a nitrogen source gas, and monosilane ($SiH_4$) gas as an n-type dopant gas, to the substrate 1 heated to a predetermined growth temperature, by a metalorganic vapor phase growth (MOVPE) method. At this time, a thickness of the low-temperature growth GaN buffer layer and a thickness of the Si-doped GaN layer are, for example, 20 nm and 0.5 μm, respectively.

(S130: Metal Layer Forming Step)

Figure 2C:
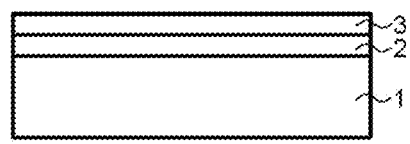

Next, as illustrated in FIG. 2(c), a metal layer 3 is deposited on the first crystal layer 2. The metal layer 3 is, for example, a titanium (Ti) layer. Further, a thickness of the metal layer 3, is for example, 20 nm.

(S140: Void Forming Step)

Next, the above-described substrate 1 is put into an electric furnace, and the substrate 1 is placed on a susceptor having a predetermined heater. After the substrate 1 is placed on the susceptor, the substrate 1 is heated by the heater and heat treatment is performed thereto in an atmosphere containing hydrogen gas or hydride gas. Specifically, for example, the heat treatment is performed at a predetermined temperature for 20 minutes in a hydrogen ($H_2$) gas stream containing 20% $NH_3$ gas. A heat treatment temperature is, for example, 850° C. or higher and 1,100° C. or lower. By performing such a heat treatment, the metal layer 3 is nitrided to form a metal nitride layer 5 having high-density fine holes on a surface. Further, by performing the above-described heat treatment, a part of the first crystal layer 2 is etched through the holes of the metal nitride layer 5 to form high-density voids in the first crystal layer 2.

Figure 2D:
Figure 2E:
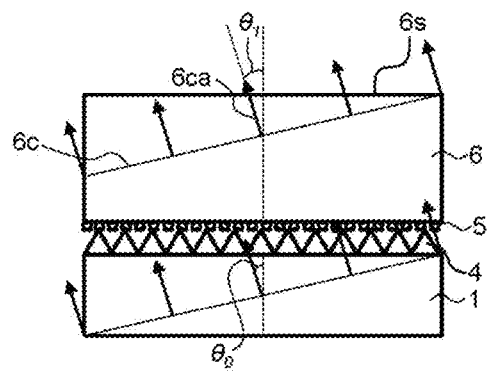

Thereby, as illustrated in FIG. 2(d), a void-containing first crystal layer 4 is formed.

(S150: Second Crystal Layer Forming Step)

Next, for example, a Si-doped GaN layer is epitaxially grown as a second crystal layer (full-scale growth layer) 6 over the void-containing first crystal layer 4 and metal nitride layer by supplying gallium chloride (GaCl) gas, $NH_3$ gas and dichlorosilane ($SiH_2Cl_2$) gas as an n-type dopant gas, to the substrate 1 heated to a predetermined growth temperature by a hydride vapor deposition (HVPE) method. A Ge-doped GaN layer may be epitaxially grown as the second crystal layer 6, by supplying tetrachlorogerman ($GeCl_4$) gas or the like instead of $SiH_2Cl_2$ gas, as an n-type dopant gas.

At this time, the second crystal layer 6 grows from the void-containing first crystal layer 4 over the void-containing first crystal layer 4 and the metal nitride layer 5 through the holes in the metal nitride layer 5. A part of the voids in the void-containing first crystal layer 4 is embedded by the second crystal layer 6, but the other part of the voids in the void-containing first crystal layer 4 remains. A flat cavity is formed between the second crystal layer 6 and the metal nitride layer 5 due to the voids remaining in the void-containing first crystal layer 4. This cavity causes peeling of the second crystal layer 6 in a peeling step S160 described later.

Further, at this time, the second crystal layer 6 is grown by inheriting an orientation of the substrate 1. That is, an off-angle $\theta_1$ in the main surface of the second crystal layer 6 is uniform over an entire main surface, similarly to an off-angle $\theta_0$ in the main surface is of the substrate 1.

Further, at this time, a thickness of the second crystal layer 6 is, for example, 600 μm or more, preferably 1 mm or more. An upper limit of the thickness of the second crystal layer is not particularly limited, but from a viewpoint of improving productivity, the thickness of the second crystal layer 6 is preferably 50 mm or less.

(S160: Peeling Step)

After the growth of the second crystal layer 6 is completed, the second crystal layer 6 naturally peels off from the substrate 1 at a boundary between the void-containing first crystal layer 4 and the metal nitride layer 5, in a process of cooling a HVPE apparatus used to grow the second crystal layer 6.

At this time, tensile stress is introduced into the second crystal layer 6 by attracting initial nuclei each other, which are generated in the growth process. Therefore, due to the tensile stress generated in the second crystal layer 6, an internal stress acts on the second crystal layer 6 so that a surface side thereof is concave. Further, a dislocation density in the main surface (front surface) side of the second crystal layer 6 is low, while a dislocation density in a back surface side of the second crystal layer 6 is high. Therefore, even due to a difference of the dislocation density in a thickness direction of the second crystal layer 6, the internal stress acts on the second crystal layer 6 so that the surface side thereof is concave.

Figure 2F:
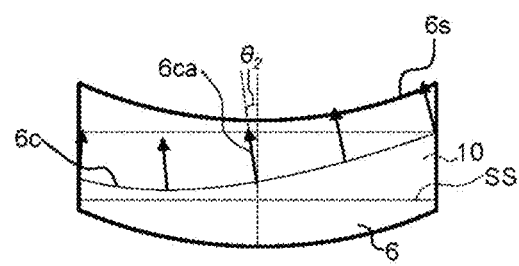
Figure 2G:
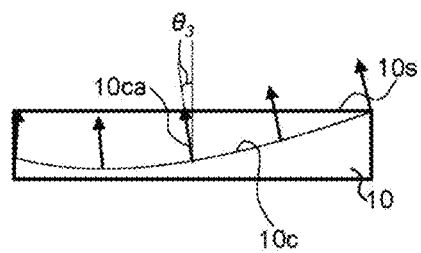

As a result, as illustrated in FIG. 2(f), after the second crystal layer 6 is peeled off from the substrate 1, the surface side thereof is warped so as to be concave. Therefore, the c-plane 6c of the second crystal layer 6 is curved in a concave spherical shape with respect to a plane perpendicular to a normal direction of the center of the main surface 6s of the second crystal layer 6. An off-angle $\theta_2$ formed by the c-axis 6ca with respect to the normal of the center of the main surface 6s of the second crystal layer 6 has a predetermined distribution.

(S170: Slicing Step)

Next, as illustrated in FIG. 2 (f), for example, the second crystal layer 6 is sliced by a wire saw along a cut surface SS substantially perpendicular to the normal direction of the center of the main surface 6s of the second crystal layer 6.

Thereby, as illustrated in FIG. 2 (g), a base substrate 10 as an as-slice substrate is formed. At this time, a thickness of the base substrate 10 is, for example, 450 µm. The off-angle $\theta_3$ of the base substrate 10 may change from the off-angle $\theta_2$ of the second crystal layer 6 due to a slice direction dependence.

(S180: Polishing Step)

Next, both sides of the base substrate 10 are polished by a polishing device. Thereby, the main surface 10s of the base substrate 10 is mirror-finished.

By the above-described base substrate preparation step S100, the base substrate 10 comprising a single crystal of GaN is obtained.

A diameter of the base substrate 10 is, for example, 2 inches or more. A thickness of the base substrate 10 is, for example, 300 µm or more and 1 mm or less.

The main surface 10s of the base substrate 10 has, for example, a main surface (base surface) 10s which is an epitaxial growth surface. In the present embodiment, a lowest index crystal plane closest to the main plane 10s is, for example, a c-plane (+c-plane) 10c.

The c-plane 10c of the base substrate 10 is curved in a concave spherical shape with respect to the main surface 10s. The term "spherical" as used herein means a curved surface that is approximated to a spherical surface. Further, the term "spherical approximation" as used herein means that a sphere is approximated to a perfect circular sphere or an elliptical sphere within a predetermined error.

In the present embodiment, c-plane 10f of the base substrate 10 has, for example, a curved surface that is approximated to a spherical surface in each of a cross section along the m-axis and a cross-section along the a-axis. A radius of curvature of the c-plane 10c in the base substrate 10 is, for example, 1 m or more and less than 10 m.

Since the c-plane 10c of the base substrate 10 is curved, the off-angle $\theta_3$ formed by the c-axis 10ca with respect to the normal of the center of the main surface 10s of the base substrate 10 has a predetermined distribution.

In the present embodiment, a size of the off-angle $\theta_3$ at the center of the main surface 10s of the base substrate 10 is, for example, more than 0° and 1° or less.

A size and a direction of the off-angle $\theta_3$ at the center of the main surface 10s of the base substrate 10 can be adjusted, for example, by a size and a direction of the off-angle $\theta_0$ of the crystal growth substrate 1 used in the above-described VAS method, and a slicing angle and a slicing direction in the slicing step S170.

Further, in the present embodiment, a root mean square roughness RMS of the main surface 10s of the base substrate 10 is, for example, less than 1 nm.

Further, in the present embodiment, since the base substrate 10 is manufactured by the above-described VAS method, the dislocation density in the main surface 10s of the base substrate 10 is low. Specifically, the dislocation density in the main surface 10s of the base substrate 10 is, for example, $3\times10^6$ cm$^{-2}$ or more and less than $1\times10^7$ cm$^{-2}$.

(S190: Initial Step (Slow Growth Step))

Figure 3A:
FIGS. 3(a) to 3(d) are schematic cross-sectional views illustrating a part of a method for manufacturing a nitride semiconductor substrate according to an embodiment of the present disclosure.
Figure 3B:
Figure 4:
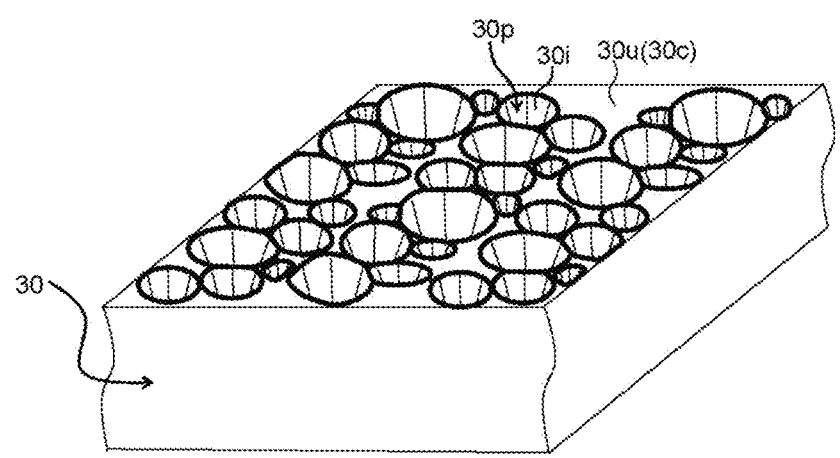
FIG. 4 is a schematic perspective view illustrating a part of a method for manufacturing a nitride semiconductor substrate according to an embodiment of the present disclosure.

After preparing the base substrate 10, as illustrated in FIG. 3(a), the following initial step S190 is performed using the base substrate 10 in a state where none of the processing of the formation of the mask layer on the main surface 10s and the formation of the uneven pattern on the main surface 10s is performed. The term "mask layer" referred to herein means, for example, a mask layer used in a so-called ELO (Epitaxial Lateral Overgrown) method and having a predetermined opening. Further, a "concavo-convex (uneven) pattern" referred to herein is used, for example, in a so-called pendeoepitaxy method, and means at least one of a trench and a ridge obtained by directly patterning the main surface of the base substrate. A height difference of the uneven pattern referred to herein is, for example, 100 nm or more. The base substrate 10 of the present embodiment is used in the initial step S190 in a state of not having the structure as described above.

In the initial step S190, a single crystal of a group III nitride semiconductor is epitaxially grown directly on the main surface 10s of the base substrate 10 with the c-plane as a growth surface. Thereby, an initial layer (slow growth layer) 20 is grown on the base substrate 10.

In the present embodiment, for example, a layer comprising the same group III nitride semiconductor as the group III nitride semiconductor constituting the base substrate 10 is epitaxially grown as the initial layer 20. Specifically, for example, a GaN layer is grown as the initial layer 20 by heating the base substrate 10 and supplying GaCl gas and NH$_3$ gas to the heated base substrate 10, by the HVPE method.

At this time, a growth rate of the c-plane of the initial layer 20 in the initial step S190 is made lower than, for example, a growth rate of a c-plane 30c of a first layer 30 in the first step S200 described later. Thereby, the initial layer 20 can be step-flow-grown on the main surface 10s of the base substrate 10.

Specifically, for example, while making a growth temperature in the initial step S190 the same as a growth temperature in the first step S200 described later, at least one of a partial pressure of raw materials in the initial step S190 (partial pressure of group III source gas and nitrogen source gas) and a ratio of a partial pressure of a flow rate of NH$_3$ gas as a nitrogen source gas to a partial pressure of GaCl gas as a group III source gas (hereinafter, also referred to as "V/III ratio"), is made lower than that of the first step S200 described later. Thereby, a growth rate of the c-plane of the initial layer 20 can be lower than a growth rate of the c-plane 30c of the first layer 30, which will be described later.

At this time, as described above, since the growth temperature in the initial step S190 is equal to the growth temperature in the first step S200 described later, a transition from the initial step S190 to the first step S200 can be smoothly performed in a short time.

As described above, by growing the initial layer 20 on the main surface 10s of the base substrate 10, a surface morphology and crystallinity of the initial layer 20 can be substantially uniform over an entire surface regardless of the state of the main surface 10s of the base substrate 10, even if there is an abnormal part such as a rough part or a part having different crystallinity in a part of the main surface 10s of the base substrate 10. Thereby, in the first step S200 described later, a generation state of an inclined interface 30i such as an inclined angle of the inclined interface 30i with respect to the c-plane 30c can be substantially uniform over the entire surface of the first layer 30.

At this time, a thickness of the initial layer 20 is not particularly limited, but is, for example, 5 µm or more and 200 µm or less, preferably 5 µm or more and 100 µm or less. By setting the thickness of the initial layer 20 within the above range, the surface morphology and crystallinity of the initial layer 20 can be stably substantially uniform.

(S200: First Step (First Layer Growth Step))

Figure 3C:
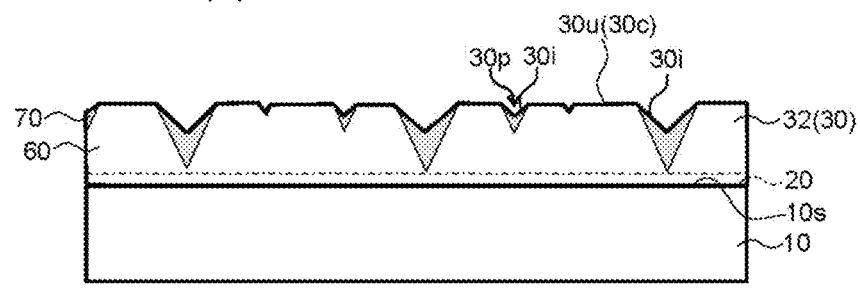
Figure 3D:
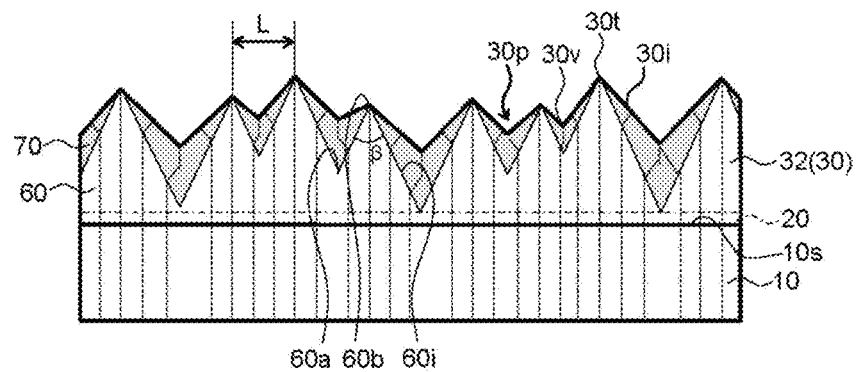

After the initial layer 20 is formed, as illustrated in FIGS. 3(c), 3(d), and FIG. 4, a single crystal of a group III nitride semiconductor having a top surface 30u with a c-plane 30c exposed, is epitaxially grown on the initial layer 20. Thereby, a first layer (three-dimensional growth layer) 30 is grown.

At this time, a plurality of concaves 30p formed by being surrounded by the inclined interface 30i other than the c-plane are generated on the top surface 30u of the single crystal, and the inclined interface 30i is gradually expanded and the c-plane 30c is gradually contracted toward an upper side of the initial layer 20. Thereby, the c-plane 30c disappears from the top surface 30u. As a result, the first layer 30 whose surface is composed only of the inclined interface 30i is grown.

That is, in the first step S200, the first layer 30 is three-dimensionally grown so as to intentionally roughen the initial layer 20 and main surface 10s of the base substrate 10. Even if the first layer 30 is in an appearance of such a growth form, it is grown as a single crystal as described above. In this regard, the first layer 30 is different from a so-called low temperature growth buffer layer formed as an amorphous or polycrystal on a dissimilar substrate before epitaxially growing the group III nitride semiconductor on the dissimilar substrate such as sapphire.

In the present embodiment, for example, a layer comprising the same group III nitride semiconductor as the group III nitride semiconductor constituting the base substrate 10 is epitaxially grown as the first layer 30. Specifically, for example, by heating the base substrate 10 and supplying GaCl gas and $NH_3$ gas to the heated base substrate 10 by the HVPE method, the GaN layer is epitaxially grown as the first layer 30.

Here, in the first step S200, in order to express the above-described growth process, for example, the first layer 30 is grown under a predetermined first growth condition.

Figure 7A:
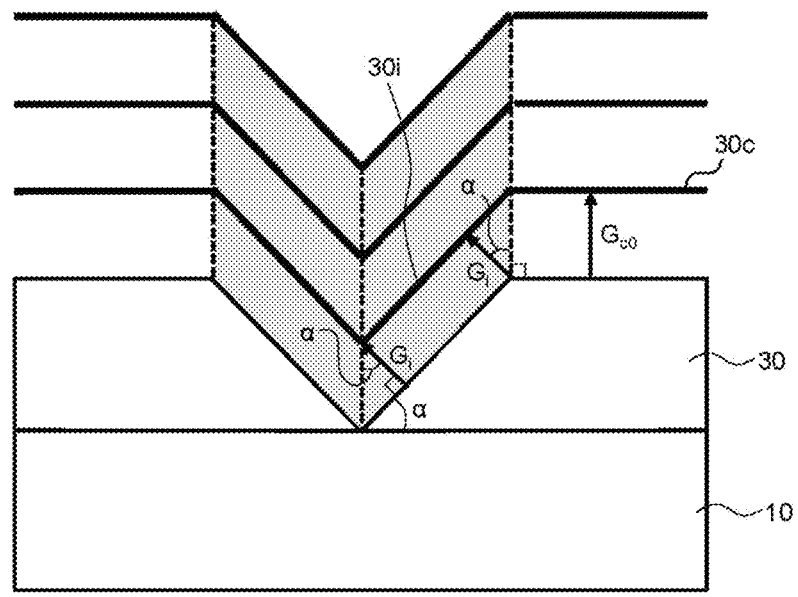
FIG. 7(a) is a schematic cross-sectional view illustrating a growth process under a reference growth condition such that an inclined interface and a c-plane are neither expanded nor contracted, and (b) is a schematic cross-sectional view illustrating a growth process under a first growth condition such that the inclined interface is expanded and the c-plane is contracted.

First, a reference growth condition such that the inclined interface 30i and the c-plane 30c are neither expanded nor contracted, will be described, with reference to FIG. 7(a). FIG. 7(a) is a schematic cross-sectional view illustrating a growth process under the reference growth condition such that the inclined interface and the c-plane are neither expanded nor contracted.

In FIG. 7(a), a thick solid line indicates the surface of the first layer 30 for each unit time. The inclined interface 30i illustrated in FIG. 7(a) is the inclined interface most inclined with respect to the c-plane 30c. Further, in FIG. 7(a), a growth rate of the c-plane 30c of the first layer 30 is $G_{c0}$, a growth rate of the inclined interface 30i of the first layer 30 is $G_i$, and an angle formed by the c-plane 30c and the inclined interface 30i in the first layer 30 is $\alpha$. Also, in FIG. 7(a), the first layer 30 grows while maintaining the angle $\alpha$ formed by the c-plane 30c and the inclined interface 30i. The off-angle of the c-plane 30c of the first layer 30 is negligible as compared with the angle $\alpha$ formed by the c-plane 30c and the inclined interface 30i.

As illustrated in FIG. 7(a), when each of the inclined interface 30i and the c-plane 30c is neither expanded nor contracted, a locus of an intersection between the inclined interface 30i and the c-plane 30c becomes perpendicular to the c-plane 30c. Therefore, the reference growth condition such that each of the inclined interface 30i and the c-plane 30c is neither expanded nor contracted, satisfies the following formula (a).

$$G_{c0}=G_i/\cos \alpha \tag{a}$$

Figure 7B:
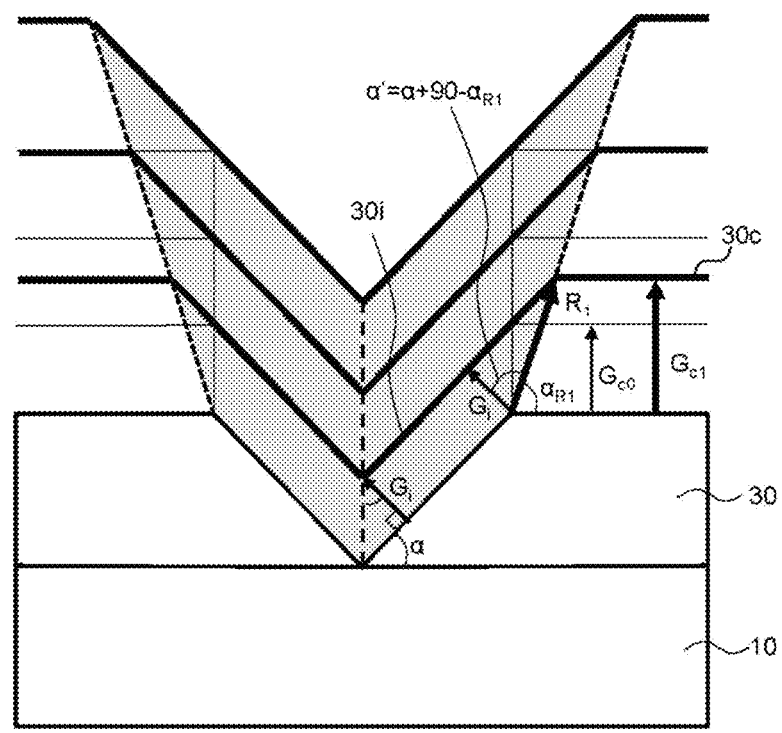

Next, a first growth condition such that the inclined interface 30i is expanded and the c-plane 30c is contracted, will be described with reference to FIG. 7(b). FIG. 7(b) is a schematic cross-sectional view illustrating a growth process under the first growth condition such that the inclined interface is expanded and the c-plane is contracted.

In FIG. 7(b), as in FIG. 7 (a), a thick solid line indicates the surface of the first layer 30 for each unit time. Further, the inclined interface 30i illustrated in FIG. 7(b) is also the inclined interface most inclined with respect to the c-plane 30c. Also, in FIG. 7(b), a growth rate of the c-plane 30c of the first layer 30 is $G_{c1}$, and a progress rate of the locus of the intersection between the inclined interface 30i and the c-plane 30c of the first layer 30 is $R_1$. Further, a narrower angle of the angles formed by the c-plane 30c and the locus of the intersection between the inclined interface 30i and the c-plane 30c, is $\alpha_{R1}$. When the angle formed by $R_1$ direction and $G_i$ direction is $\alpha'$, $\alpha'=\alpha+90-\alpha_{R1}$ is satisfied. The off-angle of the c-plane 30c of the first layer 30 is negligible as compared with the angle $\alpha$ formed by the c-plane 30c and the inclined interface 30i.

As illustrated in FIG. 7(b), the progress rate $R_1$ of the locus of the intersection between the inclined interface 30i and the c-plane 30c is represented by the following formula (b).

$$R_1=G_i/\cos \alpha' \tag{b}$$

Further, a growth rate $G_{c1}$ of the c-plane 30c of the first layer 30 is represented by the following formula (c).

$$G_{c1}=R_1 \sin \alpha_{R1} \tag{c}$$

By substituting the formula (b) into the formula (c), $G_{c1}$ is represented by the following formula (d) using $G_i$.

$$G_{c1}=G_i \sin \alpha_{R1}/\cos(\alpha+90-\alpha_{R1}) \tag{d}$$

In order for the inclined interface 30i to expand and the c-plane 30c to contract, $\alpha_{R1}<90°$ is preferable. Accordingly, the first growth condition such that the inclined interface 30i is expanded and the c-plane 30c is contracted, preferably satisfies the following formula (1), due to satisfying formula (d) and $\alpha_{R1}<90°$.

$$G_{c1}>G_i/\cos \alpha \tag{1}$$

Wherein, as described above, Gi is the growth rate of the interface 30i most inclined with respect to the c-plane 30c, and $\alpha$ is the angle formed by the inclined interface 30i most inclined with respect to the c-plane 30c, and the c-plane 30c.

Alternatively, it can be considered that $G_{c1}$ based on the first growth condition is preferably larger than $G_{c0}$ based on the reference growth condition. This also derives the formula (1) by substituting the formula (a) into $G_{c1}>G_{c0}$.

Since the growth condition for expanding the inclined interface 30i most inclined with respect to the c-plane 30c is a strictest condition, it is possible to expand the other inclined interface 30i when the first growth condition satisfies the formula (1).

Specifically, for example, when the inclined interface 30i most inclined with respect to the c-plane 30c is {10-11} plane, $\alpha=61.95°$ is satisfied. Accordingly, the first growth condition preferably satisfies, for example, the following formula (1').

$$G_{c1}>2.13G_i \tag{1'}$$

Alternatively, as will be described later, for example, when the inclined interface 30i is {11-2m} plane satisfying m≥3, the inclined interface 30i most inclined with respect to the c-plane 30c is {11-23} plane, and therefore $\alpha=47.3°$ is satisfied. Accordingly, the first growth condition preferably satisfies, for example, the following formula (1").

$$G_{c1}>1.47G_i \tag{1"}$$

As the first growth condition of the present embodiment, for example, the growth temperature in the first step S200 is lower than the growth temperature in the second step S300 described later. Specifically, the growth temperature in the first step S200 is, for example, 980° C. or higher and 1,020° C. or lower, preferably 1,000° C. or higher and 1,020° C. or lower.

Further, as the first growth condition of the present embodiment, for example, the V/III ratio in the first step S200 may be larger than the V/III ratio in the second step S300 described later. Specifically, the V/III ratio in the first step S200 is, for example, 2 or more and 20 or less, preferably 2 or more and 15 or less.

Actually, as the first growth condition, at least one of the growth temperature and the V/III ratio is adjusted within the above range so as to satisfy the formula (1).

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the first step S200 of the present embodiment is classified into two steps based on, for example, a growing form of the first layer 30. Specifically, the first step S200 of the present embodiment includes, for example, an inclined interface expansion step S220 and an inclined interface maintenance step S240. By these steps, the first layer 30 has, for example, an expanded inclined interface layer 32 and an inclined interface maintaining layer 34.

(S220: Inclined Interface Expansion Step)

First, as illustrated in FIG. 3(c) and FIG. 4, the expanded inclined interface layer 32 of the first layer 30 comprising a single crystal of a group III nitride semiconductor is epitaxially grown on the initial layer 20 under the above-described first growth condition.

In the initial stage of growth of the expanded inclined interface layer 32, the expanded inclined interface layer 32 grows in a normal direction (direction along the c-axis) of the main surface 10s of the base substrate 10, with the c-plane 30c as a growth surface.

By gradually growing the expanded inclined interface layer 32 under the first growth condition, as illustrated in FIG. 3(c) and FIG. 4, a plurality of concaves 30p composed of the inclined interface 30i other than the c-plane, are formed on the top surface 30u of the expanded inclined interface layer 32 with the c-plane 30c exposed. The plurality of concaves 30p composed of the inclined interface 30i other than the c-plane are randomly formed on the top surface 30u. Thereby, the expanded inclined interface layer 32 is formed, in which the c-plane 30c and the inclined interface 30i other than the c-plane are mixed on the surface.

The term "inclined interface 30i" as used herein means a growth interface inclined with respect to the c-plane 30c, and includes low index facets other than the c-plane, high-index facets other than the c-plane, or inclined faces that cannot be represented by indices of crystal plane (Miller indices). Facets other than the c-plane are, for example, {11-2m}, {1-10n}, and the like. Wherein, m and n are integers other than 0.

In the present embodiment, since the above-described initial step S190 is performed and the first growth condition is adjusted so as to satisfy the formula (1), for example, {11-2m} plane satisfying m 3 can be generated as the inclined interface 30i. Thereby, an inclination angle of the {11-2m} plane with respect to the c plane 30c can be loose. Specifically, the inclination angle can be 47.3° or less.

By further growing the expanded inclined interface layer 32 under the first growth condition, as illustrated in FIGS. 3(c) and 3 (d), the inclined interface 30i other than the c-plane is gradually expanded and the c-plane 30c is gradually contracted toward the upper side of the base substrate 10, in the expanded inclined interface layer 32. At this time, the inclination angle formed by the inclination interface 30i with respect to the main surface 10s of the base substrate 10 gradually decreases toward the upper side of the base substrate 10. Thereby, most of the inclined interface 30i finally becomes the {11-2m} plane satisfying m≥3 as described above.

When the expanded inclined interface layer 32 is further grown, the c-plane 30c of the expanded inclined interface layer 32 disappears from the top surface 30u, and the surface of the expanded inclined interface layer 32 is composed only of the inclined interface 30i. Thereby, a mountain-like expanded inclined interface layer 32 is formed in the form of continuous connected cones.

In this way, by forming a plurality of concaves 30p composed of the inclined interface 30i other than the c-plane on the top surface 30u of the expanded inclined interface layer 32, and making the c-plane 30c disappear, as illustrated in FIG. 3(d), a plurality of valleys 30v and a plurality of tops 30t are formed on the surface of the expanded inclined interface layer 32. Each of the plurality of valleys 30v is formed as an inflection point that is convex downward on the surface of the expanded inclined interface layer 32, and is formed at the upper part of a position where each of the inclined interfaces 30i other than the c-plane is generated. On the other hand, each of the plurality of tops 30t is formed as an inflection point that is convex upward on the surface of the expanded inclined interface layer 32, and is formed at a position where the c-plane 30c (finally) disappears and terminates or at the upper part of this position, between a pair of inclined interfaces 30i that expand in opposite directions. The valleys 30v and the tops 30t are formed alternately in a direction along the main surface 10s of the base substrate 10.

In the present embodiment, in the initial step S190, the initial layer 20 is grown to a predetermined thickness on the main surface 10s of the base substrate 10 with the c-plane as a growth surface without forming an inclined interface, and thereafter in the inclined interface expansion step S220, the inclined interface 30i other than the c-plane is generated on the surface of the expanded inclined interface layer 32. Thereby, the plurality of valleys 30v are formed at positions separated upward from the main surface 10s of the base substrate 10.

Due to the growth process of the expanded inclined interface layer 32 as described above, dislocations are bent and propagated as follows. Specifically, as illustrated in FIG. 3(d), the plurality of dislocations extending in the direction along the c-axis in the base substrate 10, propagate from the base substrate 10 through the initial layer 20 toward the direction along the c-axis of the expanded inclined interface layer 32. In a region of the expanded inclined interface layer 32 that has grown with the c-plane 30c as a growth surface, the dislocations propagate in the direction along the c-axis of the expanded inclined interface layer 32. However, when the dislocations propagated in the direction along the c-axis of the expanded inclined interface layer 32 are exposed to the inclined interface 30i, the dislocations are bent and propagate in a direction substantially perpendicular to the inclined interface 30i at a position where the inclined interface 30i is exposed. That is, the dislocations are bent and propagate in a direction inclined with respect to the c-axis. Thereby, in the steps after the inclined interface expansion step S220, the dislocations are locally collected in the upper part of the substantially center between the pair of tops 30t. As a result, a dislocation density in the surface of a second layer 40, which will be described later, can be lowered.

At this time, in the present embodiment, an average distance between a pair of tops separated in a direction along the main surface (also called "an average distance between closest tops") L is, for example, more than 100 the pair of tops being closest to each other among the plurality of tops, with one of the plurality of valleys sandwiched between them, when observing an arbitrary cross section perpendicular to the main surface 10s of the base substrate 10. When the average distance L between the closest tops is 100 μm or less, as in the case where fine hexagonal pyramid-shaped crystal nuclei are generated on the main surface 10s of the base substrate 10 from the initial stage of the inclined interface expansion step S220, the distance in which dislocations are bent and propagated is shortened in the steps after the inclined interface expansion step S220. Therefore, the dislocations are not sufficiently collected in the upper part of the substantially center between the pair of tops 30t of the expanded inclined interface layer 32. As a result, the dislocation density in the surface of the second layer 40, which will be described later, may not be sufficiently lowered. In contrast, in the present embodiment, since the average distance L between the closest tops is more than 100 at least over 50 μm of the distance in which the dislocations are bent and propagated can be secured in the steps after the inclined interface expansion step S220. Thereby, the dislocations can be sufficiently collected in the upper part of the substantially center between the pair of tops 30t of the expanded inclined interface layer 32. As a result, the dislocation density in the surface of the second layer 40, which will be described later, can be sufficiently lowered.

In the present embodiment, for example, in the first layer 30, it is preferable that there is no portion where the distance between the closest tops is 100 μm or less. In other words, it is preferable that the distance between the closest tops is more than 100 μm over the entire surface of the first layer 30, when observing an arbitrary cross section perpendicular to the main surface 10s of the base substrate 10. Thereby, the dislocation density can be lowered substantially uniformly over the entire surface of the second layer 40, which will be described later.

On the other hand, in the present embodiment, the average distance L between the closest tops is less than 800 When the average distance L between the closest tops is 800 μm or more, a height from the valley 30v to the top 30t of the expanded inclined interface layer 32 on the main surface 10s of the base substrate 10 becomes excessively high. Therefore, a thickness of the second layer 40 until it is mirror-finished (it becomes a mirror surface), becomes thicker in the second step S300, which will be described later. In contrast, in the present embodiment, since the average distance L between the closest tops is less than 800 the height from the valley 30v to the top 30t of the expanded inclined interface layer 32 on the main surface 10s of the base substrate 10 can be lowered. Thereby, the second layer 40 can be quickly mirror-finished in the second step S300 described later.

Further, at this time, a first c-plane growth region 60 grown with the c-plane 30c as a growth surface and an inclined interface growth region 70 (gray part in the figure) grown with the inclined interface 30i other than the c-plane as a growth surface, are formed on the expanded inclined interface layer 320, based on a difference in growth surfaces during the growth process.

Further, at this time, in the first c-plane growth region 60, a valley 60a is formed at a position where the inclined interface 30i is generated, and a mountain 60b is formed at a position where the c-plane 30c disappears. Further, in the first c-plane growth region 60, a pair of inclined portions 60i are formed on both sides of the mountain 60b, as a locus of an intersection between the c-plane 30c and the inclined interface 30i.

Further, at this time, when the first growth condition satisfies the formula (1), an angle β formed by the pair of inclined portions 60i is, for example, 70° or less.

Details of these regions will be described later.

(S240: Inclined Interface Maintenance Step)

Figure 5A:
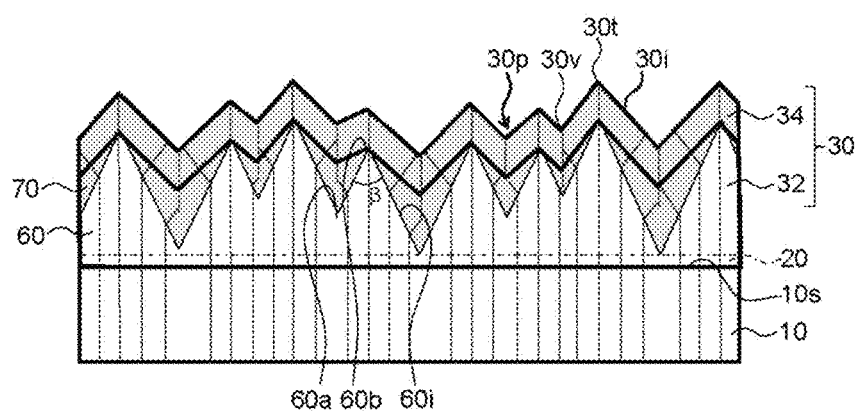
FIGS. 5(a) to 5(b) are schematic cross-sectional views illustrating a part of a method for manufacturing a nitride semiconductor substrate according to an embodiment of the present disclosure.

After the c-plane 30c disappears from the surface of the expanded inclined interface layer 32, as illustrated in FIG. 5(a), the growth of the first layer 30 over a predetermined thickness is continued while maintaining a state where the inclined interface 30i occupies more than the c-plane 30c on the surface, preferably a state where the surface is composed only of the inclined interface 30i. Thereby, an inclined interface maintenance layer 34 having a surface in which the inclined interface 30i occupies more than the c-plane 30c, is formed on the expanded inclined interface layer 32. Since the inclined interface maintenance layer 34 is formed, the c-plane 30c can reliably disappear over the entire surface of the first layer 30.

At this time, the c-plane 30c may reappear in a part of the surface of the inclined interface maintenance layer 34, but it is preferable to mainly expose the inclined interface 30i on the surface of the inclined interface maintenance layer 34, so that an area ratio of the inclined interface growth region 70 is 80% or more in a creepage cross section along the main surface 10s of the base substrate 10. The higher the area ratio occupied by the inclined interface growth region 70 in the creepage cross section, the better, and it is preferable that the area ratio is 100%.

At this time, the growth condition in the inclined interface maintenance step S240 is maintained under the above-described first growth condition in the same manner as in the inclined interface expansion step S220. Thereby, the inclined interface maintenance layer 34 can grow, with only the inclined interface 30i as a growth surface.

Further, at this time, by growing the inclined interface maintenance layer 34 with the inclined interface 30i as a growth surface under the first growth condition, as described above, the dislocations that bend and propagate in the direction inclined with respect to the c-axis at the position where the inclined interface 30i is exposed in the inclined interface expanding layer 32, continue to propagate in the same direction in the inclined interface maintenance layer 34.

Further, at this time, the inclined interface maintenance layer 34 grows with the inclined interface 30i as a growth surface, so that the entire inclined interface maintenance layer 34 becomes a part of the inclined interface growth region 70.

By the above first step S200, the first layer 30 having the expanded inclined interface layer 32 and the inclined interface maintenance layer 34, is formed.

In the first step S200 of the present embodiment, a height from the main surface 10s of the base substrate 10 to the top 30t of the first layer 30 (a maximum height in a thickness direction of the first layer 30) is, for example, more than 100 μm and less than 1.5 mm.

(S300: Second Step (Second Layer Growth Step))

Figure 5B:
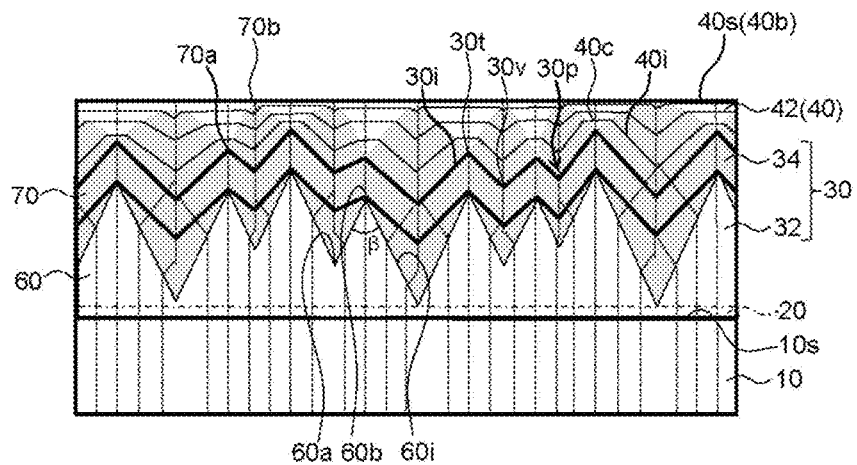
Figure 6A:
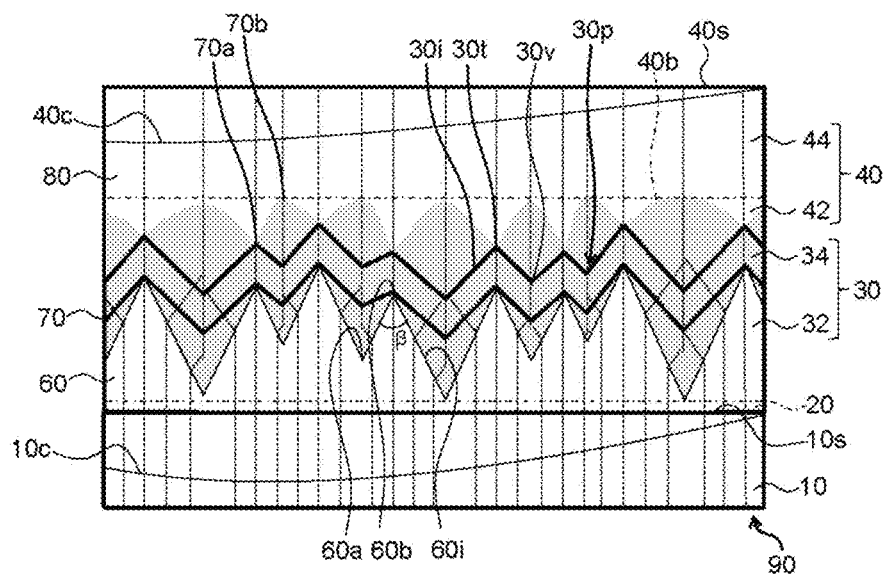
FIGS. 6(a) to 6(b) are schematic cross-sectional views illustrating a part of a method for manufacturing a nitride semiconductor substrate according to an embodiment of the present disclosure.

After the first layer 30 in which the c-plane 30c has disappeared is grown, a single crystal of a group III nitride semiconductor is further epitaxially grown on the first layer 30 as illustrated in FIGS. 5(b) and 6(a).

At this time, the inclined interface 40i is gradually contracted and the c-plane 40c is gradually expanded toward the upper side of the first layer 30. Thereby, the inclined interface 30i formed on the surface of the first layer 30 disappears. As a result, a second layer (flattening layer) 40 having a mirror surface is grown. The "mirror surface" herein means a surface in which a maximum height difference of the unevenness of the surface is equal to or less than a wavelength of a visible light.

In the present embodiment, for example, a layer is epitaxially grown as the second layer 40, containing the same group III nitride semiconductor as the group III nitride semiconductor constituting the first layer 30 as a main component. In the second step S300, a silicon (Si)-doped GaN layer is epitaxially grown as the second layer 40, by supplying GaCl gas, $NH_3$ gas and dichlorosilane ($SiH_2Cl_2$) gas as an n-type dopant gas to the base substrate 10 heated to a predetermined growth temperature. As the n-type dopant gas, $GeCl_4$ gas or the like may be supplied instead of the $SiH_2Cl_2$ gas.

Here, in the second step S300, in order to express the above-described growth process, for example, the second layer 40 is grown under a predetermined second growth condition.

Figure 8:
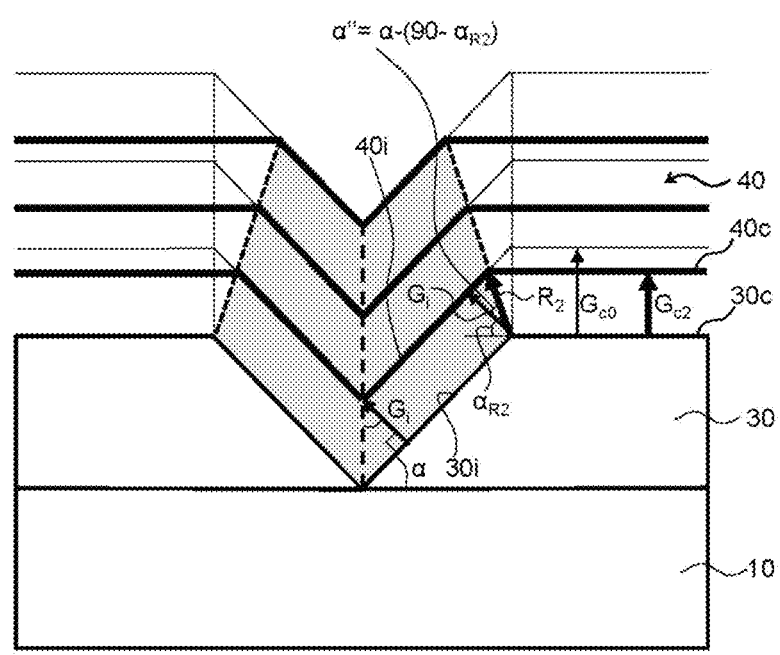
FIG. 8 is a schematic cross-sectional view illustrating a growth process under a second growth condition such that the inclined interface is contracted and the c-plane is expanded.

The second growth condition such that the inclined interface 40i is contracted and the c-plane 40c is expanded, will be described with reference to FIG. 8. FIG. 8 is a schematic cross-sectional view illustrating a growth process under the second growth condition such that the inclined interface is contracted and the c-plane is expanded. FIG. 8 illustrates a process of growing the second layer 40 on the first layer 30 where the inclined interface 30i is exposed, the inclined interface 30i being most inclined with respect to the c-plane 30c.

In FIG. 8, as in FIG. 7(a), the thick solid line indicates the surface of the second layer 40 for each unit time. Further, in FIG. 8, a growth rate of the c-plane 40c of the second layer 40 is $G_{c2}$, a growth rate of the inclined interface 40i of the second layer 40 is $G_i$, and a progress rate of the locus of the intersection between the inclined interface 40i and the c-plane 40c in the second layer 40, is $R_2$. Further, a narrower angle of the angles formed by the c-plane 30c and the locus of the intersection between the inclined interface 40i and the c-plane 40c, is $\alpha_{R2}$. When an angle formed by $R_2$ direction and Gi direction is $\alpha''$, $\alpha''=\alpha-(90-\alpha_{R2})$ is satisfied. Further, in FIG. 8, the second layer 40 grows while maintaining the angle $\alpha$ formed by the c-plane 30c and the inclined interface 30i in the first layer 30. The off-angle of the c-plane 40c of the second layer 40 is negligible as compared with the angle $\alpha$ formed by the c-plane 30c and the inclined interface 30i.

As illustrated in FIG. 8, the progress rate $R_2$ of the locus of the intersection between the inclined interface 40i and the c-plane 40c, is represented by the following formula (e).

$$R_2 = G_i/\cos \alpha'' \quad (e)$$

Further, the growth rate $G_{c2}$ of the c-plane 40c of the second layer 40 is represented by the following formula (f).

$$G_{c2} = R_2 \sin \alpha_{R2} \quad (f)$$

By substituting the formula (e) into the formula (f), $G_{c2}$ is represented by the following formula (g) using $G_i$.

$$G_{c2} = G_i \sin \alpha_{R2}/\cos(\alpha + \alpha_{R2} - 90) \quad (g)$$

In order for the inclined interface 40i to contract and the c-plane 40c to expand, it is preferable that $\alpha R_2 < 90°$ is satisfied. Accordingly, the second growth condition such that the inclined interface 40i is contracted and the c-plane 40c is expanded, preferably satisfies the following formula (2), du to satisfying the formula (g) and $\alpha R_2 < 90°$.

$$G_{c2} < G_i/\cos \alpha \quad (2)$$

wherein, as described above, $G_i$ is the growth rate of the inclined interface 40i most inclined with respect to the c-plane 40c, and $\alpha$ is the angle formed by the c-plane 40c and the inclined interface 40i most inclined with respect to the c-plane 40c.

Alternatively, when the growth rate of the c-plane 30c of the second layer 40 under the reference growth condition is $G_{c0}$, it can also be considered that $G_{c2}$ under the second growth condition is preferably smaller than $G_{c0}$ under the reference growth condition. From this as well, the formula (2) can be derived by substituting the formula (a) into $G_{c2} < G_{c0}$.

When the second growth condition satisfies the formula (2), the other inclined interface 40i can also be contracted, because the growth condition for contracting the interface 40i most inclined with respect to the c-plane 40c, is a strictest condition.

Specifically, when the inclined interface 40i most inclined with respect to the c-plane 40c is the {10-11} plane, the second growth condition preferably satisfies the following formula (2').

$$G_{c2} < 2.13 G_i \quad (2')$$

Alternatively, for example, when the inclined interface 30i is {11-2m} plane satisfying m 3, the inclined interface 30i most inclined with respect to the c-plane 30c is the {11-23} plane. Therefore, the second growth condition preferably satisfies, for example, the following formula (2").

$$G_{c2} < 1.47 G_i \quad (2'')$$

As the second growth condition of the present embodiment, the growth temperature in the second step S300 is set higher than, for example, the growth temperature in the first step S200. Specifically, the growth temperature in the second step S300 is, for example, 990° C. or higher and 1,120° C. or lower, preferably 1,020° C. or higher and 1,100° C. or lower.

Further, as the second growth condition of the present embodiment, the V/III ratio in the second step S300 may be adjusted. For example, the V/III ratio in the second step S300 may be smaller than the V/III ratio in the first step S200. Specifically, the V/III ratio in the second step S300 is, for example, 1 or more and 10 or less, preferably 1 or more and 5 or less.

Actually, as the second growth condition, at least one of the growth temperature and the V/III ratio is adjusted within the above range so as to satisfy the formula (2).

Other conditions of the second growth condition of the present embodiment are, for example, as follows.

Growth pressure: 90 to 105 kPa, preferably 90 to 95 kPa
Partial pressure of GaCl gas: 1.5 to 15 kPa
$N_2$ gas flow rate/$H_2$ gas flow rate: 1 to 20

Here, the second step S300 of the present embodiment is classified into two steps based on, for example, a growing form of the second layer 40. Specifically, the second step S300 of the present embodiment includes, for example, a c-plane expansion step S320 and a main growth step S340. By these steps, the second layer 40 has, for example, a c-plane expanded layer 42 and a main growth layer 44.

(S320: c-Plane Expansion Step)

As illustrated in FIG. 5(b), the c-plane expanded layer 42 of the second layer 40 comprising a single crystal of a group III nitride semiconductor is epitaxially grown on the first layer 30 under the above-described second growth condition.

At this time, the c-plane 40c is expanded and the inclined interface 40i other than the c-plane is contracted, toward an upper side of the first layer 30.

Specifically, due to the growth under the second growth condition, the c-plane expanded layer 42 grows from the inclined interface 30i of the inclined interface maintaining layer 34 in a direction perpendicular to the c-axis (that is, a creepage direction or a lateral direction) with the inclined interface 40i as a growth surface. When the c-plane expanded layer 42 is grown laterally, the c-plane 40c of the c-plane expanded layer 42 begins to be exposed again in the upper part of the top 30t of the inclined interface maintenance layer 34. Thereby, the c-plane expanded layer 42 is formed, in which the c-plane 40c and the inclined interface 40i other than the c-plane are mixed on the surface.

When the c-plane expanded layer 42 is further grown laterally, the c-plane 40c gradually expands, and the inclined interface 40i of the c-plane expanded layer 42 gradually contracts. Thereby, the concaves 30p formed by the plurality of inclined interfaces 30i are gradually embedded in the surface of the first layer 30.

Thereafter, when the c-plane expanded layer 42 is further grown, the inclined interface 40i of the c-plane expanded layer 42 disappears completely, and the concaves 30p composed of the plurality of inclined interfaces 30i on the surface of the first layer 30 are completely embedded. Thereby, the surface of the c-plane expanded layer 42 becomes a mirror surface (flat surface) composed only of the c-plane 40c.

At this time, the dislocation density can be lowered by locally collecting dislocations during the growth process of the first layer 30 and the c-plane expanded layer 42. Specifically, the dislocations that bend and propagate in the direction inclined with respect to the c-axis in the first layer 30 continue to propagate in the same direction in the c-plane expanded layer 42. Thereby, the dislocations are collected locally at a meeting part of the adjacent inclined interfaces 40i in the upper part of the center of the c-plane expanded layer 42 between the pair of tops 30t. Of the plurality of dislocations collected at the meeting part of the adjacent inclined interface 40i of the c-plane expanded layer 42, the dislocations having Burgers vectors opposite to each other, disappear at the meeting. Further, some of the dislocations collected at the meeting part of the adjacent inclined interfaces 40i form a loop, and the propagation in the direction along the c-axis (that is, toward the surface side of the c-plane expanded layer 42) is suppressed. The other part of the plurality of dislocations collected at the meeting part of the adjacent inclined interfaces 40i of the c-plane expanded layer 42, changes its propagation direction again from the direction inclined with respect to the c-axis to the direction along the c-axis, and propagates to the surface side of the second layer 40. In this way, by making some of the plurality of dislocations disappear and suppressing the propagation of some of the plurality of dislocations to the surface side of the c-plane expanded layer 42, the dislocation density in the surface of the second layer 40 can be lowered. Further, by collecting the dislocations locally, a low dislocation density region can be formed in the upper side of a portion of the second layer 40 in which the dislocations propagate in the direction inclined with respect to the c-axis.

Further, at this time, since the c-plane 40c gradually expands in the c-plane expanded layer 42, a second c-plane growth region 80 that has grown with the c-plane 40c as a growth surface, which will be described later, is formed while gradually expanding toward the upper side in the thickness direction.

On the other hand, in the c-plane expanded layer 42, as the inclined interface 40i gradually contracts, the inclined interface growth region 70 gradually contracts toward the upper side in the thickness direction, and terminates at a predetermined position in the thickness direction. Due to the growth process of the c-plane expanded layer 42 as described above, the valley 70a of the inclined interface growth region 70 is formed at a position where the c-plane 40c is generated again, in a cross-sectional view. Further, in the process of gradually embedding the concave formed by the inclined interface 40i, a mountain 70b of the inclined interface growth region 70 is formed at a position where the inclined interface 40i disappears, in a cross-sectional view.

In the c-plane expansion step S320, the surface of the c-plane expanded layer 42 is a mirror surface composed only of the c-plane 40c, and therefore the height of the c-plane expanded layer 42 in the thickness direction (maximum height in the thickness direction) is, for example, greater than or equal to the height from the valley 30v to the top 30t of the inclined interface maintenance layer 34.

(S340: Main Growth Step (c-Plane Growth Step))

When the inclined interface 40i disappears in the c-plane expanded layer 42 and the surface is mirror-finished, as illustrated in FIG. 6(a), a main growth layer 44 is formed on the c-plane expanded layer 42 over a predetermined thickness with the c-plane 40c as a growth surface. Thereby, the main growth layer 44 having only the c-plane 40c on the surface without having the inclined interface 40i, is formed.

At this time, the growth condition in the main growth step S340 is maintained under the above-described second growth condition, in the same manner as in the c-plane expansion step S320. Thereby, the main growth layer 44 can be step-flow-grown with the c-plane 40c as a growth surface.

Further, at this time, a radius of curvature of the c-plane 40c of the growth layer 44 can be larger than a radius of curvature of the c-plane 10c of the base substrate 10. Thereby, a variation in the off-angle of the c-axis with respect to the normal of the surface of the main growth layer 44 can be smaller than the variation in the off-angle of the c-axis 10ca with respect to the normal of the main surface 10s of the base substrate 10.

Further, at this time, by growing the main growth layer 44 with only the c-plane 40c as a growth surface without exposing the inclined interface 40i, a second c-plane growth region 80, which will be described later, is formed over an entire growth layer 44.

In the main growth step S340, a thickness of the main growth layer 44 is, for example, 300 μm or more and 10 mm or less. Since the thickness of the main growth layer 44 is 300 μm or more, at least one or more substrates 50 can be sliced from the main growth layer 44 in the slicing step S400 described later. On the other hand, since the thickness of the main growth layer 44 is 10 mm, at least ten substrates 50 can be obtained when a final thickness is 650 μm, and 700 μm-thick substrate 50 is sliced from the main growth layer 44, even if the karfloss of about 200 μm is taken into consideration.

By the above second step S300, the second layer 40 having the c-plane expanded layer 42 and the main growth layer 44 is formed. As a result, a laminated structure 90 of the present embodiment is formed.

The above steps from the initial step S190, the first step S200 to the second step S300, are continuously performed in the same chamber without exposing the base substrate 10 to the atmosphere. Thereby, it is possible to suppress a formation of an unintended high oxygen concentration region (a region having an oxygen concentration excessively higher than the inclined interface growth region 70), at an interface between the first layer 30 and the second layer 40.

(S400: Slicing Step)

Figure 6B:
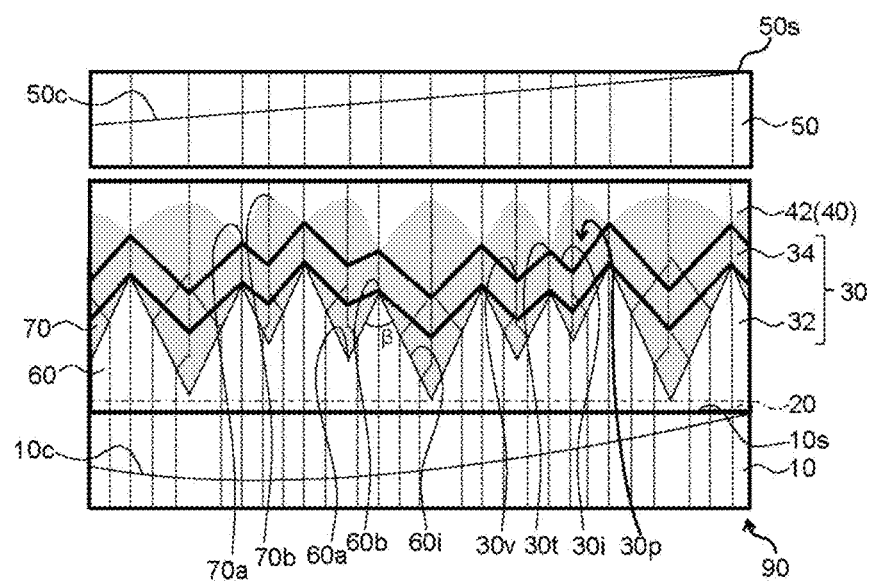

Next, as illustrated in FIG. 6(b), for example, the main growth layer 44 is sliced by a wire saw along a cut surface substantially parallel to the surface of the main growth layer 44. Thereby, at least one nitride semiconductor substrate 50 (also referred to as a substrate 50) as an as-sliced substrate is formed. At this time, the thickness of the substrate 50 is, for example, 300 μm or more and 700 μm or less.

At this time, the radius of curvature of the c-plane 50c of the substrate 50 can be larger than the radius of curvature of the c-plane 10c of the substrate 10. Also, at this time, the radius of curvature of the c-plane 50c of the substrate 50 can be larger than the radius of curvature of the c-plane 40c of the main growth layer 44 before slicing. Thereby, the variation in the off-angle θ of the c-axis 50ca with respect to the normal of the main surface 50s of the substrate 50 can be smaller than the variation in the off-angle of the c-axis 10ca of the substrate 10.

(S500: Polishing Step)

Next, both sides of the substrate 50 are polished by a polishing device. At this time, the thickness of the final substrate 50 is, for example, 250 μm or more and 650 μm or less.

The substrate 50 according to the present embodiment is manufactured by the above steps S100 to S500.

(A Step of Preparing a Semiconductor Laminate and a Step of Preparing a Semiconductor Device)

After the substrate 50 is manufactured, for example, a semiconductor functional layer including a group III nitride semiconductor is epitaxially grown on the substrate 50 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, a laminated structure 90 according to the present embodiment will be described with reference to FIG. 6(a).

The laminated structure 90 of the present embodiment has, for example, a base substrate 10, an initial layer 20, a first layer 30, and a second layer 40.

The initial layer 20 is a layer in which a single crystal of a group III nitride semiconductor is epitaxially grown directly on the main surface 10s of the base substrate 10 with the c-plane as a growth surface. Thereby, an entire body of the initial layer 20 is configured as an initial c-plane growth region (initial low oxygen concentration region, substrate side low oxygen concentration region). The oxygen concentration in the initial layer 20 is lower than the oxygen concentration in the inclined interface growth region 70, as in the first c-plane growth region 60 described later. The oxygen concentration in the initial layer 20 is, for example, $5\times10^{16}$ cm$^{-3}$ or less, preferably $3\times10^{16}$ cm$^{-3}$ or less.

The first layer 30 grows on, for example, the initial layer 20.

The first layer 30 has, for example, a plurality of valleys 30v and a plurality of tops 30t on the top surface 30u of a single crystal of a group III nitride semiconductor, the valleys 30v and tops 30t being formed by forming a plurality of concaves 30p composed of the inclined interfaces 30i other than the c-plane and making the c-plane 30c disappear. When observing an arbitrary cross section perpendicular to the main surface of the base substrate 10, an average distance between the closest tops is, for example, more than 100 μm.

Further, the first layer 30 includes, for example, a first c-plane growth region (first low oxygen concentration region) 60 and an inclined interface growth region (high oxygen concentration region) 70 based on a difference of the growth surface in the growth process.

The first c-plane growth region 60 is a region that has grown with the c-plane 30c as a growth surface. The first c-plane growth region 60 has, for example, a plurality of valleys 60a and a plurality of mountains 60b in a cross-sectional view. Each of the valleys 60a and the mountains 60b referred to herein, means a part of a shape observed based on the difference of emission intensity when the cross section of the laminated structure 90 is observed using a fluorescence microscope or the like, and does not mean a part of an outermost surface shape generated during the growth of the first layer 30. Each of the plurality of valleys 60a is an inflection point that is convex downward in the first c-plane growth region 60 in a cross-sectional view, and is formed at a position where the inclined interface 30i is generated. At least one of the plurality of valleys 60a is provided at a position separated upward from the main surface 10s of the base substrate 10. On the other hand, each of the plurality of mountains 60b is an inflection point that is convex upward in the first c-plane growth region 60 in a cross-sectional view, and is formed at a position where the c-plane 30c disappears (finally) and terminates, between a pair of inclined interfaces 30i that expand in opposite directions. The valleys 60a and the mountains 60b are formed alternately in a direction along the main surface 10s of the base substrate 10.

When observing an arbitrary cross section perpendicular to the main surface 10s of the base substrate 10, an average distance between the pair of mountains 60b separated in the direction along the main surface 10s of the substrate 10 corresponds to an average distance L between the closest tops of the first layer 30 described above, and is, for example, more than 100 the pair of mountains 60b being closest to each other among the plurality of mountains 60b, with one of the plurality of valleys 60a sandwiched between them.

The first c-plane growth region 60 has a pair of inclined portions 60i provided as a locus of an intersection between the c-plane 30c and the inclined interface 30i, on both sides interposing one of the plurality of mountains 60b. The inclined portion 60i referred to herein means a part of the shape observed based on the difference of emission intensity when the cross section of the laminated structure 90 is observed using a fluorescence microscope or the like, and does not mean the inclined interface 30i on the outermost surface that generates during the growth of the first layer 30.

An angle β formed by the pair of inclined portions 60i is, for example, 70° or less, preferably 20° or more and 65° or less, in a cross-sectional view.

The above matter: the angle β formed by the pair of inclined portions 60i is 70° or less, means that the ratio $G_{c1}/G_i$ is high, which is the ratio of the growth rate $G_{c1}$ of the c-plane 30c of the first layer 30 to the growth rate $G_i$ of the inclined interface 30i most inclined with respect to the c-plane 30c of the first layer 30. Thereby, the inclined interface 30*i* other than the c-plane can be easily generated. As a result, the dislocations can be easily bent at a position where the inclined interface 30*i* is exposed. Further, since the angle β formed by the pair of inclined portions 60*i* is 70° or less, a plurality of valleys 30*v* and a plurality of tops 30*t* can be easily generated in the upper part of the main surface 10*s* of the base substrate 10. Further, since the angle β formed by the pair of inclined portions 60*i* is 65° or less, the inclined interface 30*i* other than the c-plane can be more easily generated, and a plurality of valleys 30*v* and a plurality of tops 30*t* can be more easily generated in the upper part of the main surface 10*s* of the base substrate 10. Also, since the angle θ formed by the pair of inclined portions 60*i* is 20° or more, the height from the valley 30*v* to the top 30*t* of the first layer 30 is prevented from increasing, and the thickness until the second layer 40 is mirror-finished, is prevented from increasing.

On the other hand, the inclined interface growth region 70 is a region grown with the inclined interface 30*i* other than the c-plane as a growth surface. A lower surface of the inclined interface growth region 70 is formed, for example, following the shape of the first c-plane growth region 60. The inclined interface growth region 70 is continuously provided along the main surface of the base substrate 10.

In the inclined interface growth region 70, oxygen is easily taken in as compared with the first c-plane growth region 60. Therefore, the oxygen concentration in the inclined interface growth region 70 is higher than the oxygen concentration in the first c-plane growth region 60. The oxygen taken into the inclined interface growth region 70, is, for example, the oxygen unintentionally mixed in a vapor phase growth apparatus, or the oxygen released from a member (quartz member or the like) constituting the vapor phase growth apparatus, or the like.

The oxygen concentration in the first c-plane growth region 60 is, for example, $5 \times 10^{16}$ $cm^{-3}$ or less, preferably $3 \times 10^{16}$ $cm^{-3}$ or less. On the other hand, the oxygen concentration in the inclined interface growth region 70 is, for example, $9 \times 10^{17}$ $cm^{-3}$ or more and $5 \times 10^{19}$ $cm^{-3}$ or less.

The second layer 40 has, for example, the inclined interface growth region (high oxygen concentration region) 70 and the second c-plane growth region (second low oxygen concentration region) 80 based on a difference of the growth surface in the growth process.

The top surface of the inclined interface growth region 70 in the second layer 40 has, for example, a plurality of valleys 70*a* and a plurality of mountains 70*b* in a cross-sectional view. Each of the valleys 70*a* and the mountains 70*b* referred to herein, means a part of the shape observed based on the difference of emission intensity when the cross section of the laminated structure 90 is observed using a fluorescence microscope or the like, and does not mean a part of the outermost surface shape that generates during the growth of the second layer 40. As described above, the plurality of valleys 70*a* of the inclined interface growth region 70 are formed at positions where the c-plane 40*c* is generated again, in the cross-sectional view. Further, the plurality of valleys 70*a* of the inclined interface growth region 70 are formed at the upper part of the plurality of mountains 60*b* of the first c-plane growth region 60, respectively, in a cross-sectional view. On the other hand, as described above, the plurality of mountains 70*b* of the inclined interface growth region 70 are formed at a position where the inclined interface 40*i* disappears and terminates, in a cross-sectional view. Further, the plurality of mountains 70*b* of the inclined interface growth region 70 are formed at the upper part of the plurality of valleys 60*a* of the first c-plane growth region 60, respectively, in a cross-sectional view.

Further, a surface of the second layer 40, which is substantially parallel to the main surface 10*s* of the base substrate 10 at an upper end of the inclined interface growth region 70 is formed as a boundary surface 40*b* at a position where the inclined interface 40*i* of the second layer 40 disappears and terminates.

The second c-plane growth region 80 is a region that has grown with the c-plane 40*c* as a growth surface. In the second c-plane growth region 80, oxygen uptake is suppressed as compared with the inclined interface growth region 70. Therefore, the oxygen concentration in the second c-plane growth region 80 is lower than the oxygen concentration in the inclined interface growth region 70. The oxygen concentration in the second c-plane growth region 80 is, for example, $5 \times 10^{16}$ $cm^{-3}$ or less, preferably $3 \times 10^{16}$ $cm^{-3}$ or less.

In the present embodiment, in the growth process of the first layer 30, the dislocations bend and propagate in a direction substantially perpendicular to the inclined interface 30*i* at a position where the inclined interface 30*i* other than the c-plane is exposed. Thereby, in the second layer 40, some of the plurality of dislocations disappear, and some of the plurality of dislocations are suppressed from propagating to the surface side of the c-plane expanded layer 42. Thereby, the dislocation density in the surface of the second layer 40 is lower than the dislocation density in the main surface 10*s* of the base substrate 10.

Further, in the present embodiment, the dislocation density in the surface of the second layer 40 is sharply reduced in a thickness direction.

Here, the dislocation density in the main surface 10*s* of the base substrate 10 is $N_0$, and the dislocation density in the boundary surface 40*b* at the position where the inclined interface 40*i* disappears in the second layer 40, is N. Also, an average dislocation density in the boundary surface 40*b* is N. On the other hand, when the crystal layer of a group III nitride semiconductor is epitaxially grown on the main surface 10*s* of the base substrate 10 to a thickness equal to the thickness from the main surface to the boundary surface 40*b* of the base substrate 10 of the present embodiment, with only the c-plane as a growth surface (hereinafter, it is also referred to as "in the case of c-plane limited growth"), the dislocation density in the surface of the crystal layer is N'.

In the case of the c-plane limited growth, the dislocation density in the surface of the crystal layer tended to be inversely proportional to the thickness of the crystal layer. Specifically, in the case of the c-plane limited growth, when the thickness of the crystal layer is 1.5 mm, a reduction rate of the dislocation density obtained by $N'/N_0$ is about 0.6.

In contrast, in the present embodiment, the reduction rate of the dislocation density obtained by $N/N_0$ is smaller than, for example, the reduction rate of the dislocation density obtained by $N'/N_0$ in the case of the c-plane limited growth.

Specifically, in the present embodiment, the thickness of the boundary surface 40*b* at the position where the inclined interface 40*i* disappears in the second layer 40 from the main surface 10*s* of the base substrate 10 is, for example, 1.5 mm or less, preferably 1.2 mm or less. Further, in the present embodiment, the reduction rate of the dislocation density obtained by $N/N_0$ described above is, for example, 0.3 or less, preferably 0.23 or less, and more preferably 0.15 or less.

In the present embodiment, a lower limit of the thickness of the base substrate 10 from the main surface 10*s* to the boundary surface 40b is not limited, because the thinner, the better. However, in the first step S200 and the second step S300, the thickness of the base substrate 10 from the main surface 10s to the boundary surface 40b is, for example, more than 200 in consideration of the process from the generation of the inclined interface 30i to the disappearance of the inclined interface 40i.

Further, in the present embodiment, a lower limit of the reduction rate of the dislocation density is not limited, because the smaller, the better. However, the reduction rate of the dislocation density is, for example, 0.01 or more, in consideration of the matter that the thickness from the main surface 10s of the base substrate 10 to the boundary surface 40b is 1.5 mm or less.

In addition, in the present embodiment, an entire surface of the second layer 40 is composed of +c plane, and the first layer 30 and the second layer 40 do not include a polarity reversal zone (inversion domain), respectively. In this respect, the laminated structure 90 of the present embodiment is different from a laminated structure formed by a so-called DEEP (Dislocation Elimination by the Epitaxial-growth with inverse-pyramidal Pits) method, that is, different from a laminated structure including the polarity reversal zone in a core located in the center of a pit.

(3) Nitride Semiconductor Substrate (Nitride Semiconductor Free-Standing Substrate, Nitride Crystal Substrate)

Figure 9A:
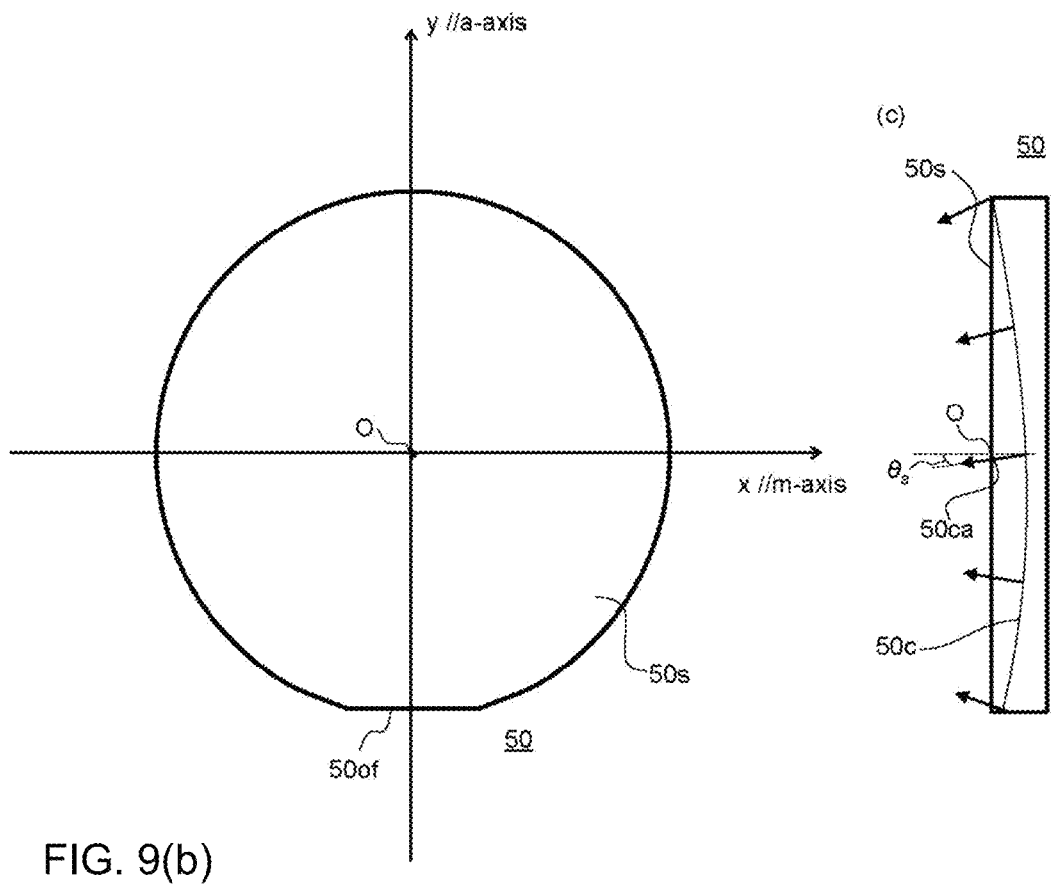
FIG. 9(a) is a schematic top view illustrating a nitride semiconductor substrate according to an embodiment of the present disclosure, (b) is a schematic cross-sectional view taken along m-axis of the nitride semiconductor substrate according to an embodiment of the present disclosure, and (c) is a schematic cross-sectional view taken along a-axis of the nitride semiconductor substrate according to an embodiment of the present disclosure.

Next, a nitride semiconductor substrate 50 according to the present embodiment will be described with reference to FIG. 9. FIG. 9(a) is a schematic top view illustrating a nitride semiconductor substrate according to the present embodiment, (b) is a schematic cross-sectional view taken along the m-axis of the nitride semiconductor substrate according to the present embodiment, and (c) is a schematic cross-sectional view taken along the a-axis of the nitride semiconductor substrate according to the present embodiment. A direction along the m-axis is an x-direction, and a direction along the a-axis is a y-direction.

In the present embodiment, the substrate 50 obtained by slicing the second layer 40 by the above-described manufacturing method is, for example, a free-standing substrate comprising a single crystal of a group III nitride semiconductor. In the present embodiment, the substrate 50 is, for example, a GaN free-standing substrate.

A diameter of the substrate 50 is, for example, 2 inches or more. A thickness of the substrate 50 is, for example, 300 µm or more and 1 mm or less.

A conductivity of the substrate 50 is not particularly limited, but when manufacturing a semiconductor device as a vertical Schottky barrier diode (SBD) using the substrate 50, the substrate 50 is, for example, n-type, and n-type impurities in the substrate 50 are, for example, Si or germanium (Ge), and n-type impurities concentration in the substrate 50 is, for example, $1.0 \times 10^{18}$ cm$^{-3}$ or more and $1.0 \times 10^{20}$ cm$^{-3}$ or less.

The substrate 50 has, for example, a main surface 50s which is an epitaxial growth surface. In the present embodiment, a lowest index crystal plane closest to the main surface 50s is, for example, the c-plane 50c.

The main surface 50s of the substrate 50 is mirror-finished, for example, and a root mean square roughness RMS of the main surface 50s of the substrate 50 is, for example, less than 1 nm.

Further, in the present embodiment, the impurity concentration in the substrate 50 obtained by the above-described manufacturing method is lower than that of the substrate obtained by a flux method, an ammonothermal method, or the like.

Specifically, a hydrogen concentration in the substrate 50 is, for example, less than $1 \times 10^{17}$ cm$^{-3}$, preferably $5 \times 10^{16}$ cm$^{-3}$ or less.

Further, in the present embodiment, the substrate 50 is formed by slicing the main growth layer 44 grown with the c-plane 40c as a growth surface, and therefore does not include the inclined interface growth region 70 grown with the inclined interface 30i or the inclined interface 40i as a growth surface. That is, the entire body of the substrate 50 is configured by a low oxygen concentration region.

Specifically, an oxygen concentration in the substrate 50 is, for example, $5 \times 10^{16}$ cm$^{-3}$ or less, preferably $3 \times 10^{16}$ cm$^{-3}$ or less.

Further, in the present embodiment, the substrate 50 does not include, for example, the polarity reversal zone (inversion domain) as described above.

(Curvature of c-Plane and Variation in Off-Angle)

Figure 9B:
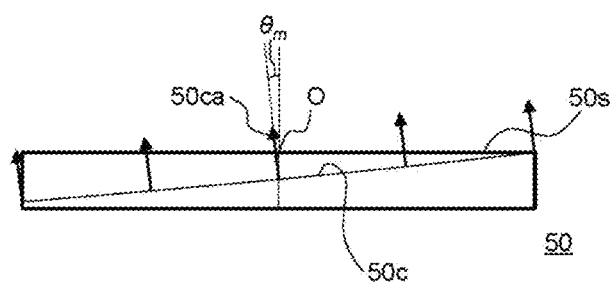

As illustrated in FIGS. 9(b) and 9(c), in the present embodiment, the c-plane 50c as a lowest index crystal plane closest to the main surface 50s of the substrate 50 is curved in a concave spherical shape with respect to the main surface 50s, due to, for example, the above-described method for manufacturing the substrate 50.

In the present embodiment, the c-plane 50c of the substrate 50 has, for example, a curved surface that approximates a spherical surface in each of a cross section along the m-axis and a cross-section along the a-axis.

In the present embodiment, since the c-plane 50f of the substrate 50 is curved like a concave spherical surface as described above, at least a part of the c-axis 50ca is inclined with respect to the normal of the main surface 50s. The off-angle θ, which is the angle formed by the c-axis 50ca with respect to the normal of the main surface 50s, has a predetermined distribution within the main surface 50s.

In the off-angle θ formed by the c-axis 50ca with respect to the normal of the main surface 50s, a directional component along the m-axis is "θw", and a directional component along the a-axis is "$θ_a$", and $θ^2=θ_m^2+θ_a^2$ is satisfied.

In the present embodiment, since the c-plane 50c of the substrate 50 is curved like a concave spherical surface as described above, the off-angle m-axis component $θ_m$ and the off-angle a-axis component $θ_a$ can be approximately represented by a linear function of x and a linear function of y, respectively.

In the present embodiment, a radius of curvature of the c-plane 50c of the substrate 50 is larger than, for example, a radius of curvature of the c-plane 10c in the base substrate 10 which is used in the above-described method for manufacturing the substrate 50.

Specifically, the radius of curvature of the c-plane 50c of the substrate 50 is, for example, 23 m or more, preferably 30 m or more, and more preferably 40 m or more.

For a reference, in the case of the c-plane limited growth, the radius of curvature of the c-plane of the substrate sliced from the crystal layer having the same thickness as a total thickness of the first layer 30 and the second layer 40 of the present embodiment may be larger than the radius of curvature of the c-plane 10c in the base substrate 10. However, in the case of the c-plane limited growth, the radius of curvature of the c-plane of the substrate sliced from the crystal layer is about 11 m when the thickness of the crystal layer is 2 mm, and is about 1.4 times the radius of curvature of the c-plane 10c in the base substrate 10.

In the present embodiment, an upper limit of the radius of curvature of the c-plane 50c of the substrate 50 is not particularly limited, because the larger, the better. When the c-plane 50c of the substrate 50 is substantially flat, it may be considered that the radius of curvature of the c-plane 50c is infinite.

Further, in the present embodiment, since the radius of curvature of the c-plane 50c of the substrate 50 is large, the variation in the off-angle θ of the c-axis 50ca with respect to the normal of the main surface 50s of the substrate 50 can be smaller than the variation in the off-angle of the c-axis 10ca of the substrate 10.

Specifically, when the X-ray locking curve of the (0002) plane of the substrate 50 is measured and the off-angle θ of the c-axis 50ca with respect to the normal of the main plane 50s is measured based on a diffraction peak angle of the (0002) plane, the variation obtained by the difference between maximum and minimum in the size of the off-angle θ within a diameter of 29.6 mm from the center of the main surface 50s is, for example, 0.075° or less, preferably 0.057° or less, and more preferably 0.043° or less.

For a reference, in the base substrate 10 prepared by the above-described VAS method, the variation in the off-angle of the c-axis 10ca obtained by the above-described measurement method is about 0.22°. Further, in the case of the c-plane limited growth, when a thickness of the crystal layer is the same as a total thickness of the first layer 30 and the second layer 40 of the present embodiment (for example, 2 mm), the variation in the off-angle of the c-axis obtained by the above-described measuring method is about 0.15° in the nitride semiconductor substrate obtained from the crystal layer.

In the present embodiment, a lower limit of the variation in the off-angle θ of the c-axis 50ca of the substrate 50 is not particularly limited, because the smaller, the better. When the c-plane 50c of the substrate 50 is substantially flat, it may be considered that the variation in the off-angle θ of the c-axis 50ca of the substrate 50 is 0°.

Further, in the present embodiment, since the curvature of the c-plane 50c is isotropically small with respect to the main surface 50s of the substrate 50, the radius of curvature of the c-plane 50c has little direction dependence.

Specifically, the difference between the radius of curvature of the c-plane 50c in the direction along the a-axis and the radius of curvature of the c-plane 50c in the direction along the m-axis obtained by the above-described measurement method is, for example, 50% or less, preferably 20% or less of the larger radius of curvature.

(Dark Spot)

Next, a dark spot on the main surface 50s of the substrate 50 of the present embodiment will be described. The "dark spot" referred to herein means a point where an emission intensity is low in an observation image of the main surface 50s observed using a multiphoton excitation microscope, or a cathode luminescence image of the main surface 50s, and includes not only dislocations but also non-emissive centers due to foreign matters or point defects. The "multiphoton excitation microscope" is sometimes referred to as a multiphoton excitation fluorescence microscope.

In the present embodiment, since the substrate 50 is manufactured using the base substrate 10 comprising a high-purity GaN single crystal prepared by the VAS method, there are few non-emission centers in the substrate 50 due to foreign matters or point defects. Accordingly, when the main surface of the substrate 50 is observed using a multi-photon excitation microscope or the like, 95% or more, preferably 99% or more of the dark spots are dislocations rather than non-emission centers due to foreign matters or point defects.

Further, in the present embodiment, by the above-described manufacturing method, the dislocation density in the surface of the second layer 40 is lower than the dislocation density in the main surface 10s of the base substrate 10. Thereby, the dislocations are also lowered in the main surface 50s of the substrate 50 formed by slicing the second layer 40.

Further, in the present embodiment, since the initial step S190, the first step S200, and the second step S300 are performed by the above-described manufacturing method using the base substrate 10 in an unprocessed state, regions with high dislocation density due to the concentration of dislocations are not formed, and regions with low dislocation density are uniformly formed on the main surface 50s of the substrate 50 formed by slicing the second layer 40.

Specifically, in the present embodiment, observation of the main surface 50s of the substrate 50 using the multiphoton excitation microscope in a field of view of 250 μm square to obtain a dislocation density from a dark spot density, reveals that the dislocation density is less than $1 \times 10^6$ cm$^{-2}$ over 95% or more, preferably 99% or more, more preferably 100% of the main surface 50s. Even if there is a region having a dislocation density of $1 \times 10^6$ cm$^{-2}$ or more, the dislocation density of the region is $3 \times 10^6$ cm$^{-2}$ or less.

In other words, in the present embodiment, the dislocation density obtained by averaging an entire main surface 50s of the substrate 50 is, for example, less than $1 \times 10^6$ cm$^{-2}$, preferably less than $5.5 \times 10^5$ cm$^{-2}$ and more preferably $3 \times 10^5$ cm$^{-2}$ or less.

Further, the main surface 50s of the substrate 50 of the present embodiment includes, for example, a dislocation-free region of at least 50 μm square based on an average distance L between the closest tops in the first step S200 described above. Further, 50 μm square dislocation-free regions are scattered over the entire main surface 50s of the substrate 50, for example. Further, the main surface 50s of the substrate 50 of the present embodiment includes, for example, 50 μm square dislocation-free regions that do not overlap at a density of 100/cm$^2$ or more, preferably 800/cm$^2$ or more, and more preferably 1600/cm$^2$ or more. When the density of the 50 μm square dislocation-free regions that do not overlap is 1600/cm$^2$ or more, for example, it corresponds to a case where the main surface 50s includes at least one 50 μm square dislocation-free regions in an arbitrary field of view of 250 μm square.

An upper limit of the density of the 50 μm square dislocation-free regions that do not overlap is 40,000/cm$^2$ based on the measurement method.

For a reference, in a substrate obtained by a conventional manufacturing method that does not perform a special process of collecting dislocations, the size of the dislocation-free region is smaller than 50 μm square, or the density of the 50 μm square dislocation-free region is lower than 100/cm$^2$.

Next, Burgers vector of the dislocations in the substrate 50 of the present embodiment will be described.

In the present embodiment, since the dislocation density in the main surface 10s of the base substrate 10 used in the above-described manufacturing method is low, a plurality of dislocations are less likely to be combined (mixed) when the first layer 30 and the second layer 40 are grown on the base substrate 10. This makes it possible to suppress the formation of dislocations having a large Burgers vector in the substrate 50 obtained from the second layer 40.

Specifically, in the substrate 50 of the present embodiment, for example, there are many dislocations whose Burgers vector is either <11-20>/3, <0001>, or <11-23>/3. The "Burgers vector" herein can be measured by, for example, a large-angle convergent-beam electron diffraction method (LACBED method) using a transmission electron microscope (TEM). Further, dislocations whose Burgers vector is <11-20>/3 are edge dislocations, and dislocations whose Burgers vector is <0001> are screw dislocations, and dislocations whose Burgers vector is <11-23>/3 are mixed dislocations in which edge dislocations and screw dislocations are mixed.

In the present embodiment, random extraction of 100 dislocations on the main surface 50s of the substrate 50 reveals that a percentage of dislocations whose Burgers vector is either <11-20>/3, <0001> or <11-23>/3, is, for example, 50% or more, preferably 70% or more, and more preferably 90% or more. Dislocations whose Burgers vector is 2 <11-20>/3 or <11-20> may be present in at least a part of the main surface 50s of the substrate 50.

(Regarding X-Ray Locking Curve Measurement with a Different Slit Width)

Here, the inventors found that by measuring the X-ray locking curve with a different slit width on an incident side, both the crystal quality factor constituting the substrate 50 of the present embodiment and the curvature (warp) of the c-plane 50c described above can be evaluated at the same time.

First, an influence of a crystal quality factor on the X-ray locking curve measurement will be described.

A full width at half maximum of a diffraction pattern in the X-ray locking curve measurement is greatly affected by crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration. When these crystal quality factors are not good, a fluctuation of a diffraction angle in the X-ray locking curve measurement becomes large, and the full width at half maximum of the diffraction pattern becomes large.

Figure 10A:
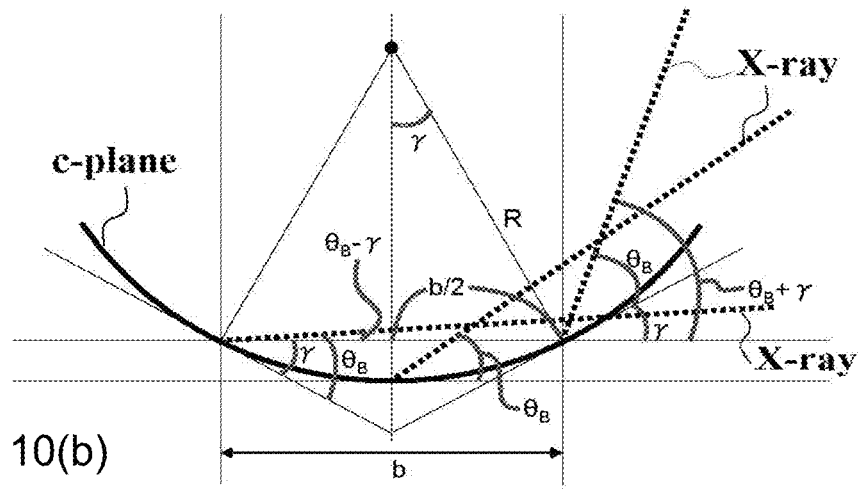
FIG. 10(a) is a schematic cross-sectional view illustrating X-ray diffraction with respect to a curved c-plane, and (b) and (c) are views illustrating a fluctuation of a diffraction angle of a (0002) plane with respect to a radius of curvature of the c-plane.

Next, an influence of the curvature of the c-plane 50c in the X-ray locking curve measurement will be described with reference to FIG. 10(a). FIG. 10(a) is a schematic cross-sectional view illustrating a diffraction of X-rays with respect to the curved c-plane.

The X-ray irradiation width b on the main surface of the substrate is calculated by the following formula (h).

$$b = a/\sin \theta_B \quad \text{(h)}$$

wherein a width of a slit at the incident side of the X-ray is a, an X-ray irradiation width (footprint) irradiated on the main surface of the substrate is b, and a crystal Bragg angle is $\theta_B$.

As illustrated in in FIG. 10(a), when the c-plane of the substrate is curved, the radius of curvature R of the c-plane is very large with respect to the X-ray irradiation width b, wherein the radius of curvature of the c-plane is R and half of the central angle formed by the curved c-plane is γ in a range of the X-ray irradiation width b. Therefore, the angle γ can be obtained by the following equation (i).

$$\gamma = \sin^{-1}(b/2R) \approx b/2R \quad \text{(i)}$$

At this time, at the incident side end (right end in the figure) of the region on the c-plane of the substrate irradiated with X-rays, the diffraction angle with respect to the main surface of the substrate is $\theta_B + \gamma = \theta_B + b/2R$.

On the other hand, at the receiving side end (left end in the figure) of the region on the c-plane of the substrate irradiated with X-rays, the diffraction angle with respect to the main surface of the substrate is $\theta_B - \gamma = \theta_B - b/2R$.

Accordingly, based on the difference between the diffraction angle with respect to the main surface of the substrate at the incident side end on the c-plane of the substrate and the diffraction angle with respect to the main surface of the substrate at the light receiving side end on the c-plane of the substrate, the fluctuation of the X-ray diffraction angle with respect to the curved c-plane is b/R.

Figure 10B:
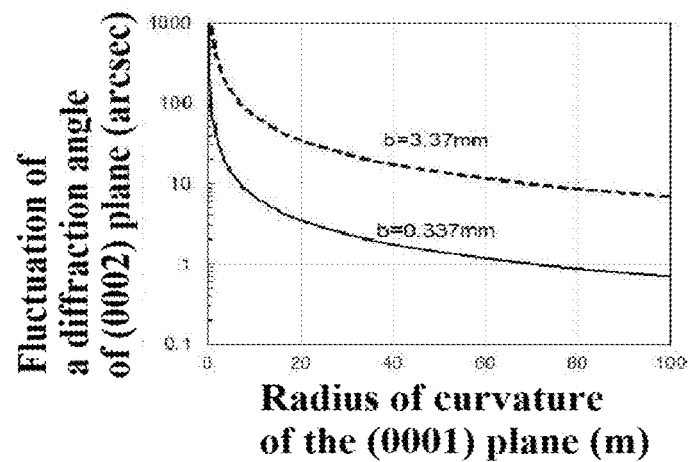
Figure 10C:
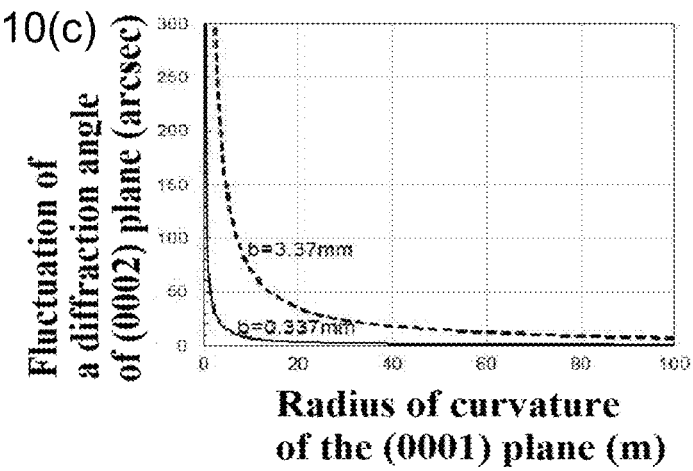

FIGS. 10(b) and 10(c) are views illustrating the fluctuation of the diffraction angle of the (0002) plane with respect to the radius of curvature of the c plane. The vertical axis of FIG. 10(b) is a logarithmic scale, and the vertical axis of FIG. 10(c) is a linear scale.

As illustrated in FIGS. 10(b) and 10(c), when the width a of the slit at the incident side of the X-ray is increased, that is, when the irradiation width b of the X-ray is increased, the fluctuation of the diffraction angle of the (0002) plane increases according to the X-ray irradiation width b. As the radius of curvature R of the c-plane becomes smaller, the fluctuation of the diffraction angle of the (0002) plane gradually increases. The difference in the fluctuation of the diffraction angle of the (0002) plane in the case of different X-ray irradiation width b, becomes larger as the radius of curvature R of the c plane becomes smaller.

When the width a of the slit at the incident side is narrow, the influence of the curvature of the c-plane is small, and the influence of the above-described crystal quality factor becomes dominant in the fluctuation of the diffraction angle of the (0002) plan. However, when the width a of the slit at the incident side is wide, both the influence of the above-described crystal quality factor and the influence of the curvature of the c-plane will be superimposed, in the fluctuation of the diffraction angle of the (0002) plane. Accordingly, when the X-ray locking curve measurement is performed with a different slit width a at the incident side, both the above-described crystal quality factor and the curvature (warp) of the c-plane can be evaluated at the same time over the region irradiated with X-rays.

Here, the features of the substrate 50 of the present embodiment at the time of measuring the X-ray locking curve, will be described.

In the following, in the case where the main surface 50s of the substrate 50 is irradiated with (Cu) Kα1 X-rays through a two-crystal monochromator of Ge (220) plane and a slit to measure the X-ray locking curve of the (0002) plane diffraction, the full width at half maximum of the (0002) plane diffraction is "FWHMa" when a slit width in ω direction is 1 mm, and the full width at half maximum of the (0002) plane diffraction is "FWHMb" when a slit width in ω direction is 0.1 mm. The "ω direction" refers to a rotation direction when the substrate 50 is rotated about an axis parallel to the main surface of the substrate 50 and passing through the center of the substrate 50 in the X-ray locking curve measurement.

In the substrate 50 of the present embodiment, all of the crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration, are good.

As a result, in the substrate 50 of the present embodiment, the X-ray locking curve measurement for the (0002) plane diffraction when the slit width in ω direction is 0.1 mm, reveals that full width at half maximum FWHMb of the (0002) plane diffraction is, for example, 80 arcsec or less, preferably 50 arcsec or less, and more preferably 32 arcsec or less.

Further, in the substrate 50 of the present embodiment, all of the above-described crystal quality factors are good over a wide range of the main surface 50s.

As a result, the X-ray locking curve measurement for the (0002) plane diffraction when the slit width in ω direction is 0.1 mm, at a plurality of measurement points set at intervals of 5 mm (between the center and the outer edge) within the main surface 50s of the substrate 50 of the present embodiment, reveals that full width at half maximum FWHMb of the (0002) plane diffraction is 80 arcsec or less, preferably 50 arcsec or less, and more preferably 32 arcsec or less, at 95% or more, preferably 100% of all measurement points.

Further, in the substrate 50 of the present embodiment, the in-plane variation of the above-described crystal quality factors is small. Therefore, it is found that the diffraction pattern of the (0002) plane when the X-ray locking curve measurement is performed with the slit width at the incident side widened, is less likely to be narrow than the diffraction pattern of the (0002) plane when the X-ray locking curve measurement is performed with the slit width at the incident side narrowed.

As a result, in the substrate 50 of the present embodiment, full width at half maximum FWHMb of the (0002) plane diffraction when a slit width in ω direction is 1 mm, can be, for example, full width at half maximum FWHMb or more of the (0002) plane diffraction when a slit width in ω direction is 0.1 mm.

Even when the crystal quality element of the substrate 50 is good, there is a case of FWHMa<FWHMb, with FWHMb being very small.

Further, in the substrate 50 of the present embodiment, as described above, not only are there few dislocations, but all of the above-described crystal quality factors are well-balanced and good, over a wide range of the main surface 50s. Further, the curvature of the c-plane 50c of the substrate 50 is small, and the radius of curvature of the c-plane 50c is large. Even when the X-ray locking curve is measured by widening the slit width at the incident side in the substrate 50 of the present embodiment, the fluctuation of the diffraction angle of the (0002) plane does not become large, because the above-described crystal quality factors are well-balanced and good, and the radius of curvature of the c-plane is large, over the region irradiated with X-rays. Therefore, even when the X-ray locking curve measurement is performed with a different slit width at the incident side, the difference in the fluctuation of the diffraction angle of the (0002) plane becomes small.

As a result, difference FWHMa-FWHMb obtained by subtracting FWHMb from FWHMa is for example, 30% or less, preferably 22% or less of FWHMa, at a predetermined measurement point (for example, the center of the main surface) of the substrate 50 of the present embodiment, wherein FWHMa is full width at half maximum of the (0002) plane diffraction when a slit width in ω direction is 1 mm, and FWHMb is full width at half maximum of the (0002) plane diffraction when a slit width in ω direction is 0.1 mm.

Further, the X-ray locking curve measurement for the (0002) plane diffraction with a different slit width in ω direction at a plurality of measurement points set at intervals of 5 mm (between the center and the outer edge) within the main surface 50s of the substrate 50 of the present embodiment for example, reveals that FWHMa-FWHMb is, for example, 30% or less, preferably 22% or less of FWHMa at 95% or more, preferably 100% of all measurement points.

In the substrate 50 of the present embodiment, FWHMa−FWHMb/FWHMa is 30% or less, even in the case of FWHMa<FWHMb. Further, in the substrate 50 of the present embodiment, FWHMa may be substantially equal to FWHMb, and |FWHMa−FWHMb|/FWHMa may be 0%.

Further, in the substrate 50 of the present embodiment, even when the X-ray locking curve measurement is performed with a slit width at the incident side widened, the diffraction pattern has a single peak due to the small variation of the above-described crystal quality factors over the region irradiated with X-rays.

For a reference, a substrate manufactured by a conventional manufacturing method (hereinafter, also referred to as a conventional substrate) will be described. The conventional manufacturing methods referred to herein are, for example, a conventional VAS method, a method of growing a thick film using the c-plane as a growth surface, the above-described DEEP method, THVPE (Tri-halide phase epitaxy) method, ammonothermal method, flux method, and the like.

In the conventional substrate, at least one of the crystal quality factors described above is not better than that of the substrate 50 of the present embodiment. Therefore, FWHMb in the conventional substrate is larger than that of the substrate 50 of the present embodiment.

In the conventional substrate, in-plane variability in at least one of the crystal quality factors described above can occur. Therefore, the diffraction pattern of the (0002) plane when the X-ray locking curve measurement is performed with the slit width at the incident side widened, may be wider than the diffraction pattern of the (0002) plane when the X-ray locking curve measurement is performed with the slit width at the incident side narrowed. As a result, in the conventional substrate, FWHMa<FWHMb may be satisfied.

In the conventional substrate, the radius of curvature of the c-plane is smaller than that of the substrate 50 of the present embodiment. When the slit width is widened, at least a part of the region irradiated with X-rays necessarily includes a portion where at least one of the crystal quality factors is not better than that of the substrate 50 of the present embodiment. Therefore, the difference FWHMa-FWHMb in the base substrate 10 is larger than that of the substrate 50 of the present embodiment.

In the conventional substrate, in-plane variability in at least one of the crystal quality factors described above can occur. When the slit width is widened, there may be places where the fluctuation of the diffraction angle is different in at least a part of the region irradiated with X-rays. Therefore, the diffraction pattern may have a plurality of peaks when the slit width is widened.

As described above, the conventional substrate may not satisfy the above-described conditions defined for the substrate 50 of the present embodiment.

(4) Effect Obtained by the Present Embodiment

According to the present embodiment, one or more of the following effects can be obtained.

(a) In the first step S200, since the inclined interface 30i other than the c-plane is generated on the surface of the single crystal constituting the first layer 30, the dislocations can be bent and propagated in a direction substantially perpendicular to the inclined interface 30*i*, at a position where the inclined interface 30*i* is exposed. Thereby, the dislocations can be collected locally. Since the dislocations are collected locally, the dislocations having Burgers vectors that are opposite to each other can disappear. Alternatively, since the locally collected dislocations form a loop, the dislocations can be prevented from propagating to the surface side of the second layer 40. In this way, the dislocation density in the surface of the second layer 40 can be lowered. As a result, it is possible to obtain the substrate 50 having a dislocation density lower than that of the base substrate 10.

(b) As described above, since some of the plurality of dislocations disappears and some of the plurality of dislocations are suppressed from propagating to the surface side of the second layer 40, etc., during the growth process of the second layer 40, the dislocation density can be lowered sharply and faster than in the case of the c-plane limited growth. That is, the reduction rate of the dislocation density obtained by $N/N_0$ in the present embodiment can be made smaller than the reduction rate of the dislocation density obtained by $N'/N_0$ in the case of the c-plane limited growth. As a result, the substrate 50 having a lower dislocation density than that of the base substrate 10 can be efficiently obtained, and its productivity can be improved.

(c) In the first step S200, the c-plane 30*c* disappears from the top surface 30*u* of the first layer 30. Thereby, a plurality of valleys 30*v* and a plurality of tops 30*t* can be formed on the surface of the first layer 30. As a result, the dislocations propagating from the base substrate 10 can be reliably bent at the position where the inclined interface 30*i* in the first layer 30 is exposed.

Here, a case where the c-plane remains in the first step will be considered. In this case, in the portion where the c-plane remains, the dislocations propagated from the base substrate propagate substantially vertically upward without being bent and reach the surface of the second layer. Therefore, in the upper part of the portion where the c-plane remains, dislocations are not lowered and a high dislocation density region is formed.

In contrast, according to the present embodiment, since the c-plane 30*c* disappears from the top surface 30*u* of the first layer 30 in the first step S200, the surface of the first layer 30 can be formed only by the inclined interface 30*i* other than the c-plane, and a plurality of valleys 30*v* and a plurality of tops 30*t* can be formed on the surface of the first layer 30. Thereby, the dislocations propagating from the base substrate 10 can be reliably bent over the entire surface of the first layer 30. Since the dislocations are reliably bent, some of the plurality of dislocations can be easily disappears, or some of the plurality of dislocations is hardly propagated to the surface side of the second layer 40. As a result, the dislocation density can be lowered over the entire main surface is of the substrate 50 obtained from the second layer 40.

(d) In the present embodiment, in the initial step S190, the initial layer 20 is grown directly on the main surface 10*s* of the base substrate 10 with the c-plane as a growth surface. At this time, the growth rate of the initial layer 20 in the initial step S190 is made lower than the growth rate of the first layer 30 in the first step S200. Thereby, the initial layer 20 can be step-flow-grown on the main surface 10*s* of the base substrate 10. Since the initial layer 20 is step-flow-grown, the surface morphology and crystallinity of the initial layer 20 can be made substantially uniform over the entire surface, regardless of a state of the main surface 10*s* of the base substrate 10, even if there is an abnormal part such as a rough part or a part having different crystallinity on a part of the main surface 10*s* of the base substrate 10. Since the surface morphology and crystallinity of the initial layer 20 are substantially uniform, in the first step S200, the state of generation of the inclined interface 30*i*, such as the inclination angle of the inclined interface 30*i* with respect to the c-plane 30*c*, can be made substantially uniform over the entire surface of the first layer 30. Specifically, the formation of a region with a short distance between the closest tops is suppressed in a part of the surface of the first layer 30, and the distance between the closest tops can be made substantially uniform over the entire surface of the first layer 30. As a result, the formation of a region having a high dislocation density is suppressed in a part of the surface of the second layer 40, and the dislocation density can be lowered over the entire surface of the second layer 40.

(e) In the present embodiment, since the above-described initial step S190 is performed and the first growth condition is adjusted so as to satisfy the formula (1) in the first step S200, {11-2m} plane satisfying m 3 can be generated as the inclined interface 30*i* in the first step S200. Thereby, the inclination angle of the {11-2m} plane with respect to the c plane 30*c* can be loose. Specifically, the inclination angle can be 47.3° or less. Since the inclination angle of the {11-2m} plane with respect to the c plane 30*c* is loose, a cycle of the plurality of tops 30*t* can be lengthened. Specifically, the average distance L between the closest tops can be more than 100 μm, when observing an arbitrary cross section perpendicular to the main surface 10*s* of the base substrate 10.

For a reference, usually, when an etch pit is generated in a nitride semiconductor substrate using a predetermined etchant, an etch pit including the {1-10n} plane is formed on the surface of the substrate. In contrast, on the surface of the first layer 30 grown under a predetermined condition in the present embodiment, the {11-2 m} plane satisfying m 3 can be generated. Accordingly, it is considered that the inclined interface 30*i* peculiar to the manufacturing method is formed in the present embodiment as compared with a normal etch pit.

(f) In the present embodiment, when observing an arbitrary cross section perpendicular to the main surface 10*s* of the base substrate 10, since the average distance L between the closest tops is more than 100 μm, at least over 50 μm distance can be secured for bending and propagating the dislocations. Thereby, the dislocations can be sufficiently collected in the upper part of the substantially center between the pair of tops 30*t* of the first layer 30. As a result, the dislocation density in the surface of the second layer 40 can be sufficiently lowered.

(g) In the first step S200, after the c-plane 30*c* disappears from the surface of the first layer 30, the growth of the first layer 30 is continued over a predetermined thickness, while maintaining the state where the surface is composed only of the inclined interface 30*i*. Thereby, the c-plane 30*c* can reliably disappears over the entire surface of the first layer 30. For example, even if the timing is off at which the c-plane 30*c* disappears on the surface of the first layer 30 in the inclined interface expansion step S220 and the c-plane 30*c* remains on a part of the expanded inclined interface layer 32, the c-plane 30*c* can reliably disappear.

Further, due to continuing of the growth of the first layer 30 at the inclined interface 30*i* after the c-plane 30*c* disappears, a sufficient time can be secured to bend the dislocations at the position where the inclined interface 30*i* is exposed. Here, when the c-plane grows immediately after the c-plane disappears, there is a possibility that the dislocations are not sufficiently bent and propagate in the substantially vertical direction toward the surface of the second layer. In contrast, according to the present embodiment, since sufficient time is secured to bend the dislocations at the position where the inclined interface 30i other than the c-plane is exposed, particularly, the dislocations near the top 30t of the first layer 30 can be reliably bent, and the propagation of dislocations in the substantially vertical direction from the base substrate 10 toward the surface of the second layer 40, can be suppressed. Thereby, the concentration of the dislocations in the upper part of the top 30t of the first layer 30 can be suppressed.

(h) According to the manufacturing method of the present embodiment, the radius of curvature of the c-plane 50c of the substrate 50 can be larger than the radius of curvature of the c-plane 10c of the base substrate 10. Thereby, the variation in the off-angle θ of the c-axis 50ca with respect to the normal of the main surface 50s of the substrate 50 can be smaller than the variation in the off-angle of the c-axis 10ca of the substrate 10.

As one of the reasons why the radius of curvature of the c-plane 50c of the substrate 50 can be large, for example, the following reasons can be considered.

As described above, in the first step S200, the inclined interface growth region 70 is formed by three-dimensionally growing the first layer 30 with the inclined interface 30i other than the c-plane as a growth surface. In the inclined interface growth region 70, oxygen is easily taken in as compared with the first c-plane growth region 60. Therefore, the oxygen concentration in the inclined interface growth region 70 is higher than the oxygen concentration in the first c-plane growth region 60. That is, the inclined interface growth region 70 can be considered as a high oxygen concentration region.

As described above, by taking the oxygen into the high oxygen concentration region, the lattice constant of the high oxygen concentration region can be larger than the lattice constant of other regions other than the high oxygen concentration region. (Reference: Chris G. Van de Walle, Physical Review B vol. 68, 165209 (2003)). Due to the curvature of the c-plane 10c of the base substrate 10, stress concentrated toward the center of the curvature of the c-plane is applied on the base substrate 10 or the first c-plane growth region 60 grown with the c-plane 30c or the first layer 30 as a growth surface. In contrast, by relatively increasing the lattice constant in the high oxygen concentration region, a stress can be generated in the high oxygen concentration region so as to spread the c-plane 30c outward in a creepage direction. Thereby, the stress concentrated toward the center of curvature of the c-plane 30c on the lower side of the high oxygen concentration region, and the stress that spreads the c-plane 30c in the high oxygen concentration region outward in the creepage direction, can be offset.

As described above, due to the stress offset effect of the first layer 30, the radius of curvature of the c-plane 50c of the substrate 50 obtained from the second layer 40 can be larger than the radius of curvature of the c-plane 10c of the substrate 10.

(i) In the substrate 50 obtained by the manufacturing method of the present embodiment, the dislocation density can be lowered, and not only can the off-angle variation be reduced, but all of the above-described crystal quality factors that determine the full width at half maximum of the X-ray locking curve measurement can be well-balanced and good. Thereby, in the substrate 50 of the present embodiment, FWHMb can be 32 arcsec or less. Further, in the substrate 50 of the present embodiment, the radius of curvature of the c-plane is large, and the above-described crystal quality factors are well-balanced and good over the entire region irradiated with X-rays, even when the slit width is 1 mm. Therefore, (FWHMa-FWHMb)/FWHMa can be 30% or less.

OTHER EMBODIMENTS

As described above, the embodiments of the present disclosure have been specifically described. However, the present disclosure is not limited to the above-described embodiments, and various modifications can be made without departing from the gist thereof.

In the above-described embodiment, explanation is given for the case where the base substrate 10 is a GaN free-standing substrate. However, the base substrate 10 is not limited to the GaN free-standing substrate, and for example, may be a free-standing substrate comprising a group III nitride semiconductor such as aluminum Nitride (AlN), indium gallium nitride (AlGaN), indium nitride (InN), indium gallium nitride (InGaN), indium gallium nitride (AlInGaN), that is, a free-standing substrate comprising a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation is given for the case where the substrate 50 is a GaN free-standing substrate. However, the substrate 50 is not limited to the GaN free-standing substrate, and for example, may be a free-standing substrate comprising a group III nitride semiconductor such as AlN, AlGaN, InN, InGaN, AlInGaN, that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation is given for the case where the substrate 50 is n-type. However, the substrate 50 may be p-type or may have semi-insulating properties. For example, when manufacturing a semiconductor device as a high electron mobility transistor (HEMT) using the substrate 50, the substrate 50 preferably has semi-insulating properties.

In the above-described embodiment, explanation is given for the case where the growth temperature is mainly adjusted as the first growth condition in the first step S200. However, when the first growth condition satisfies the formula (1), the growth condition other than the growth temperature may be adjusted, or the growth temperature and the growth condition other than the growth temperature may be adjusted in combination, as a first growth condition.

In the above-described embodiment, explanation is given for the case where the growth temperature is mainly adjusted as the second growth condition in the second step S300. However, when the second growth condition satisfies the formula (2), the growth condition other than the growth temperature may be adjusted, or the growth temperature and the growth condition other than the growth temperature may be adjusted in combination, as a second growth condition.

In the above-described embodiment, explanation is given for the case where the growth condition in the inclined interface maintenance step S240 is maintained under the above-described first growth condition as in the inclined interface expansion step S220. However, when the growth condition in the inclined interface maintenance step S240 satisfy the first growth condition, the growth condition in the inclined interface maintenance step S240 may be different from the growth condition in the inclined interface expansion step S220.

In the above-described embodiment, explanation is given for the case where the growth condition in the main growth step S340 is maintained under the above-described second growth condition as in the c-plane expansion step S320. However, when the growth condition in the main growth step S340 satisfies the second growth condition, the growth condition in the main growth step S340 may be different from the growth condition in the c-plane expansion step S320.

In the above-described embodiment, explanation is given for the case where the second crystal layer 6 or the main growth layer 44 is sliced using a wire saw in the slicing step S170 and the slicing step S400. However, for example, an outer peripheral blade slicer, an inner peripheral blade slicer, an electric discharge machine, or the like may be used.

In the above-described embodiment, explanation is given for the case where the substrate 50 is obtained by slicing the main growth layer 44 in the laminated structure 90. However, the present disclosure is not limited thereto. For example, the laminated structure 90 may be used as it is to manufacture a semiconductor laminate for manufacturing a semiconductor device. Specifically, after preparing the laminated structure 90, in the semiconductor laminate manufacturing step, a semiconductor functional layer is epitaxially grown on the laminated structure 90 to prepare a semiconductor laminate. After preparing the semiconductor laminate, a back surface side of the laminated structure 90 is polished, and the base substrate 10, the initial layer 20, the first layer 30, and the c-plane expanded layer 42 are removed from the laminated structure 90. Thereby, a semiconductor laminate having the main growth layer 44 and the semiconductor functional layer can be obtained as in the above-described embodiment. According to this case, the slicing step S400 and the polishing step S500 for obtaining the substrate 50 can be omitted.

In the above-described embodiment, explanation is given for the case where the manufacturing step is completed after the substrate 50 is manufactured. However, the substrate 50 may be used as the base substrate 10, and steps S190 to S500 may be repeated. Thereby, the substrate 50 having a further lowered dislocation density can be obtained. Further, the substrate 50 with further reduced variation in the off-angle θ of the c-axis 50ca, can be obtained. Further, the steps S190 to S500 using the substrate 50 as the base substrate 10 may be set as one cycle, and the cycle may be repeated a plurality of times. Thereby, the dislocation density of the substrate 50 can be gradually lowered according to the number of times the cycle is repeated. Further, the variation in the off-angle θ of the c-axis 50ca of the substrate 50 can be gradually reduced according to the number of times the cycle is repeated. After the second cycle, the initial step S190 may be omitted.

Example

Hereinafter, various experimental results supporting the effects of the present disclosure will be described. In the following, the "nitride semiconductor substrate" may be simply abbreviated as the "substrate".

(1) Experiment 1

(1-1) Preparation of the Nitride Semiconductor Substrate

The substrates of samples 1 to 3 were prepared as follows. For samples 1 and 2, a laminated structure before slicing the substrate was also prepared.

[Conditions for Preparing the Nitride Semiconductor Substrate of Sample 1]
(Base Substrate)
  Material: GaN
  Manufacturing method: VAS method
  Diameter: 2 inches
  Thickness: 400 μm
  Crystal plane with the lowest index closest to the main plane: c plane
  No pattern processing such as formation of the mask layer on the main surface.
(Initial Layer)
  Material: GaN
  Growth method: HVPE method
  Growth Conditions:
  The raw material partial pressure and V/III ratio were lower than those in the first growth condition while keeping the same as the growth temperature under the following first growth condition.
(First Layer)
  Material: GaN
  Growth method: HVPE method
  First Growth Condition:
    The growth temperature was 980° C. or higher and 1,020° C. or lower, and the V/III ratio was 2 or higher and 20 or lower. At this time, at least one of the growth temperature and the V/III ratio was adjusted within the above range so that the first growth condition satisfied the formula (1).
(Second Layer)
  Material: GaN
  Growth method: HVPE method
  Growth temperature: 1,050° C.
  V/III ratio: 2
  The second growth condition satisfies the formula (2).
  Thickness from the main surface of the base substrate to the surface of the second layer: approximately 2 mm
(Slice Condition)
  Substrate thickness: 400 μm
  Carfloss: 200 μm
  In sample 1, two substrates having slightly different processing states were prepared.

[Conditions for Preparing the Nitride Semiconductor Substrate in Sample 2]
(Base Substrate)
Same as sample 1.
(Initial Layer)
None.
(First Layer)
Same as sample 1.
(Second Layer)
Same as sample 1.
(Slice Condition)
Same as sample 1.

[Conditions for Preparing Nitride Semiconductor Substrate in Sample 3]
(Base Substrate)
Same as sample 1.
(Crystal Layer)
  Material: GaN
  Growth method: HVPE method
  Growth temperature: 1,050° C. (same as the second layer of sample 1)
  V/III ratio: 2 (same as the second layer of sample 1)
  The above growth conditions satisfy the formula (2).
  Thickness from the main surface of the base substrate to the surface of the crystal layer: approximately 2 mm
(Slice Condition)
Same as sample 1.

(1-2) Evaluation (Observation Using a Fluorescence Microscope)

Using a fluorescence microscope, the cross section of the laminated structure before slicing the substrate was observed in each of samples 1 and 2.

(Observation Using a Multi-Photon Excitation Microscope)

The main surfaces of the base substrate and the substrates of samples 1 to 3 were observed, using a multi-photon excitation microscope. At this time, the dislocation density was measured by measuring a dark spot density over the entire main surface every 250 μm of the field of view. It is confirmed by measuring by shifting a focus in a thickness direction that all dark spots on these substrates are dislocations. Further, at this time, the ratio of the number of regions having a dislocation density of less than $1 \times 10^6$ cm$^{-2}$ (low dislocation density region) with respect to the total number of measurement regions in a 250 μm square field of view was obtained. The "low dislocation density region" referred to herein, as shown in the results below, means a region having a dislocation density lower than an average dislocation density in the main surface of the crystal layer of sample 3 in which the crystal layer was grown without performing the first step.

(X-Ray Locking Curve Measurement)

The following two types of X-ray locking curve measurements were performed for each of the base substrate and the substrates of samples 1 to 3.

For the X-ray locking curve measurement, "X'Pert-PRO MRD" manufactured by Spectris was used, and "Hybrid monochromator" manufactured by the same company was used as the monochromator at the incident side. The hybrid monochromator has an X-ray mirror and two crystals of Ge (220) plane in this order from an X-ray light source side. In the measurement, first, the X-rays emitted from the X-ray light source are made into parallel light by an X-ray mirror. Thereby, the number of used X-ray photons (ie, X-ray intensity) can be increased. Next, a parallel light from the X-ray mirror is made into (Cu) Kα1 monochromatic light by two crystals of Ge (220) plane. Next, the monochromatic light from the two crystals of Ge (220) plane is narrowed to a predetermined width through the slit and incident on the substrate. When the full width at half maximum is obtained by simulation at the time of measuring the locking curve of the (0002) plane of a perfect crystal GaN using the hybrid monochromator, it is 25.7 arcsec. That is, the full width at half maximum is a theoretical measurement limit when measuring with the above-described optical system.

In the measurement, the X-rays incident on the substrate are parallel lights toward the substrate side in the cross section along ω direction, but are not parallel lights in the cross section along a direction orthogonal to ω direction (a direction of a rotation axis of the substrate). Therefore, the width of the X-ray in ω direction is almost constant, but the width of the X-ray in the direction orthogonal to ω direction increases while the X-rays reaching the substrate from the slit. Accordingly, in the X-ray locking curve measurement, the full width at half maximum of the X-rays diffracted at a predetermined crystal plane, depends on the slit width at the incident side in ω direction in which the X-rays are parallel light.

On the other hand, the light receiving side was open. A window width of a detector on the light receiving side was 14.025 mm. In the above-described optical system, since a goniometer radius is 420 mm, it is possible to measure the fluctuation of the Bragg angle of ±0.95°.

(X-Ray Locking Curve Measurement 1)

The X-ray locking curve of the (0002) plane of each of the base substrate and the substrates of samples 1 to 3 was measured, with a slit width at the incident side in ω direction set to 0.1 mm. At this time, the measurement was performed at a plurality of measurement points set at intervals of 5 mm in each of the m-axis direction and the a-axis direction in the main surface of each substrate. As a result of the measurement, the radius of curvature of the c-plane and the off-angle, which is the angle formed by the c-axis with respect to the normal of the main surface, were obtained based on the diffraction peak angle on the (0002) plane at each measurement point. Further, the variation in the off-angle was obtained as a difference between maximum and minimum in the size of the off-angle within a diameter of 29.6 mm from the center of the main surface. Further, FWHMb was obtained at each measurement point, FWHMb being full width at half maximum of the (0002) plane diffraction when the slit width at the incident side in ω direction was 0.1 mm.

(X-Ray Locking Curve Measurement 2)

The X-ray locking curve was measured for each of the base substrate and the substrate of sample 1, with a slit width at the incident side in ω direction set to 1 mm. The measurement was performed at the center of the main surface of each substrate. As a result of the measurement, full width at half maximum FWHMa of the (0002) plane diffraction was obtained, with the slit width at the incident side in w direction set to 1 mm. Further, the ratio of FWHMa-FWHMb to FWHMa was obtained at the center of the main surface of each substrate.

Further, in sample 1, the measurement was performed at a plurality of measurement points set at intervals of 5 mm in each of the m-axis direction and the a-axis direction in the main surface. Thereby, the ratio of FWHMa–FWHMb to FWHMa was obtained at a plurality of measurement points of sample 1. The measurement will be described later as experiment 3.

In the X-ray locking curve measurements 1 and 2, when the X-rays are incident on the main surface of each substrate at a Bragg angle of 17.28° of the (0002) plane with respect to the main surface, X-ray footprint with a slit width in ω direction set to 0.1 mm is about 0.337 mm, and X-ray foot print with a slit width in ω direction set to 1 mm is about 3.37 mm.

(1-3) Result

The results are shown in Table 1.

TABLE 1

| | Sample 1 | Sample 2 | Sample 3 | A |
|---|---|---|---|---|
| Initial step | Yes | None | None | — |
| First step | Yes | Yes | None | — |
| B (cm$^{-2}$) | $4.1 \times 10^5$ | $5.4 \times 10^5$ | $1.5 \times 10^5$ | $3.0 \times 10^5$ |
| C (%) | 100 | 91 | 30 | 0 |
| D (m) | 32.2~69.5 | 31.2 | 11.3 | 7.64 |
| E (°) | 0.024~0.053 | 0.055 | 0.15 | 0.22 |
| F FWHMb (arcsec) | 28~31.3 | 30.2~41.5 | 38.5~66.2 | 40.1~77.8 |
| (FWHMa-FWHMb)/ FWHMa (%) | 0.0~28.1 | — | — | 54.2~79.6 |

A = Base substrate
B = Average dislocation density
C = Ratio of low dislocation density-region
D = Radius of curvature of c-plane
E = Variation in off-angle (within a diameter of 29.6 mm)
F = In the main surface (Sample 3)

As shown in table 1, in the substrate of sample 3 of c-plane limited growth, due to the effect of thickening the crystal layer, the average dislocation density in the main surface was lower than that of the base substrate. However, when the dislocation density of the substrate of sample 3 was N', the reduction rate of the dislocation density obtained by N'/N$_0$ described above was 0.5.

Further, in the substrate of sample 3, due to the effect of thickening the crystal layer, the radius of curvature of the c-plane was slightly larger than that of the base substrate, and the variation in the off-angle of the c-axis was slightly smaller than that of the base substrate.

(Sample 2)

Figure 12:
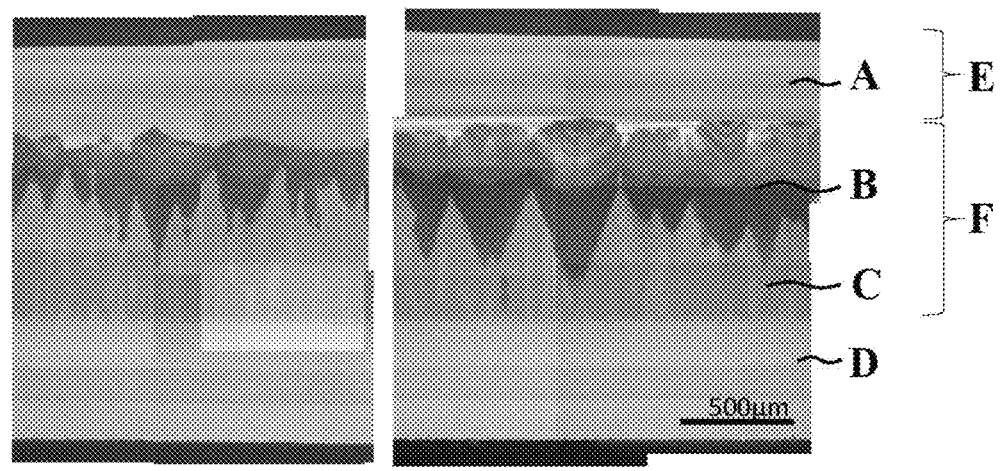
FIG. 12 is a view illustrating an observation image obtained by observing a cross section of a laminated structure of Sample 2 using a fluorescence microscope.

FIG. 12 is a view illustrating an observation image obtained by observing the cross section of the laminated structure of sample 2 using a fluorescence microscope. As illustrated in FIG. 12, in the laminated structure of sample 2, the first layer had a first c-plane growth region grown with the c-plane as a growth surface and an inclined interface growth region grown with the inclined interface as a growth surface, based on a difference in growth surfaces during the growth process (ie, difference in oxygen concentration). The first c-plane growth region had a plurality of valleys and a plurality of mountains.

In sample 2, an average value of the angles formed by the pair of inclined portions in the first c-plane growth region was approximately 45.3°. Further, the average distance between the closest tops was approximately 161 μm. However, in sample 2, in a part on the left side in FIG. 12, there was a portion where the distance between the closest tops was 100 μm or less.

Further, in sample 2, a height from the main surface of the base substrate to the top of the first c-plane growth region was about 430 to 700 μm. Further, the inclined interface growth region was continuously formed along the main surface of the base substrate. Further, the thickness of the boundary surface of the second layer at the position where the inclined interface disappeared was about 894 μm from the main surface of the base substrate.

As shown in table 1, in the substrate of sample 2, the average dislocation density in the main surface was less than $5.5 \times 10^5$ cm$^{-2}$, which was lower than that of the base substrate and sample 3.

Further, when the dislocation density of the substrate of sample 2 was N, the reduction rate of the dislocation density obtained by N/N$_0$ described above was 0.18.

Further, in the substrate of sample 2, the region having the dislocation density of less than $1 \times 10^6$ cm$^{-2}$ (low dislocation density region) was present at 91% of the main surface 50$s$. The dislocation density in the low dislocation density region was $2.3 \times 10^5$ to $9.3 \times 10^5$ cm$^{-2}$. However, in the remaining 9% region of the main surface 50$s$, the dislocation density was $1 \times 10^6$ cm$^{-2}$ or more and $3 \times 10^6$ cm$^{-2}$ or less.

Further, as shown in table 1, in the substrate of sample 2, the radius of curvature of the c-plane was larger than that of the base substrate and the substrate of sample 3, and was 22 m or more. Further, in the substrate of sample 2, the variation in the off-angle of the c-axis within the diameter of 29.6 mm was reduced as compared with the substrate of the base substrate and the substrate of sample 3, and was 0.075° or less. Even when the crystal layer is thickly grown with the c-plane as a growth surface as in sample 3, the variation in the off-angle of the c-axis in the substrate was smaller than that in the base substrate, but the variation in the off-angle of the c-axis of the substrate of sample 2 was even smaller than that in sample 3.

According to the above sample 2, the first growth condition was adjusted so as to satisfy the formula (1) in the first step. Thereby, the c-plane could surely disappear in the growth process of the first layer. Since the c-plane surely disappear, the dislocations could be reliably bent at the position where the inclined interface in the first layer was exposed. As a result, the dislocation density in the main surface of the substrate could be lowered.

However, in sample 2, since a portion having a short distance between the closest tops was formed in the first layer, dislocations were not sufficiently collected in this portion. Therefore, it is considered that a high dislocation density region was formed in 9% of the main surface of the substrate of sample 2.

(Sample 1)

Figure 11:
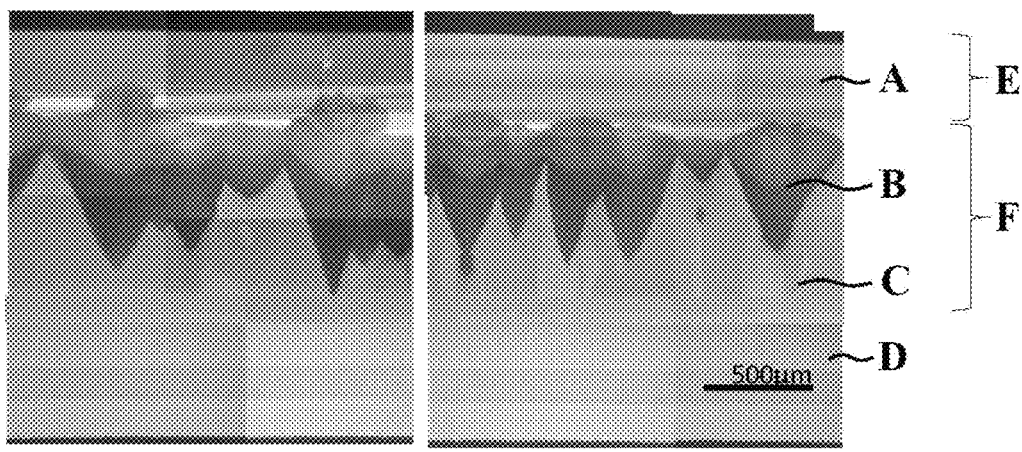
FIG. 11 is a view illustrating an observation image obtained by observing a cross section of a laminated structure of Sample 1 using a fluorescence microscope.

FIG. 11 is a view illustrating an observation image obtained by observing the cross section of the laminated structure of sample 1 using a fluorescence microscope. FIG. 13 is a view of observing the main surface of the substrate of sample 1 using a multi-photon excitation microscope.

As illustrated in FIG. 11, in the laminated structure of sample 1, the first layer had a first c-plane growth region and an inclined interface growth region. The first c-plane growth region had a plurality of valleys and a plurality of mountains.

In sample 1, the average value of the angles formed by the pair of inclined portions in the first c-plane growth region was slightly larger than that of sample 2, and was about 55.3°. Further, in sample 1, the average distance between the closest tops was larger than that of sample 2 and was about 259 μm. Further, in sample 1, there was no portion where the distance between the closest tops was 100 μm or less.

Further, in sample 1, the height from the main surface of the base substrate to the top of the first c-plane growth region was approximately 317 to 829 μm. Further, the inclined interface growth region was continuously formed along the main surface of the base substrate. Further, the thickness of the boundary surface of the second layer at the position where the inclined interface disappeared, was about 1093 μm from the main surface of the base substrate.

As shown in table 1, in the substrate of sample 1, the average dislocation density in the main surface was significantly lowered to $4.1 \times 10^5$ cm$^{-2}$ as compared with the base substrate and the substrates of samples 2 and 3.

Further, when the dislocation density of the substrate of sample 1 was N, the reduction rate of the dislocation density obtained by N/N$_0$ described above was 0.137.

Further, in the substrate of sample 1, a low dislocation density region having a dislocation density of less than $1 \times 10^6$ cm$^{-2}$ was formed over the entire main surface (100%). The dislocation density in the low dislocation density region was $1.6 \times 10^5$ to $7.2 \times 10^5$ cm$^{-2}$.

Further, as shown in table 1, in the substrate of sample 1, the radius of curvature of the c-plane was larger than that of the base substrate and the substrate of sample 3, and was 22 m or more. Further, in the substrate of sample 1, the variation in the off-angle of the c-axis within the diameter of 29.6 mm was reduced as compared with the substrate of the base substrate and the substrate of sample 3, and was 0.075° or less.

Further, as shown in table 1, in the substrate of sample 1, FWHMb was 32 arcsec or less at all measurement points (that is, 100%), wherein FWHMb is full width at half maximum of the (0002) plane diffraction when a slit width in ω direction is 0.1 mm.

Figure 13A:
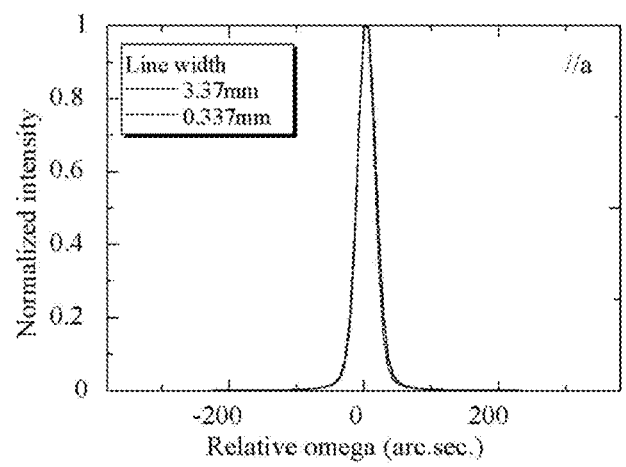
FIG. 13 (a) is a view illustrating a normalized X-ray diffraction pattern when an X-ray locking curve measurement is performed to the nitride semiconductor substrate of sample 1 with a different slit, and (b) is a view illustrating a normalized X-ray diffraction pattern when the same measurement as that of sample 1 is performed to a base substrate.
Figure 13B:
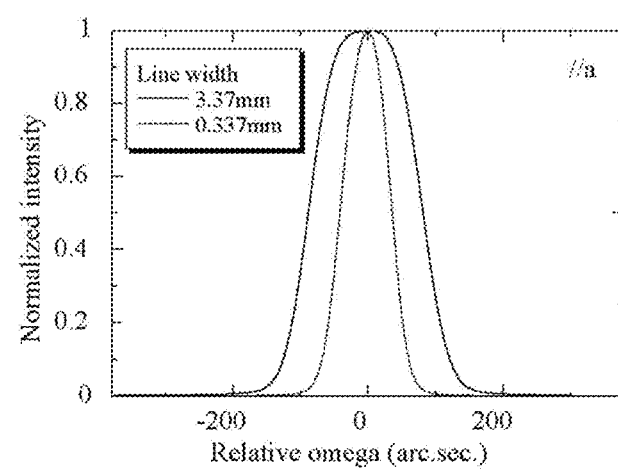

FIG. 13(*a*) is a view illustrating a normalized X-ray diffraction pattern of the substrate of sample 1 when the X-ray locking curve is measured with a different slit, and (b) is a view illustrating a normalized X-ray diffraction pattern when the same measurement as that of sample 1 is performed for the base substrate. FIGS. 13(a) and 13(b) illustrate the measurement results in the direction along the m-axis. Further, in the figure, "Line width" means the above-described X-ray footprint.

As illustrated in FIG. 13(b), in the base substrate, the X-ray diffraction pattern was narrowed when the slit width in ω direction was 0.1 mm, but the X-ray diffraction pattern was widened when the slit width in w direction was 1 mm.

Therefore, as shown in table 1, in the base substrate, FWHMa-FWHMb was 50% or more of FWHMa.

In contrast, as illustrated in FIG. 13(a), in the substrate of sample 1, the X-ray diffraction pattern was slightly widened, but the spread was small even when the slit width in ω direction was widened from 0.1 mm to 1 mm.

Thereby, as shown in table 1, in the substrate of sample 1, FWHMa-FWHMb was 30% or less of FWHMa.

According to the above sample 1, in the first step, the first growth condition was adjusted so as to satisfy the formula (1). Thereby, the c-plane could be surely disappeared in the growth process of the first layer. Since the c-plane surely disappears, the dislocations could be reliably bent at the position where the inclined interface in the first layer was exposed. As a result, it was confirmed that the dislocation density in the main surface of the substrate could be lowered efficiently.

Further, according to sample 1, since the initial layer grows on the main surface of the base substrate in the initial step, it is possible to prevent the formation of a region having a short distance between the closest tops on a part of the surface of the first layer, and the distance between the closest tops could be substantially uniform over the entire surface of the first layer. Thereby, it was confirmed that the formation of a high dislocation density region on a part of the main surface of the substrate was prevented and the dislocation density could be lowered over the entire main surface of the substrate.

Further, according to sample 1, it was confirmed that the radius of curvature of the c-plane of the substrate could be larger than the radius of curvature of the c-plane of the base substrate, and the variation in the off-angle of the c-axis of the substrate could be reduced, and the variation in the off-angle of the c-axis in the base substrate could be reduced.

Further, according to sample 1, as described above, there were few dislocations, and all of the crystal quality factors of the substrate were well-balanced and good, over a wide range of the main surface of the substrate. Thereby, in the substrate of sample 1, it was confirmed that FWHMb was 32 arcsec or less over a wide range of the main surface. Further, in the substrate of sample 1, it was confirmed that FWHMb was smaller than that of the other samples.

Further, according to sample 1, as described above, all of the crystal quality factors were well-balanced and good, and the radius of curvature of the c-plane of the substrate was large. Thereby, in sample 1, it was confirmed that the difference in full width at half maximum FWHMa-FWHMb was 30% or less of FWHMa when the X-ray locking curve was measured with a different slit width at the incident side.

Further, according to sample 1, as described above, all of the crystal quality factors were well-balanced and good over a wide range of the main surface of the substrate, and the radius of curvature of the c-plane of the substrate was large. Thereby, in the substrate of sample 1, it was confirmed that the difference in full width at half maximum FWHMa-FWHMb was 30% or less of FWHMa over a wide range of the main surface.

(2) Experiment (2-1) Preparation of a Laminated Structure

In order to investigate the inclined interface generated on the surface of the first layer, a laminated structure having a base substrate, an initial layer and a first layer and not having a second layer was prepared. The conditions for the base substrate and the first layer were almost the same as those of sample 1 of experiment 1.

(2-2) Evaluation (Observation Using an Optical Microscope)
The surface of the first layer of the laminated structure was observed using an optical microscope.
(Observation Using a Fluorescence Microscope)
The cross section of the laminated structure was observed using a fluorescence microscope.

(2-3) Result

Figure 14A:
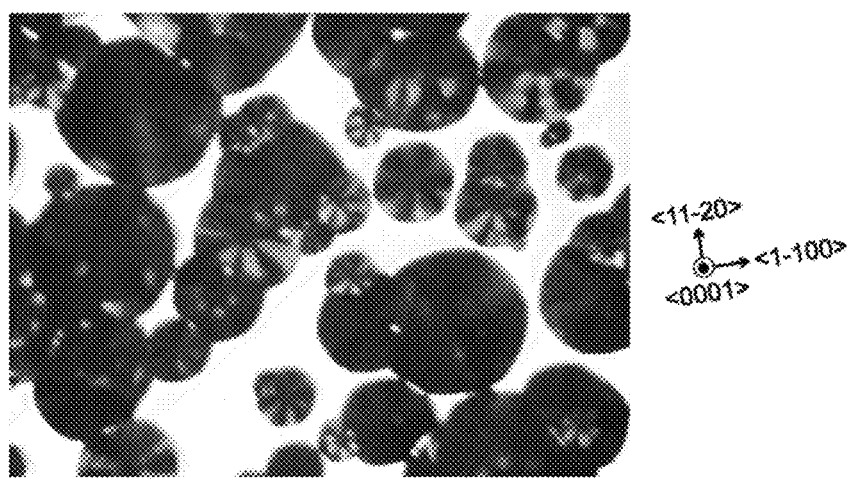
FIG. 14(a) is a view illustrating an observation image obtained by observing a surface of a laminated structure of experiment 2 using an optical microscope, and (b) is a view illustrating an observation image obtained by observing the surface of the laminated structure of experiment 2 using a scanning electron microscope.
Figure 15A:
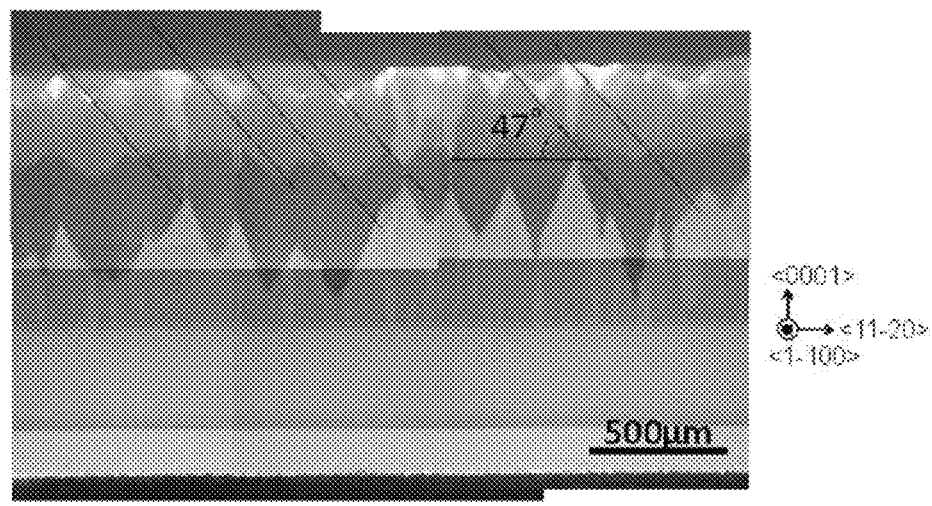
FIG. 15(a) is a view illustrating an observation image obtained by observing a M-cross section of the laminated structure of experiment 2 using an optical microscope, and (b) is a view illustrating the observation image obtained by observing the M-cross section of the laminated structure of experiment 2 using a scanning electron microscope.
Figure 16A:
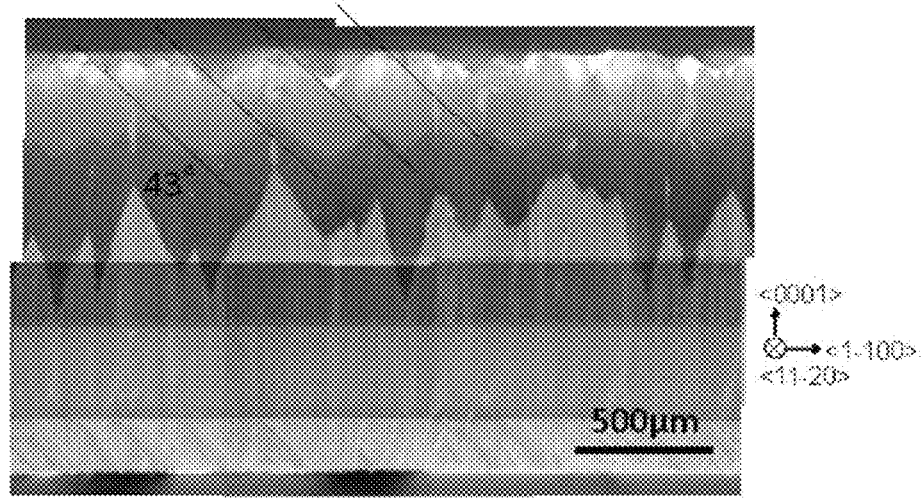
FIG. 16(a) is a view illustrating an observation image obtained by observing an a-cross section of the laminated structure of experiment 2 using an optical microscope, and (b) is a view illustrating an observation image obtained by observing the an a-cross section of the laminated structure of experiment 2 using a scanning electron microscope.
Figure 16B:
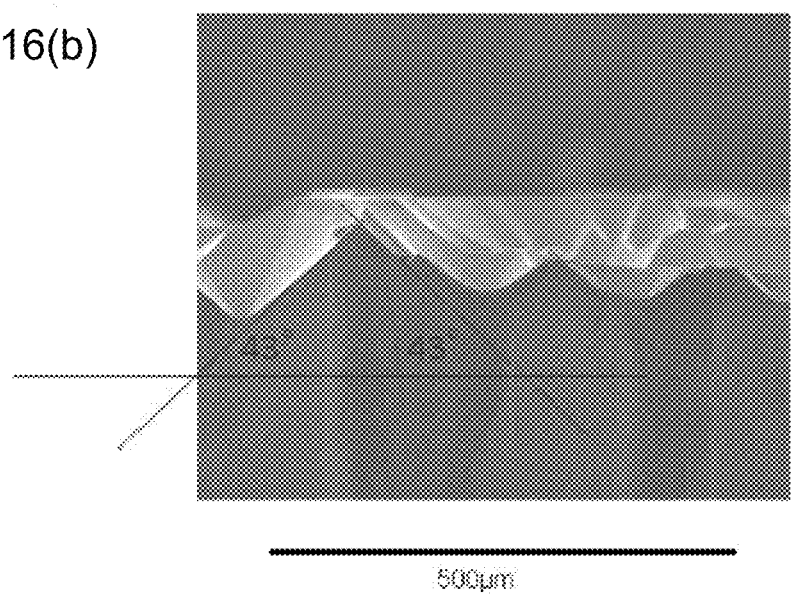
Figure 17:
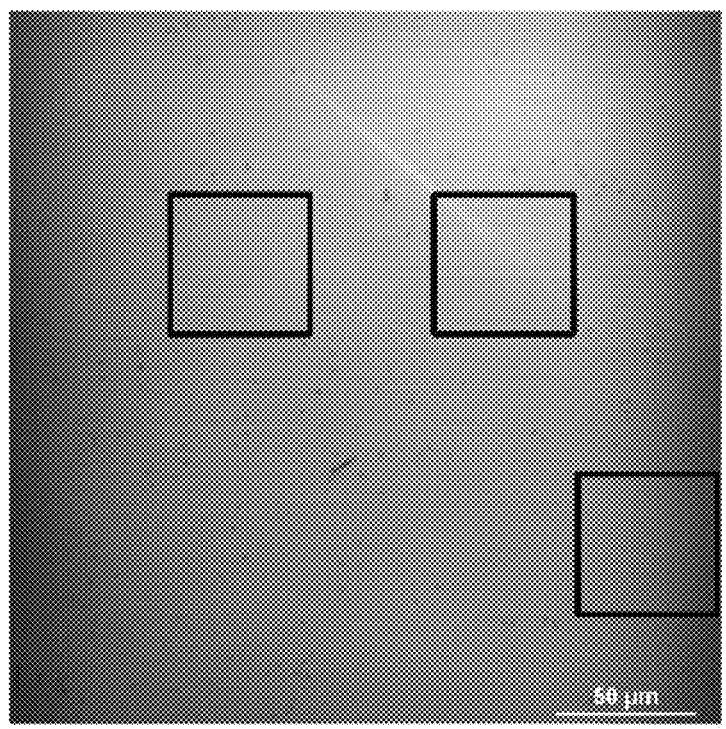
FIG. 17 is a view of observing a main surface of a nitride semiconductor substrate of sample 1 using a multi-photon excitation microscope.
Figure 18:
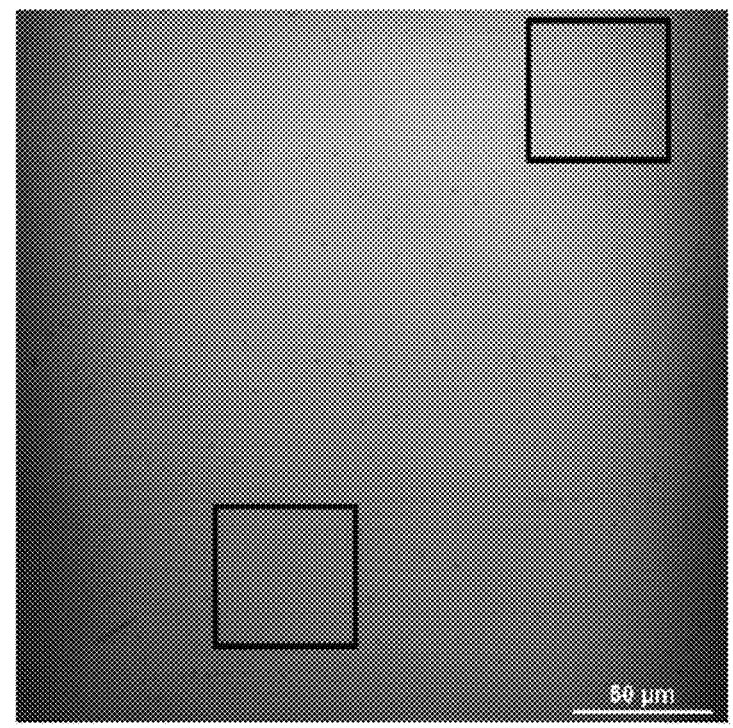
FIG. 18 is a view of observing the main surface of the nitride semiconductor substrate of sample 1 using a multi-photon excitation microscope.
Figure 19:
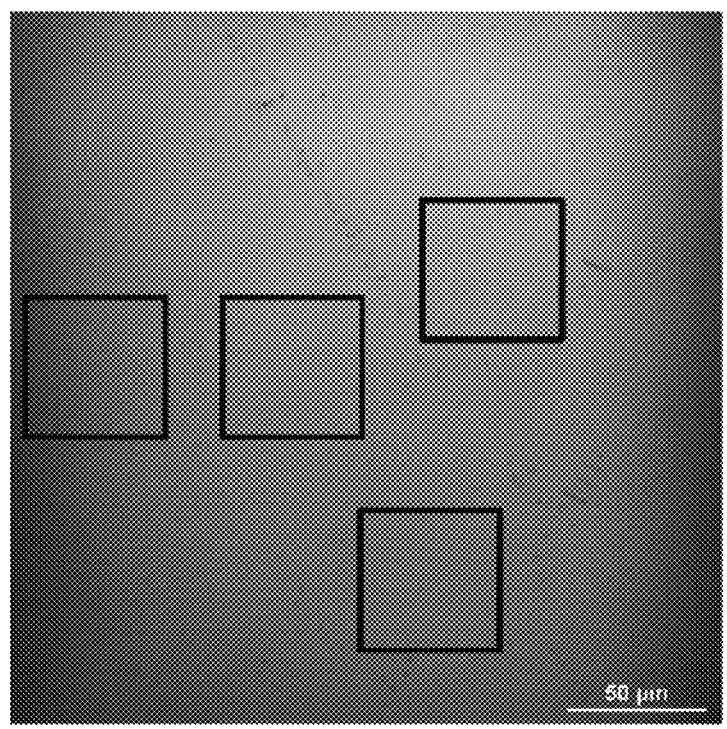
FIG. 19 is a view of observing the main surface of the nitride semiconductor substrate of sample 1 using a multiphoton excitation microscope.
Figure 20:
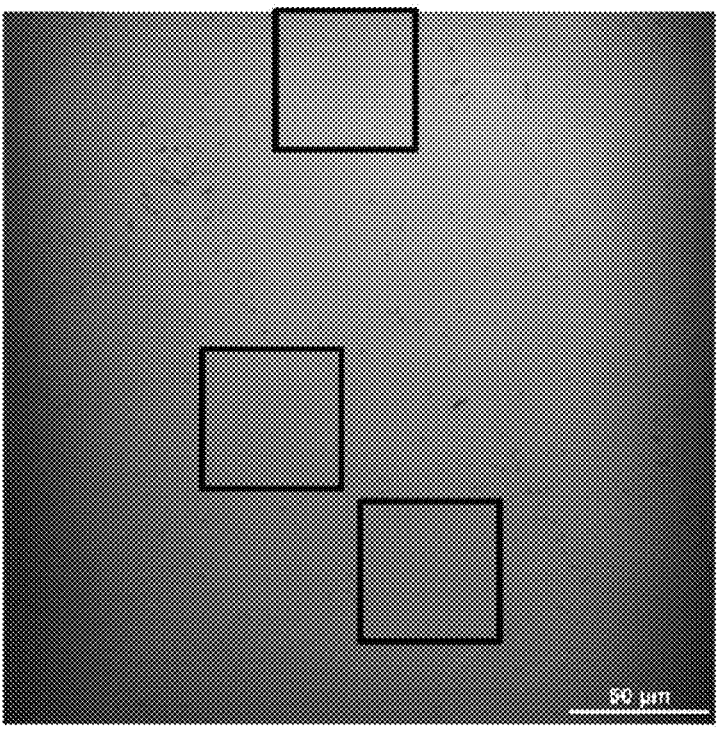
FIG. 20 is a view of observing the main surface of the nitride semiconductor substrate of sample 1 using a multi-photon excitation microscope.
Figure 21:
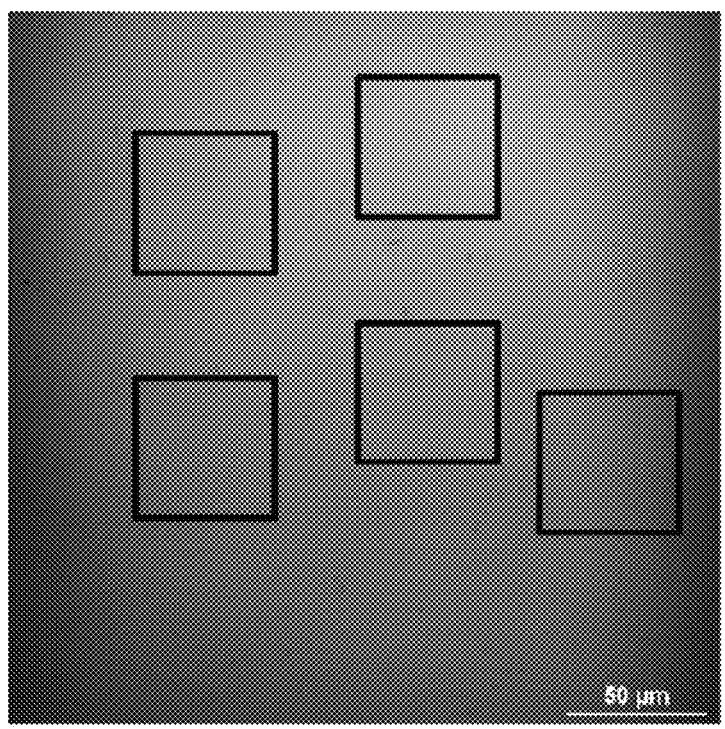
FIG. 21 is a view of observing the main surface of the nitride semiconductor substrate of sample 1 using a multi-photon excitation microscope.
Figure 22:
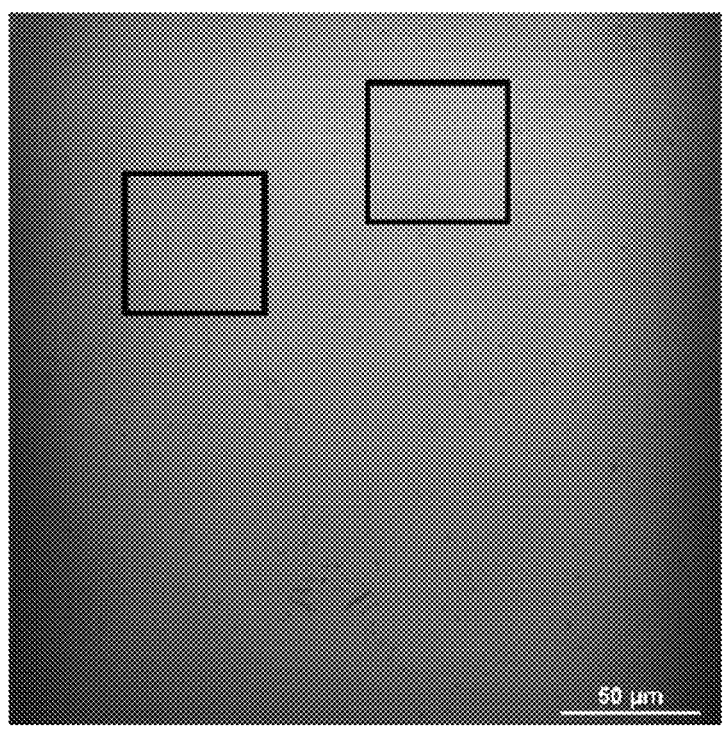
FIG. 22 is a view of observing the main surface of the nitride semiconductor substrate of sample 1 using a multi-photon excitation microscope.
Figure 23:
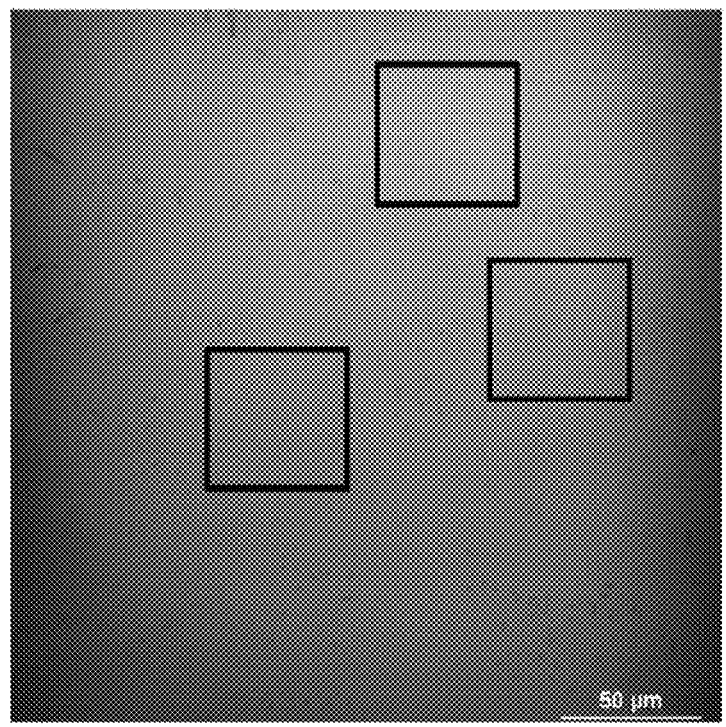
FIG. 23 is a view of observing the main surface of the nitride semiconductor substrate of sample 1 using a multi-photon excitation microscope.
Figure 24:
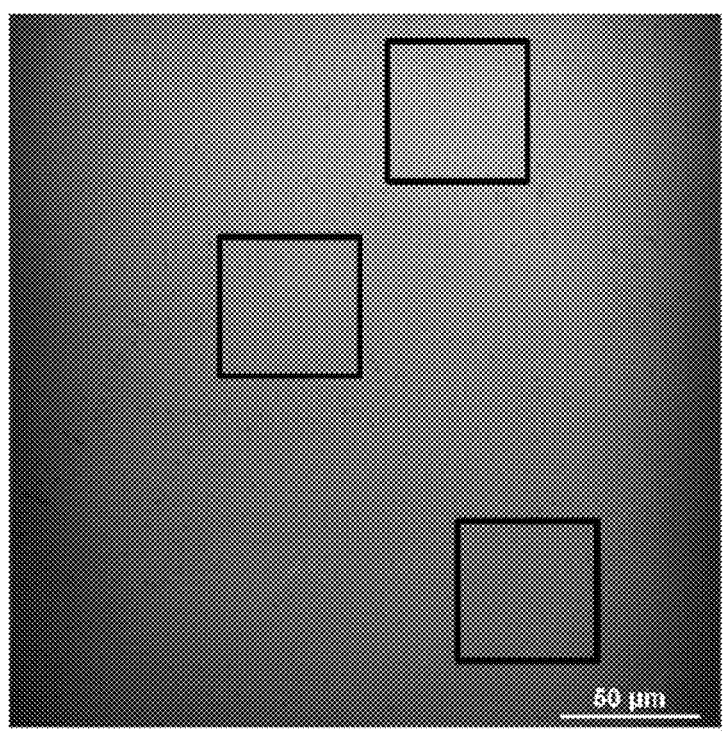
FIG. 24 is a view of observing the main surface of the nitride semiconductor substrate of sample 1 using a multi-photon excitation microscope.
Figure 25:
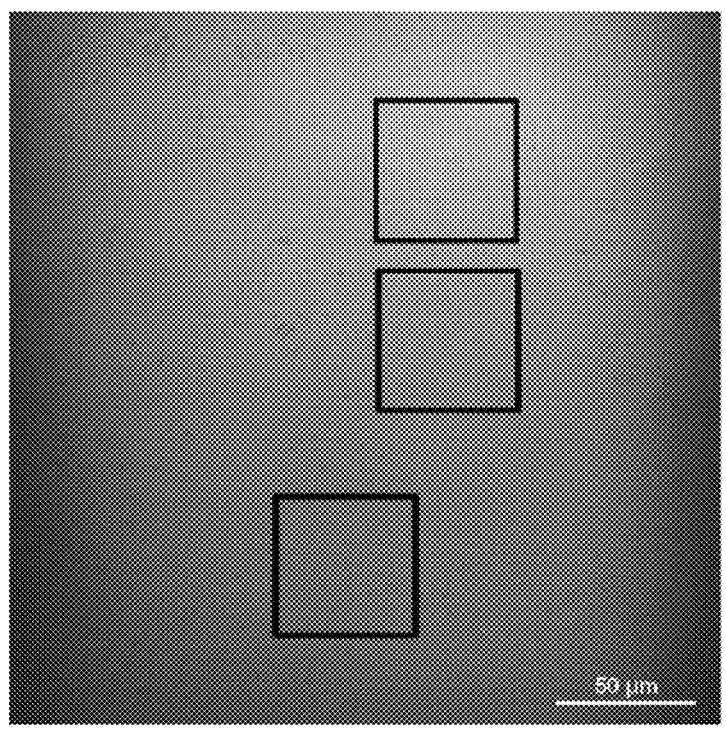
FIG. 25 is a view of observing the main surface of the nitride semiconductor substrate of sample 1 using a multi-photon excitation microscope.
Figure 26:
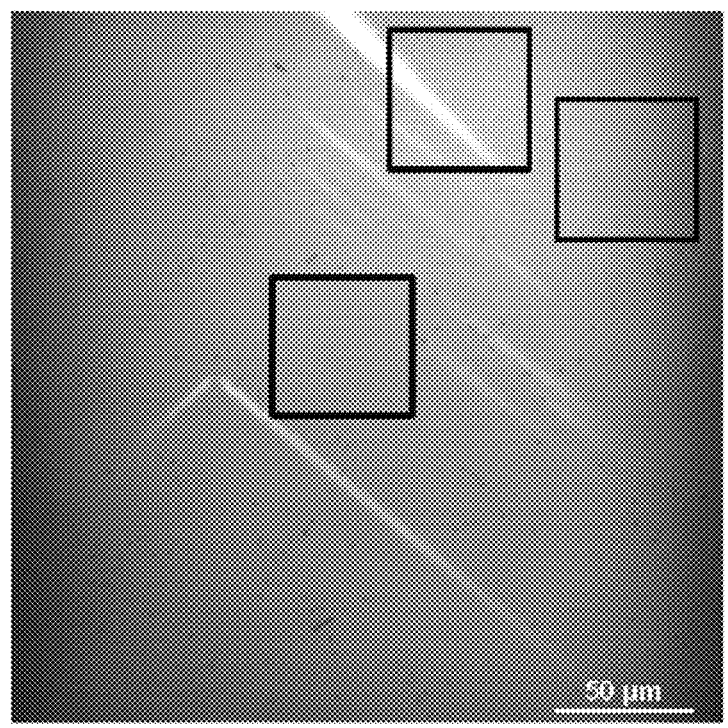
FIG. 26 is a view of observing the main surface of the nitride semiconductor substrate of sample 1 using a multi-photon excitation microscope.
Figure 27:
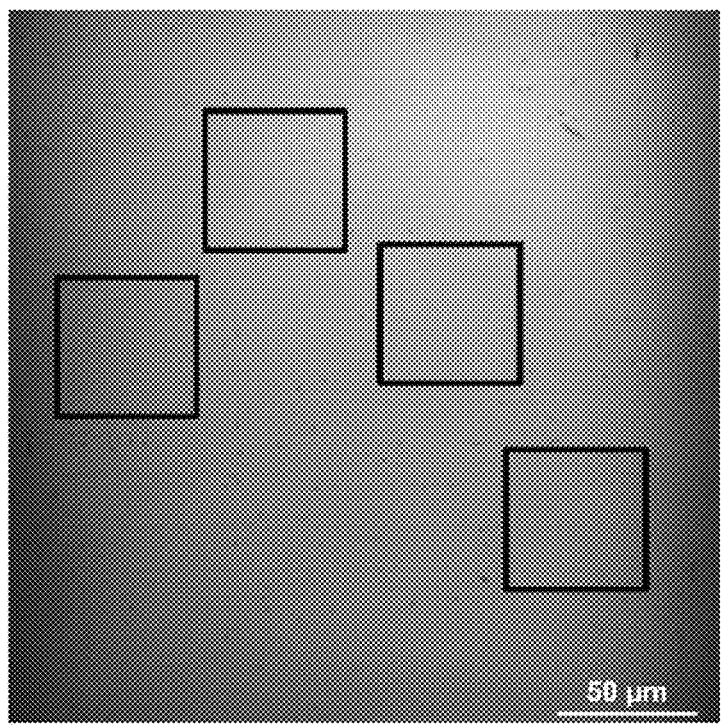
FIG. 27 is a view of observing the main surface of the nitride semiconductor substrate of sample 1 using a multi-photon excitation microscope.
Figure 28:
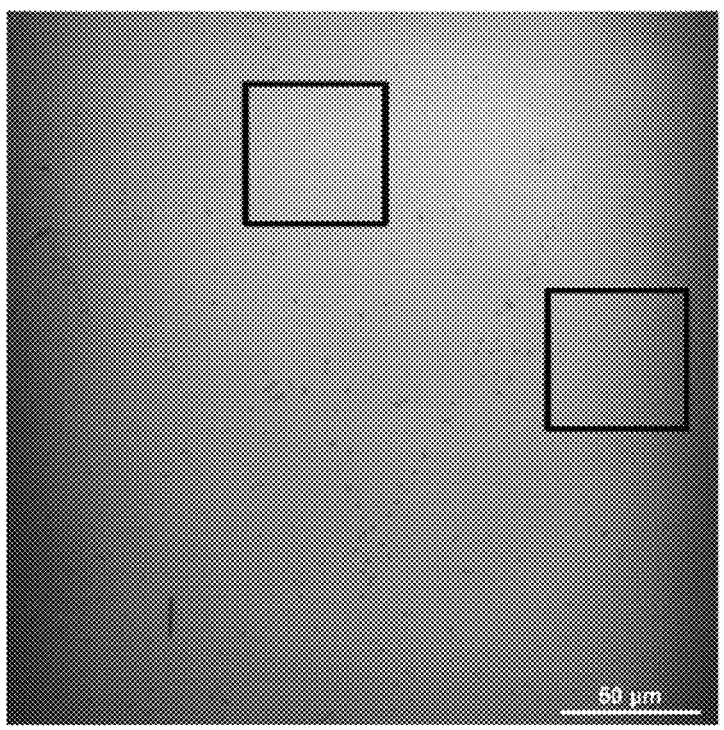
FIG. 28 is a view of observing the main surface of the nitride semiconductor substrate of sample 1 using a multi-photon excitation microscope.
Figure 29:
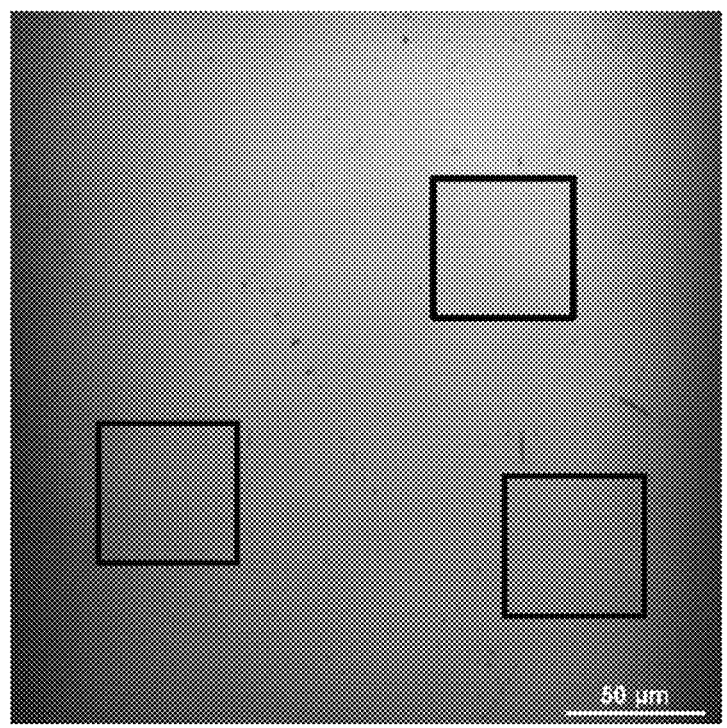
FIG. 29 is a view of observing the main surface of the nitride semiconductor substrate of sample 1 using a multi-photon excitation microscope.
Figure 30:
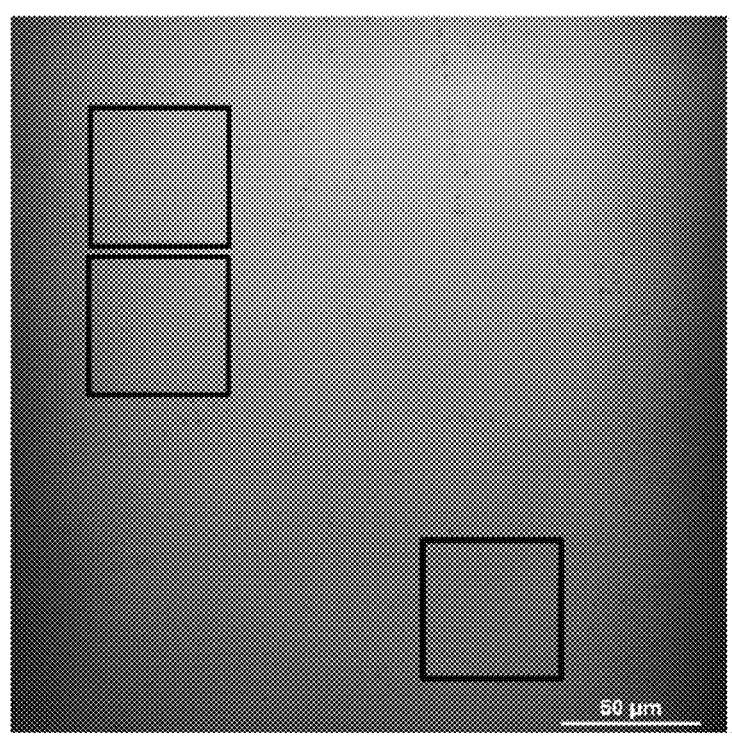
FIG. 30 is a view of observing the main surface of the nitride semiconductor substrate of sample 1 using a multi-photon excitation microscope.
Figure 31:
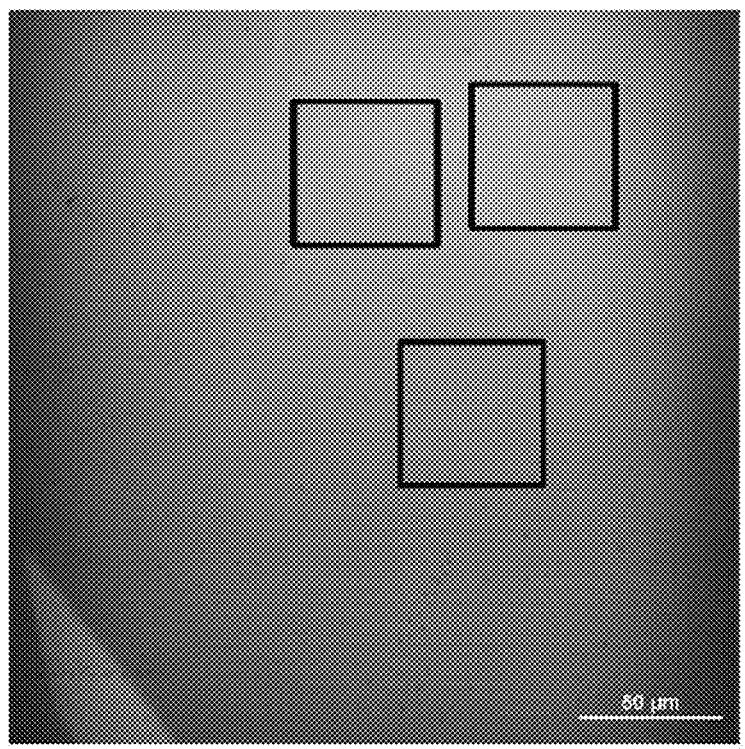
FIG. 31 is a view of observing the main surface of the nitride semiconductor substrate of sample 1 using a multi-photon excitation microscope.
Figure 32:
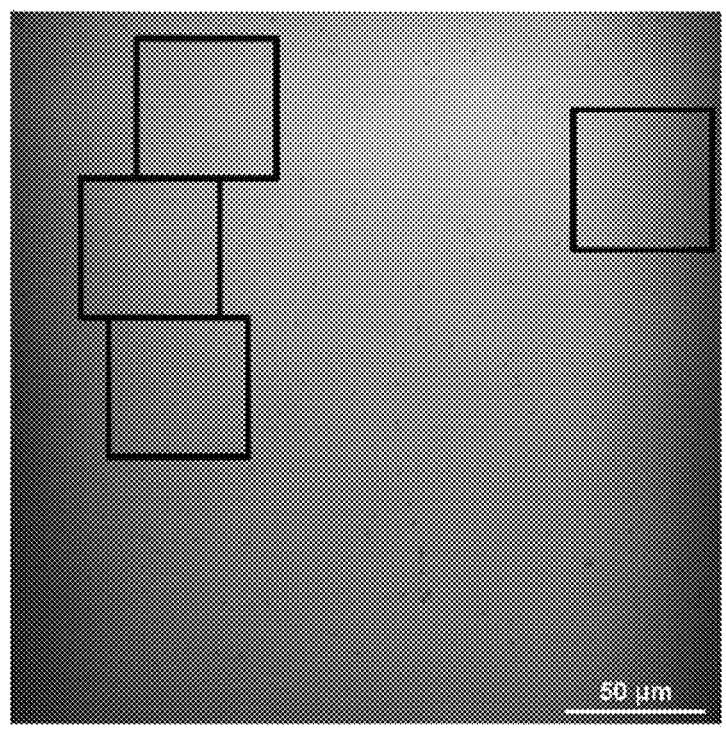
FIG. 32 is a view of observing the main surface of the nitride semiconductor substrate of sample 1 using a multi-photon excitation microscope.
Figure 33:
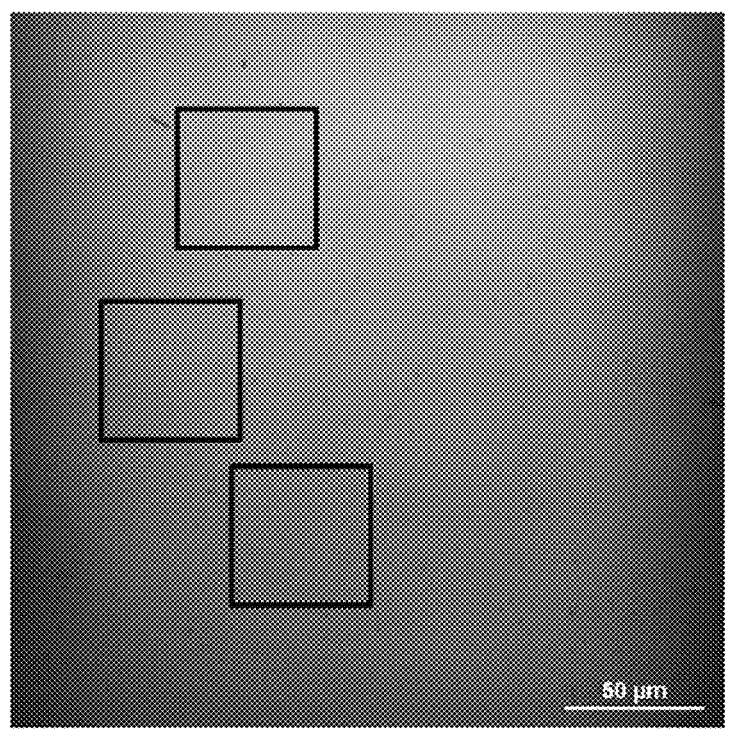
FIG. 33 is a view of observing the main surface of the nitride semiconductor substrate of sample 1 using a multi-photon excitation microscope.

FIG. 14(a) is a view illustrating an observation image obtained by observing the surface of the laminated structure of experiment 2 using an optical microscope, and (b) is a view illustrating an observation image obtained by observing the surface of the laminated structure of experiment 2 using a scanning electron microscope. FIG. 15(a) is a view illustrating an observation image obtained by observing the M cross section of the laminated structure of experiment 2 using an optical microscope, and (b) is a view illustrating an observation image obtained by observing the M cross section of the laminated structure of experiment 2 using a scanning electron microscope. FIG. 16(a) is a view illustrating an observation image obtained by observing the a-cross section of the laminated structure of experiment 2 using an optical microscope, and (b) is a view illustrating an observation image obtained by observing the a-cross section of the laminated structure of experiment 2 using a scanning electron microscope.

As illustrated in FIGS. 14(a) to 16(b), a plurality of concaves formed by the inclined interfaces other than the c-plane were generated on the top surface of the first layer.

As illustrated in FIG. 14(a), six shining visible surfaces were formed in the concave generated on the top surface of the first layer, that is, the concave had six inclined interfaces.

Figure 14B:
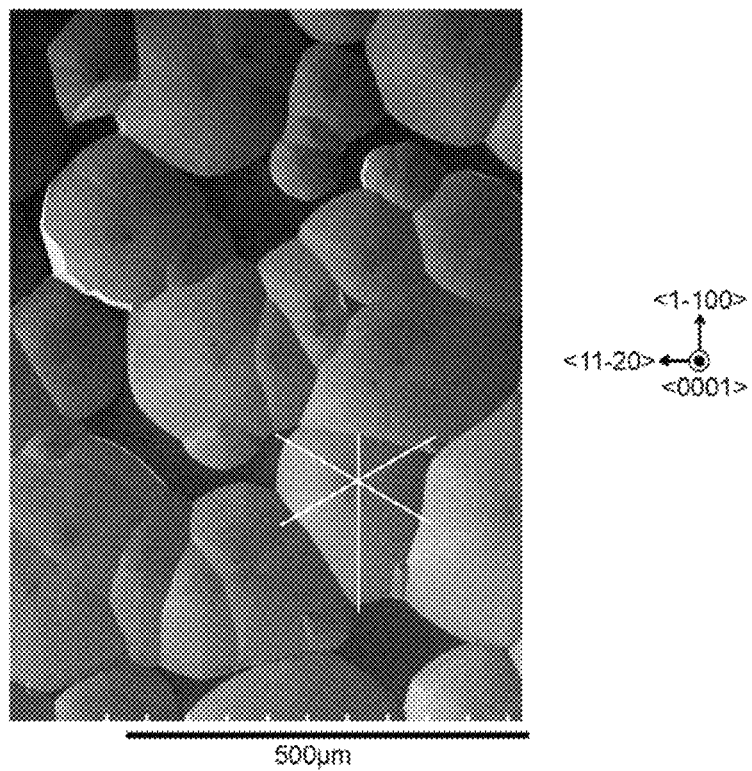

As illustrated in FIG. 14(b), six ridge lines (an example indicated by white lines) in the concaves generated on the top surface of the first layer, were formed evenly from the center. That is, the concave was in the form of an inverted regular hexagonal cone. Further, when considering the direction of the orientation flat of the base substrate, there is the ridgeline in the concave along the <1-100> axial direction, and the inclined interface constituting the concave was a plane (that is, {11-2 m} plane) whose normal direction was a direction inclined from the <11-20> axis.

Figure 15B:
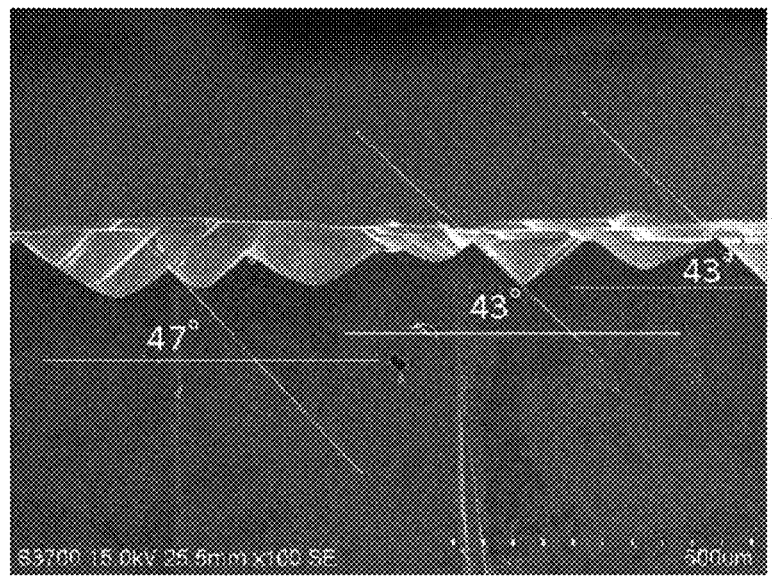

The M cross section (cross section in the direction along the <11-20> axis) illustrated in FIGS. 15(a) and 15(b) is obtained by almost vertically cutting the inclined interface constituting the concave in the form of the inverted regular hexagonal cone.

As illustrated in FIGS. 15(a) and 15(b), in the M cross section, an angle of the inclined interface in the first layer with respect to the main surface of the base substrate was about 47° or less. Further, as illustrated in FIG. 14(*a*), there were many inclined interfaces having the angle of about 47°.

On the other hand, the a-cross section (cross section in the direction along the <1-100> axis) illustrated in FIGS. 16(*a*) and 16(*b*) was cut along the ridge line constituting the concave in the form of the inverted regular hexagonal cone.

As illustrated in FIGS. 16(*a*) and 16(*b*), in the a-cross section, most of the angles of the ridge lines constituting the concaves in the form of the inverted regular hexagonal cones with respect to the main surface of the base substrate, were about 43°. When the angle of the ridgeline is geometrically calculated under the condition that the angle of the inclined interface constituting the inverted regular hexagonal cone is 47°, the angle of the ridgeline is 43°. Therefore, it was confirmed that the angle of the inclined interface was about 47° in many concaves, even based on the angle of the ridgeline obtained from FIGS. 15(*a*) and 15(*b*).

Here, the angle of {11-2m} with respect to the {0001} plane of GaN is as follows.

{11-21} plane: 72.9°
{11-22} plane: 58.4°
{11-23} plane: 47.3°
{11-24} plane: 39.1°

As described above, it was confirmed that the inclined interface generated on the surface of the first layer grown under the condition of experiment 2, was {11-2 m} plane satisfying m 3. It was also confirmed that most of the inclined interfaces were {11-23} planes.

According to experiment 2, since the above-described initial step was performed and the first growth condition was adjusted so as to satisfy the formula (1) in the same manner as in experiment 1, the {11-2m} plane satisfying m 3 could be generated as the inclined interface. Thereby, it was confirmed that the average distance between the closest tops could be more than 100 μm in the first layer.

(3) Experiment 3

(3-1) Preparation of a Nitride Semiconductor Substrate

In order to compare the in-plane distribution of the dislocation-free region and the in-plane distribution in the X-ray locking curve measurement with the sample 1 of experiment 1 described above, the following samples 4 and 5 were prepared. The substrate of sample 4 is a substrate obtained from a crystal layer in which a thick film is grown with the c-plane as a growth surface. Further, the substrate of sample 5 is a substrate prepared by the conventional VAS method and corresponds to a base substrate.

[Conditions for Preparing a Nitride Semiconductor Substrate of Sample 4]
(Base Substrate)
Material: GaN
Production method: VAS method
Diameter: 62 mm
Thickness: 400 μm
Crystal plane with the lowest index closest to the main surface: c plane
Off-angle: 0.5° in the m-axis direction
No pattern processing such as formation of the mask layer on the main surface.

(Crystal Layer)
Material: GaN
Growth method: HVPE method
Growth temperature: 1050° C.
V/III ratio: 2.8
time: 15 hours
(Processing)
Grinding: A cylindrical region was removed to obtain a cylindrical region with a diameter of 56 mm.
Slice: 630 μm thick, 5 sheets
Beveling processing: The diameter was 50.8 mm.
Polishing processing: 400-450 μm thick.

[Conditions for Preparing a Nitride Semiconductor Substrate of Sample 5]

The substrate of sample 5 was prepared by the conventional VAS method similar to that of the base substrate. For sample 5, the radius of curvature of the c-plane and the dislocation density were the same as those of the base substrate, except that an absolute value of the off-angle and an off-direction were different from those of the base substrate.

(3-2) Evaluation (Observation Using a Multi-Photon Excitation Microscope)
Under the same conditions as in experiment 1, the main surfaces of the substrates of samples 1, 4 and 5 were observed using a multi-photon excitation microscope.

(X-Ray Locking Curve Measurement)
For each of the substrates of samples 1, 4 and 5, two types of X-ray locking curve measurements similar to those in experiment 1 were performed. At this time, the measurement was performed at a plurality of measurement points set at 5 mm intervals in each of the m-axis direction and the a-axis direction in the main surface. Thereby, the ratio of FWHMa-FWHMb to FWHMa was obtained at a plurality of measurement points of each sample.

(3-3) Result (3-3-1) In-Plane Distribution of Dislocation-Free Regions

Figure 34:
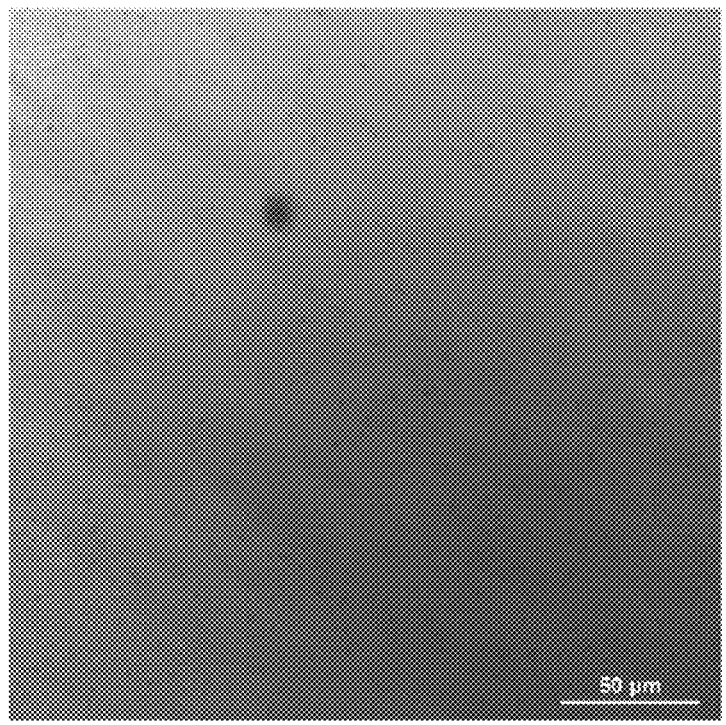
FIG. 34 is a view of observing the main surface of the nitride semiconductor substrate of sample 4 using a multi-photon excitation microscope.

A distribution of a dislocation-free region in the substrates of samples 1 and 4 will be described with reference to FIGS. 17 to 34. FIGS. 17 to 33 are views of the main surface of the substrate of sample 1 observed using a multi-photon excitation microscope. In FIGS. 17 to 33, (x, y) indicates the coordinates in the m-axis direction and the coordinates in the a-axis direction. FIG. 34 is a view of observing the main surface of the substrate of sample 4 using a multi-photon excitation microscope. In FIGS. 17 to 34, a thick line frame indicates a dislocation-free region of 50 μm square.

[Sample 4]
In the substrate of sample 4 obtained from the crystal layer grown thick with the c-plane as a growth surface, the dislocation density is lowered in inverse proportion to the thickness of the crystal layer, and therefore an average dislocation density was $6.3 \times 10^5$ cm$^{-2}$.

However, as illustrated in FIG. 34, in the substrate of sample 4, the dislocations were uniformly dispersed in the surface. The distribution of the dislocations was similar to that in FIG. 34 even in a region not shown. Therefore, the size of the dislocation-free region was smaller than 50 μm square, and the dislocation-free region of 50 μm square was not formed, over an entire body of the substrate of sample 4.

Thus, even when the method of sample 4 for obtaining a high-quality substrate is used as the conventional method, no dislocation-free region of 50 μm square was formed on the obtained substrate. Therefore, it is considered that the dislocation-free region of 50 μm square is not formed even in a substrate prepared by another conventional manufacturing method in which a special step of collecting dislocations is not performed.

[Sample 1]

In contrast, as illustrated in FIGS. 17 to 34, the main surface of the substrate of sample 1 includes a dislocation-free region of at least 50 μm square. Further, in the substrate of sample 1, the dislocation-free regions of 50 μm square were scattered over the entire main surface.

Further, at least one 50 μm square dislocation-free region was present in all the 250 μm square visual fields illustrated in FIGS. 17 to 34. The main surface of the substrate of sample 1 includes non-overlapping 50 μm square dislocation-free regions at a density of 1600 pieces/cm² or more. Specifically, the density of the non-overlapping 50 μm square dislocation-free regions in the main surface of the substrate of sample 1 was approximately 4800/cm².

As described above, according to sample 1, since the above-described initial step is performed and the first growth condition is adjusted so as to satisfy the formula (1), the average distance between the closest tops could be more than 100 μm. Thereby, it was confirmed that the dislocation density in the main surface of the substrate could be sufficiently lowered. It was also confirmed that since the average distance between the closest tops was more than 100 μm, the dislocation-free region of at least 50 μm square could be formed, and the dislocation-free region could be scattered over the entire main surface. Further, it was also confirmed that the density of the non-overlapping dislocation-free regions of 50 μm square in the main surface could be 1600/cm² or more.

(3-3-2) In-Plane Distribution in the X-Ray Locking Curve Measurement

The results of samples 1, 4 and 5 are shown in tables 2, 3 and 4, respectively. In the table below, "difference" means (FWHMa−FWHMb)/FWHMa (%).

TABLE 2

| | | <Sample 1> | | | | |
|---|---|---|---|---|---|---|
| | | slit = 0.1 | | | slit = open | |
| | (mm) | ω (deg.) | FWHMb (sec.) | (mm) ω (deg.) | FWHMa (sec.) | difference |
| //M | −20 | 17.73385 | 28.3 | −20 17.73328 | 33 | 14.2% |
| | −15 | 17.74286 | 28 | −15 17.74217 | 34.3 | 18.4% |
| | −10 | 17.74968 | 28.5 | −10 17.74915 | 32.7 | 12.8% |
| | −5 | 17.75491 | 30 | −5 17.75459 | 31.8 | 5.7% |
| | 0 | 17.7584 | 30.5 | 0 17.76804 | 30.5 | 0.0% |
| | 5 | 17.76099 | 28.6 | 5 17.76075 | 29.7 | 3.7% |
| | 10 | 17.76604 | 29.7 | 10 17.76573 | 30.6 | 2.9% |
| | 15 | 17.77239 | 28.2 | 15 17.772 | 31.4 | 10.2% |
| | 20 | 17.77886 | 29.6 | 20 17.77834 | 32.3 | 8.4% |
| //a | −20 | 17.20134 | 29.6 | −20 17.2008 | 35.8 | 17.3% |
| | −15 | 17.21134 | 29.2 | −15 17.21075 | 35.9 | 18.7% |
| | −10 | 17.22072 | 27.8 | −10 17.22025 | 34.5 | 19.4% |
| | −5 | 17.22813 | 29 | −5 17.22758 | 33.8 | 17.2% |
| | 0 | 17.23503 | 29.5 | 0 17.23444 | 31.3 | 5.8% |
| | 5 | 17.24221 | 28 | 5 17.24166 | 33.8 | 17.2% |
| | 10 | 17.25146 | 30.2 | 10 17.25085 | 35.1 | 14.0% |
| | 15 | 17.26095 | 29.2 | 15 17.26029 | 39.1 | 25.3% |
| | 20 | 17.27248 | 28.7 | 20 17.27172 | 39.4 | 27.2%. |

TABLE 3

| | | <Sample 4> | | | | |
|---|---|---|---|---|---|---|
| | | slit = 0.1 | | | slit = open | |
| | (mm) | ω (deg.) | FWHMb (sec.) | (mm) ω (deg.) | FWHMa (sec.) | difference |
| //M | −20 | 17.58718 | 30.6 | −20 17.58637 | 61 | 49.8% |
| | −15 | 17.60427 | 29.9 | −15 17.60367 | 49 | 39.0% |
| | −10 | 17.62154 | 29.4 | −10 17.62094 | 53.2 | 44.7% |
| | −5 | 17.63899 | 29.2 | −5 17.63827 | 51.6 | 43.4% |
| | 0 | 17.65626 | 28.1 | 0 17.65561 | 52.3 | 46.3% |
| | 5 | 17.67447 | 29.4 | 5 17.6738 | 55.2 | 18.7% |
| | 10 | 17.6939 | 29.0 | 10 17.6931 | 56.5 | 47.5% |
| | 15 | 17.71332 | 28.2 | 15 17.71235 | 59.2 | 52.4% |
| | 20 | 17.73509 | 28.9 | 20 17.73384 | 68.2 | 57.6% |
| //a | −20 | 17.19294 | 36.3 | −20 17.19209 | 75.8 | 52.1% |
| | −15 | 17.21843 | 33.1 | −15 17.21749 | 75.9 | 56.4% |
| | −10 | 17.24258 | 31.4 | −10 17.24179 | 68.4 | 54.1% |
| | −5 | 17.26492 | 29.8 | −5 17.26405 | 67.1 | 55.6% |
| | 0 | 17.28636 | 31.4 | 0 17.28551 | 67.3 | 53.3% |
| | 5 | 17.30887 | 31.4 | 5 17.30794 | 69.2 | 54.6% |

TABLE 3-continued

<Sample 4>

| | slit = 0.1 | | | slit = open | | |
|---|---|---|---|---|---|---|
| (mm) | ω (deg.) | FWHMb (sec.) | (mm) | ω (deg.) | FWHMa (sec.) | difference |
| 10 | 17.3332 | 33.6 | 10 | 17.33179 | 78.2 | 57.0% |
| 15 | 17.35942 | 32.9 | 15 | 17.35821 | 79.7 | 58.7% |
| 20 | 17.385 | 30.5 | 20 | 17.38469 | 75.4 | 59.5% |

TABLE 4

<Sample 5>: corresponding to base subtract

| | | slit = 0.1 | | | slit = open | | |
|---|---|---|---|---|---|---|---|
| | (mm) | ω (deg.) | FWHMb (sec.) | (mm) | ω (deg.) | FWHMa (sec.) | difference |
| //M | −20 | 17.07689 | 42.9 | −20 | 17.07888 | 187.2 | 77.1% |
| | −15 | 17.13755 | 45.6 | −15 | 17.14011 | 184 | 75.2% |
| | −10 | 17.19635 | 46.6 | −10 | 17.19869 | 171.7 | 72.9% |
| | −5 | 17.25394 | 46.3 | −5 | 17.75502 | 170.3 | 72.8% |
| | 0 | 17.31046 | 46.1 | 0 | 17.31278 | 170.3 | 72.9% |
| | 5 | 17.36629 | 44.2 | 5 | 17.36438 | 169.1 | 73.9% |
| | 10 | 17.42552 | 44.1 | 10 | 17.42475 | 175.2 | 74.8% |
| | 15 | 17.48624 | 45.6. | 15 | 17.48797 | 179.6 | 74.6% |
| //a | 20 | 17.5534 | 43.9 | 20 | 17.5618 | 208.5 | 78.9% |
| | −20 | 17.14414 | 47.3 | −20 | 17.14824 | 211.2 | 77.6% |
| | −15 | 17.20841 | 46.2 | −15 | 17.20506 | 183.2 | 74.8% |
| | −10 | 17.27142 | 47.2 | −10 | 17.27079 | 180.1 | 73.8% |
| | −5 | 17.33018 | 50.5 | −5 | 17.3292 | 176.7 | 71.4% |
| | 0 | 17.38817 | 47.4 | 0 | 17.38517 | 169 | 72.0% |
| | 5 | 17.44551 | 50.2 | 5 | 17.44218 | 166.6 | 69.9% |
| | 10 | 17.50449 | 46.5 | 10 | 17.50376 | 172.9 | 73.1% |
| | 15 | 17.56355 | 43.9 | 15 | 17.5611 | 173 | 74.6% |
| | 20 | 17.62587 | 46.3 | 20 | 17.62643 | 178.5 | 74.1% |

[Sample 5]

As shown in table 4, in the substrate of sample 5 prepared by the conventional VAS method, the variation in the off-angle of the c-axis within the diameter of 40 mm was about ±0.24°. Further, in the substrate of sample 5, FWHMb was more than 32 arcsec at all measurement points. Further, in the substrate of sample 5, (FWHMa−FWHMb)/FWHMa was more than 30% at all measurement points.

[Sample 4]

As shown in table 3, in the substrate of sample 4 obtained from the crystal layer in which a thick film was grown with the c-plane as a growth surface, the variation in the off-angle of the c-axis within the diameter of 40 mm was improved as compared with the substrate of sample 5, and was about ±0.074°. Further, FWHMb of the substrate of sample 4 was improved as compared with FWHMb of the substrate of sample 5.

However, in the substrate of sample 4, a plurality of portions having FWHMb exceeding 32 arcsec were found. Further, in the substrate of sample 4, (FWHMa−FWHMb)/FWHMa greatly exceeded 30% at all measurement points.

As described above, the high-quality substrate of sample 4 as a conventional substrate has improved dislocation density and off-angle variation as compared with the base substrate, but the substrate of sample 4 did not have any point satisfying the full width at half maximum condition of FWHMb<32 arcsec and (FWHMa−FWHMb)/FWHMa 30%. The reason is considered as follows: in the substrate of sample 4, at least one of the above-described crystal quality factors was not as good as that of the substrate of sample 1.

Therefore, even the substrate of sample 4, which has a relatively high quality as a conventional substrate, does not satisfy the above-described full width at half maximum condition, and therefore it is considered that the substrate prepared by other conventional manufacturing methods does not satisfy the above-described full width at half maximum condition.

[Sample 1]

In contrast, as shown in table 2, in the substrate of sample 1, the variation in the off-angle of the c-axis within the diameter of 40 mm was smaller than that of the substrates of samples 4 and 5, and was about ±0.019°.

Further, in the substrate of sample 1, FWHMb was 32 arcsec or less at all measurement points. Further, in the substrate of sample 1, (FWHMa−FWHMb)/FWHMa was 30% or less at all measurement points.

As described above, in the substrate of sample 1 obtained by the above-described manufacturing method, the dislocation density could be lowered, and not only was it possible to reduce the off-angle variation, but it was also possible to improve all of the above-described crystal quality factors that determine the full width at half maximum in a well-balanced manner. Thereby, in the substrate of sample 1, it was confirmed that FWHMb could be 32 arcsec or less. Further, in sample 1, even when the slit width is 1 mm, the radius of curvature of the c-plane is large, and the above-described crystal quality factors are well-balanced and good, over the entire region irradiated with X-rays, and therefore it was confirmed that (FWHMa−FWHMb)/FWHMa could be 30% or less.

<Preferable Aspects of the Present Disclosure>

Hereinafter, preferable aspects of the present disclosure will be supplementarily described.

(Supplementary Description 1)

There is provided a nitride semiconductor substrate having a diameter of 2 inches or more and having a main surface whose closest low index crystal plane is a (0001) plane,
wherein X-ray locking curve measurement for (0002) plane diffraction, which is performed to the main surface by irradiating with (Cu) K$\alpha$1 X-rays through a two-crystal monochromator of Ge (220) plane and a slit, reveals that:
FWHMb is 32 arcsec or less, and
difference FWHMa-FWHMb obtained by subtracting FWHMb from FWHMa is 30% or less of FWHMa,
wherein FWHMa is full width at half maximum of the (0002) plane diffraction when a slit width in $\omega$ direction is 1 mm, and
FWHMb is full width at half maximum of the (0002) plane diffraction when a slit width in $\omega$ direction is 0.1 mm.

(Supplementary Description 2)

There is provided the nitride semiconductor substrate according to supplementary description 1, wherein FWHMa–FWHMb is 30% or less of FWHMa at a plurality of measurement points set at predetermined intervals in each of <1-100> axial direction and <11-20> axial direction in the main surface.

(Supplementary Description 3)

There is provided the nitride semiconductor substrate according to supplementary description 1 or 2, wherein FWHMb is 32 arcsec or less over a diameter of 29.6 mm from a center of the main surface, FWHMb being full width at half maximum of the (0002) plane diffraction when a slit width in $\omega$ direction is 0.1 mm.

(Supplementary Description 4)

There is provided the nitride semiconductor substrate according to any one of the supplementary descriptions 1 to 3, wherein the X-ray locking curve measurement for the (0002) plane diffraction reveals that when an off-angle, which is an angle formed by <0001> axis with respect to a normal of the main surface, is measured based on a diffraction peak angle of the (0002) plane, the variation obtained by a difference between maximum and minimum in a size of the off-angle within a diameter of 29.6 mm from the center of the main surface is 0.075° or less.

(Supplementary Description 5)

There is provided the nitride semiconductor substrate according to any one of the supplementary descriptions 1 to 4, wherein observation of the main surface using a multiphoton excitation microscope in a field of view of 250 $\mu$m square to obtain a dislocation density from a dark spot density, reveals that the dislocation density is less than $1\times10^6$ cm$^{-2}$ over 95% or more of the main surface.

(Supplementary Description 6)

There is provided the nitride semiconductor substrate according to any one of the supplementary descriptions 1 to 5, wherein the main surface includes non-overlapping 50 $\mu$m square dislocation-free regions at a density of 100/cm$^2$ or more.

(Supplementary Description 6)

There is provided a nitride semiconductor substrate having a diameter of 2 inches or more and having a main surface whose closest low index crystal plane is a (0001) plane,
wherein observation of the main surface of the nitride semiconductor substrate using a multiphoton excitation microscope in a field of view of 250 $\mu$m square to obtain a dislocation density from a dark spot density, reveals that the dislocation density is less than $1\times10^6$ cm$^{-2}$ over 95% or more of the main surface, and the main surface includes non-overlapping 50 $\mu$m square dislocation-free regions at a density of 100/cm$^2$ or more.

(Supplementary Description 7)

There is provided the nitride semiconductor substrate according to any one of the supplementary descriptions 1 to 6, wherein an oxygen concentration is $5\times10^{16}$ cm$^{-3}$ or less.

(Supplementary Description 8)

There is provided the nitride semiconductor substrate according to any one of the supplementary descriptions 1 to 7, wherein a hydrogen concentration is less than $1\times10^{17}$ cm$^{-3}$.

(Supplementary Description 9)

There is provided the nitride semiconductor substrate according to any one of the supplementary descriptions 1 to 8, wherein random extraction of 100 dislocations on the main surface revels that a percentage of dislocations whose Burgers vector is either <11-20>/3, <0001> or <11-23>/3, is 50% or more.

(Supplementary Description 10)

There is provided a method for manufacturing a nitride semiconductor substrate, which is a method for manufacturing a nitride semiconductor substrate with a vapor deposition method, including:
a step of preparing a base substrate comprising a single crystal of a group III nitride semiconductor, and having a mirror main surface whose closest low index plane is a (0001) plane;
an initial step of epitaxially growing a single crystal of a group III nitride semiconductor with the (0001) plane as a growth surface directly on the main surface of the base substrate to grow an initial layer;
a first step of epitaxially growing a single crystal of a group III nitride semiconductor having a top surface with the (0001) plane exposed on the initial layer, forming a plurality of concaves composed of inclined interfaces other than the (0001) plane on the top surface, gradually expanding the inclined interfaces toward an upper side of the initial layer, making the (0001) plane disappear from the top surface, and growing a first layer whose surface is composed only of the inclined interfaces; and
a second step of epitaxially growing a single crystal of a group III nitride semiconductor on the first layer, making the inclined interfaces disappear, and growing a second layer having a mirror surface,
wherein a growth rate of the initial layer in the initial step is lower than a growth rate of the first layer in the first step, and
in the first step, a plurality of valleys and a plurality of tops are formed on the surface of the first layer by forming the plurality of concaves on the top surface of the single crystal and making the (0001) plane disappear, and
when observing an arbitrary cross section perpendicular to the main surface,
an average distance between a pair of tops separated in a direction along the main surface is more than 100 $\mu$m, the pair of tops being closest to each other among the plurality of tops, with one of the plurality of valleys sandwiched between them.

(Supplementary Description 11)
There is provided the method for manufacturing a nitride semiconductor substrate according to the supplementary description 10, wherein the average distance between the pair of tops that are closest to each other is less than 800 µm.

(Supplementary Description 12)
There is provided the method for manufacturing a nitride semiconductor substrate according to the supplementary description 10 or 11, wherein in the first step, after the (0001) plane disappears from the surface, the growth of the first layer is continued over a predetermined thickness while maintaining a state where the surface is composed only of the inclined interfaces.

(Supplementary Description 13)
There is provided the method for manufacturing a nitride semiconductor substrate according to the supplementary description 10 or 12, wherein after the second step, there is a step of slicing at least one nitride semiconductor substrate from the second layer.

(Supplementary Description 14)
There is provided the method for manufacturing a nitride semiconductor substrate according to the supplementary description 13,
wherein in the step of preparing the base substrate,
the base substrate is prepared, whose (0001) plane is curved in a concave spherical shape with respect to the main surface, and
in the step of slicing the nitride semiconductor substrate,
a variation in an off-angle, which is an angle formed by <0001> axis with respect to a normal of the main surface of the nitride semiconductor substrate, is smaller than a variation in an off-angle, which is an angle formed by <0001> axis with respect to a normal of the main surface of the base substrate.

(Supplementary Description 15)
There is provided the method for manufacturing a nitride semiconductor substrate according to any one of the supplementary descriptions 10 to 14,
wherein in the first step, the first layer is grown under a first growth condition satisfying formula (1), and
in the second step, the second layer is grown under a second growth condition satisfying formula (2), $$G_{c1} > G_i / \cos \alpha \quad (1)$$

$$G_{c2} < G_i / \cos \alpha \quad (2)$$

(wherein, $G_{c1}$ is a growth rate of the (0001) plane of the first layer, $G_{c2}$ is a growth rate of the (0001) plane of the second layer, $G_i$ is a growth rate of the inclined interface most inclined with respect to the (0001) plane in each of the first layer and the second layer, and $\alpha$ is an angle formed by the (0001) plane and the inclined interface most inclined with respect to the (0001) plane in each of the first layer and the second layer.)

(Supplementary Description 16)
There is provided the method for manufacturing a nitride semiconductor substrate according to any one of the supplementary descriptions 10 to 15,
wherein in the first step, a first c-plane growth region grown with the (0001) plane as a growth surface is formed in the first layer,
a convex portion is formed at a position where the (0001) plane disappears in the first c-plane growth region,
a pair of inclined portions are formed on both sides of the first c-plane growth region interposing the convex portion, as a locus of an intersection between the (0001) plane and the inclined interface, and an angle formed by the pair of inclined portions is 70° or less.

(Supplementary Description 17)
There is provided the method for manufacturing a nitride semiconductor substrate according to any one of the supplementary descriptions 10 to 16,
wherein the first step includes:
a step of gradually expanding the inclined interface toward an upper side of the initial layer to form an expanded inclined interface layer; and
a step of forming an inclined interface maintenance layer over a predetermined thickness on the expanded inclined interface layer in which the (0001) plane disappears from the surface, while maintaining a state where the surface is composed only of the inclined interface other than the (0001) plane.

(Supplementary Description 18)
There is provided the method for manufacturing a nitride semiconductor substrate according to any one of the supplementary descriptions 10 to 17,
wherein the second step includes:
a step of contracting the inclined interface other than the (0001) plane while expanding the (0001) plane toward an upper side of the first layer, to form a c-plane expanded layer; and
a step of forming a main growth layer over a predetermined thickness with the (0001) plane as a growth surface on the c-plane expanded layer whose surface is mirror-finished.

(Supplementary Description 19)
There is provided the method for manufacturing a nitride semiconductor substrate according to any one of the supplementary descriptions 10 to 18,
wherein in the first step,
{11-2m} plane satisfying m≥3 is generated as the inclined interface.

(Supplementary Description 20)
There is provided a laminated structure, including:
a base substrate comprising a single crystal of a group III nitride semiconductor and having a mirror main surface whose closest low index crystal plane is a (0001) plane;
an initial layer provided directly on the main surface of the base substrate and comprising a single crystal of a group III nitride semiconductor;
a first low oxygen concentration region provided on the initial layer and comprising a single crystal of a group III nitride semiconductor;
a high oxygen concentration region provided on the first low oxygen concentration region and comprising a single crystal of a group III nitride semiconductor; and
a second low oxygen concentration region provided on the high oxygen concentration region and comprising a single crystal of a group III nitride semiconductor,
wherein an oxygen concentration in the high oxygen concentration region is higher than an oxygen concentration in each of the initial layer, the first low oxygen concentration region, and the second low oxygen concentration region, and
when observing an arbitrary cross section perpendicular to the main surface,
a top surface of the first low oxygen concentration region has a plurality of valleys and a plurality of mountains, and
an average distance between a pair of mountains separated in a direction along the main surface is more than 100 µm, the pair of mountains being closest to each other among the plurality of mountains, with one of the plurality of valleys sandwiched between them.
(Supplementary Description 21)
There is provided the laminated structure according to the supplementary description 20, wherein the high oxygen concentration region is continuously provided along the main surface of the base substrate.
(Supplementary Description 22)
There is provided the laminated structure according to the supplementary description 20 or 21, wherein the first low oxygen concentration region has a pair of inclined portions provided on both sides of the mountain, and an angle formed by the pair of inclined portions is 70° or less.
(Supplementary Description 23)
There is provided the laminated structure according to any one of the supplementary descriptions 20 to 22,
wherein a reduction rate of a dislocation density obtained by $N/N_0$ is smaller than a reduction rate of a dislocation density obtained by $N'/N_0$,
wherein the dislocation density in the main surface of the base substrate is $N_0$ and the dislocation density in a boundary surface along the main surface at an upper end of the high oxygen concentration region is N, and the dislocation density in the surface of a crystal layer is N' when the crystal layer of a group III nitride semiconductor is epitaxially grown on the main surface of the base substrate to a thickness equal to a thickness from the main surface to the boundary surface of the base substrate, with only the (0001) plane as a growth surface.
(Supplementary Description 24)
There is provided the laminated structure according to any one of the supplementary descriptions 20 to 23,
wherein a thickness of a boundary surface along the main surface at an upper end of the high oxygen concentration region, from the main surface of the base substrate is 1.5 mm or less, and
a reduction rate of the dislocation density obtained by $N/N_0$ is 0.3 or less, wherein the dislocation density in the main surface of the base substrate is $N_0$, and the dislocation density in the boundary surface is N.

DESCRIPTION OF SIGNS AND NUMERALS

10 Base substrate
20 Initial layer
30 First layer
40 Second layer
50 Nitride semiconductor substrate (substrate)

The invention claimed is:
1. A nitride semiconductor substrate, having a diameter of 2 inches or more and having a main surface,
wherein a lowest index crystal plane closest to the main surface is a (0001) plane over the entirety of the main surface, and
X-ray rocking curve measurement for (0002) plane diffraction, which is performed to the main surface by irradiating with (Cu) Kα1 X-rays through a two-crystal monochromator of Ge (220) plane and a slit on a Ge (220) plane, reveals that:
FWHMb is 32 arcsec or less, and
difference FWHMa-FWHMb obtained by subtracting FWHMb from FWHMa is 30% or less of FWHMa,
wherein FWHMa is full width at half maximum of the (0002) plane diffraction when a slit width in ω direction is 1 mm, and
FWHMb is full width at half maximum of the (0002) plane diffraction when a slit width in ω direction is 0.1 mm.
2. The nitride semiconductor substrate according to claim 1, wherein FWHMa-FWHMb is 30% or less of FWHMa at a plurality of measurement points set at predetermined intervals in each of <1-100> axial direction and <11-20> axial direction in the main surface.
3. The nitride semiconductor substrate according to claim 1, wherein FWHMb is 32 arcsec or less over a diameter of 29.6 mm from a center of the main surface, FWHMb being full width at half maximum of the (0002) plane diffraction when a slit width in ω direction is 0.1 mm.
4. The nitride semiconductor substrate according to claim 1, wherein observation of the main surface of the nitride semiconductor substrate in a field of view of 250 μm square using a multiphoton excitation microscope to obtain a dislocation density from a dark spot density, reveals that the dislocation density is less than $1\times10^6$ cm$^{-2}$ over 95% or more of the main surface.
5. The nitride semiconductor substrate according to claim 1, wherein the main surface includes non-overlapping 50 μm square dislocation-free regions at a density of 100/cm$^2$ or more.
6. A nitride semiconductor substrate having a diameter of 2 inches or more and having a main surface,
wherein a lowest index crystal plane closest to the main surface is a (0001) plane over the entirety of the main surface, and
observation of the main surface of the nitride semiconductor substrate using a multiphoton excitation microscope in a field of view of 250 μm square to obtain a dislocation density from a dark spot density, reveals that the dislocation density is less than $1\times10^6$ cm$^{-2}$ over 95% or more of the main surface, and the main surface includes non-overlapping 50 μm square dislocation-free regions at a density of 100/cm$^2$ or more.
7. The nitride semiconductor substrate according to claim 1, wherein oxygen concentration is $5\times10^{16}$ cm$^{-3}$ or less.
8. The nitride semiconductor substrate according to claim 1, wherein the main surface has a low dislocation density region having a dislocation density in a range of $1.6\times10^5$ cm$^{-2}$ or more and $7.2\times10^5$ cm$^{-2}$ or less.
9. A method for manufacturing a nitride semiconductor substrate, which is a method for manufacturing a nitride semiconductor substrate with a vapor deposition method, comprising:
a step of preparing a base substrate comprising a single crystal of a group III nitride semiconductor, and having a mirror main surface whose closest low index plane is a (0001) plane;
an initial step of epitaxially growing a single crystal of a group III nitride semiconductor with the (0001) plane as a growth surface directly on the main surface of the base substrate to grow an initial layer;
a first step of epitaxially growing a single crystal of a group III nitride semiconductor having a top surface with the (0001) plane exposed on the initial layer, forming a plurality of concaves composed of inclined interfaces other than the (0001) plane on the top surface, gradually expanding the inclined interfaces toward an upper side of the initial layer, making the (0001) plane disappear from the top surface, and growing a first layer whose surface is composed only of the inclined interfaces; and
a second step of epitaxially growing a single crystal of a group III nitride semiconductor on the first layer, making the inclined interfaces disappear, and growing a second layer having a mirror surface,
wherein a growth rate of the initial layer in the initial step is lower than a growth rate of the first layer in the first step, and
in the first step, a plurality of valleys and a plurality of tops are formed on the surface of the first layer by forming the plurality of concaves on the top surface of the single crystal and making the (0001) plane disappear, and
when observing an arbitrary cross section perpendicular to the main surface,
an average distance between a pair of tops separated in a direction along the main surface is more than 100 μm, the pair of tops being closest to each other among the plurality of tops, with one of the plurality of valleys sandwiched between them.

10. The method for manufacturing a nitride semiconductor substrate according to claim 9, wherein in the first step, the average distance between the pair of tops closest to each other is less than 800 μm.

11. The method for manufacturing a nitride semiconductor substrate according to claim 9, wherein in the first step, after the (0001) plane disappears from the surface, growth of the first layer is continued over a predetermined thickness, while maintaining a state where the surface is composed only of the inclined interface.

12. The method for manufacturing a nitride semiconductor substrate according to claim 9, wherein after the second step, there is a step of slicing at least one nitride semiconductor substrate from the second layer.

13. The method for manufacturing a nitride semiconductor substrate according to claim 12, wherein in the step of preparing the base substrate,
the base substrate is prepared, whose (0001) plane is curved in a concave spherical shape with respect to the main surface, and
in the step of slicing the nitride semiconductor substrate, a variation in an off-angle, which is an angle formed by <0001> axis with respect to a normal of the main surface of the nitride semiconductor substrate, is smaller than a variation in an off-angle, which is an angle formed by <0001> axis with respect to a normal of the main surface of the base substrate.

14. The method for manufacturing a nitride semiconductor substrate according to claim 9,
wherein in the first step, a first c-plane growth region grown with the (0001) plane as a growth surface is formed in the first layer,
a convex portion is formed at a position where the (0001) plane disappears and terminates as an inflection point that is convex upward in the first c-plane growth region, and a pair of inclined portions are formed on both sides of the first c-plane growth region interposing the convex portion, as a locus of an intersection between the (0001) plane and the inclined interface, and
an angle formed by the pair of inclined portions is 70° or less.

15. The method for manufacturing a nitride semiconductor substrate according to claim 9, wherein {11-2m} plane satisfying m≥3 is generated as the inclined interface.

16. A laminated structure, comprising:
a base substrate comprising a single crystal of a group III nitride semiconductor and having a mirror main surface whose closest low index crystal plane is a (0001) plane;
an initial layer provided directly on the main surface of the base substrate and comprising a single crystal of a group III nitride semiconductor;
a first low oxygen concentration region provided on the initial layer and comprising a single crystal of a group III nitride semiconductor;
a high oxygen concentration region provided on the first low oxygen concentration region and comprising a single crystal of a group III nitride semiconductor; and
a second low oxygen concentration region provided on the high oxygen concentration region and comprising a single crystal of a group III nitride semiconductor,
wherein no mask layer is formed between the main surface of the base substrate and the initial layer, an oxygen concentration in the high oxygen concentration region is higher than an oxygen concentration in each of the initial layer, the first low oxygen concentration region, and the second low oxygen concentration region, and
when observing an arbitrary cross section perpendicular to the main surface,
a top surface of the first low oxygen concentration region has a plurality of valleys and a plurality of mountains,
an average distance between a pair of mountains separated in a direction along the entirety of the main surface is more than 100 the pair of mountains being closest to each other among the plurality of mountains that are upwardly convex inflection points where (0001) plane disappears, with one of the plurality of valleys sandwiched between them, and
a lowest index crystal plane closest to a surface of the second low oxygen concentration region is a (0001) plane over the entire surface of the second low oxygen concentration region.

17. The laminated structure according to claim 16, wherein the high oxygen concentration region is continuously provided along the main surface of the base substrate.

18. The laminated structure according to claim 16, wherein the first low oxygen concentration region further has a pair of inclined portions provided on both sides of the mountain, and an angle formed by the pair of inclined portions is 70° or less.

19. The laminated structure according to claim 16, wherein a reduction rate of a dislocation density obtained by $N/N_0$ is smaller than a reduction rate of a dislocation density obtained by $N'/N_0$,
wherein the dislocation density in the main surface of the base substrate is No and the dislocation density in a boundary surface along the main surface at an upper end of the high oxygen concentration region is N, and the dislocation density in a surface of a crystal layer is N' when the crystal layer of a group III nitride semiconductor is epitaxially grown on the main surface of the base substrate to a thickness equal to a thickness from the main surface to the boundary surface of the base substrate, with only a (0001) plane as a growth surface.

20. The laminated structure according to claim 16,
wherein a thickness of a boundary surface along the main surface at an upper end of the high oxygen concentration region, from the main surface of the base substrate is 1.5 mm or less, and
a reduction rate of a dislocation density obtained by $N/N_0$ is 0.3 or less, wherein the dislocation density in the main surface of the base substrate is $N_0$, and the dislocation density in the boundary surface is N.

21. The nitride semiconductor substrate according to claim 1,
wherein the nitride semiconductor substrate has no inversion domain with reversed polarity.

22. The nitride semiconductor substrate according to claim 1,
wherein a radius of curvature of the (0001) plane of the nitride semiconductor substrate is 23 m or more.

* * * * *